(12) United States Patent
Lee et al.

(10) Patent No.: US 10,263,009 B2
(45) Date of Patent: Apr. 16, 2019

(54) SEMICONDUCTOR DEVICES WITH VERTICAL CHANNEL STRUCTURES

(71) Applicants: Chang-hyun Lee, Suwon-si (KR); Jin-taek Park, Hwaseong-si (KR); Young-woo Park, Seoul (KR)

(72) Inventors: Chang-hyun Lee, Suwon-si (KR); Jin-taek Park, Hwaseong-si (KR); Young-woo Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/722,216

(22) Filed: Oct. 2, 2017

(65) Prior Publication Data

US 2018/0026050 A1    Jan. 25, 2018

Related U.S. Application Data

(63) Continuation of application No. 14/471,031, filed on Aug. 28, 2014, now abandoned.

(30) Foreign Application Priority Data

Aug. 29, 2013 (KR) .................. 10-2013-0103426

(51) Int. Cl.
*H01L 29/792* (2006.01)
*H01L 27/11582* (2017.01)
(Continued)

(52) U.S. Cl.
CPC .... *H01L 27/11582* (2013.01); *H01L 27/1157* (2013.01); *H01L 29/1033* (2013.01);
(Continued)

(58) Field of Classification Search
CPC ............................. H01L 27/11517–27/11582
See application file for complete search history.

(56) References Cited

U.S. PATENT DOCUMENTS 8,163,617 B2   4/2012  Ahn
8,198,672 B2   6/2012  Alsmeier
(Continued)

FOREIGN PATENT DOCUMENTS

CN   102122661   7/2011
CN   102468280   5/2012
(Continued)

OTHER PUBLICATIONS

Chinese Office Action issued for corresponding Chinese Patent Application No. 201410437175.9 (Foreign Text, 13 Pages) (dated Apr. 23, 2018).

*Primary Examiner* — Mohammed R Alam
(74) *Attorney, Agent, or Firm* — Myers Bigel, P.A.

(57) ABSTRACT

Semiconductor devices are provided. The semiconductor devices may include a substrate, a ground selection gate electrode, and a channel structure. The channel structure may extend the ground selection gate electrode in a first direction perpendicular to a top surface of the substrate, and include a channel layer, a channel contact layer, and a stepped portion. The channel contact layer may contact the substrate and include a first width in a second direction perpendicular to the first direction. The channel layer may contact the channel contact layer, include a bottom surface between a bottom surface of the ground selection gate electrode and the top surface of the substrate in the first direction, and include a second width in the second direction different from the first width.

20 Claims, 48 Drawing Sheets

(51) Int. Cl.
*H01L 29/78* (2006.01)
*H01L 29/10* (2006.01)
*H01L 27/1157* (2017.01)
*H01L 27/11556* (2017.01)
*H01L 27/11524* (2017.01)

(52) U.S. Cl.
CPC ...... *H01L 29/7827* (2013.01); *H01L 29/7926* (2013.01); *H01L 27/11524* (2013.01); *H01L 27/11556* (2013.01)

(56) References Cited

U.S. PATENT DOCUMENTS

| | | | |
|---|---|---|---|
| 8,309,405 | B2 | 11/2012 | Yang et al. |
| 8,482,049 | B2 | 7/2013 | Son et al. |
| 2011/0129992 | A1 | 6/2011 | Jung |
| 2011/0233648 | A1 | 9/2011 | Seol et al. |
| 2011/0275197 | A1 | 11/2011 | Park et al. |
| 2011/0303971 | A1 | 12/2011 | Lee et al. |
| 2012/0003828 | A1* | 1/2012 | Chang ............ H01L 27/1157 438/591 |
| 2012/0064683 | A1 | 3/2012 | Ishiduki et al. |
| 2012/0068255 | A1* | 3/2012 | Lee ............ H01L 27/11582 257/324 |
| 2012/0086072 | A1 | 4/2012 | Yun et al. |
| 2012/0098139 | A1 | 4/2012 | Chae et al. |
| 2012/0112264 | A1* | 5/2012 | Lee ............ H01L 27/11551 257/324 |
| 2012/0156848 | A1 | 6/2012 | Yang et al. |
| 2012/0199897 | A1 | 8/2012 | Chang et al. |
| 2012/0267699 | A1 | 10/2012 | Kiyotoshi |
| 2012/0276696 | A1 | 11/2012 | Yang et al. |

FOREIGN PATENT DOCUMENTS

| | | |
|---|---|---|
| JP | 2011-199194 | 10/2011 |
| KR | 1020100133212 | 12/2010 |
| KR | 1020110121938 | 11/2011 |
| KR | 1020120128438 | 11/2012 |

* cited by examiner

SEMICONDUCTOR DEVICES WITH VERTICAL CHANNEL STRUCTURES

CROSS-REFERENCE TO RELATED APPLICATIONS

This application is a continuation of U.S. patent application Ser. No. 14/471,031, filed Aug. 28, 2014, which itself claims priority under 35 U.S.C. § 119 to Korean Patent Application No. 10-2013-0103426, filed Aug. 29, 2013, in the Korean Intellectual Property Office, the disclosure of which is incorporated herein by reference in its entirety.

FIELD

Some embodiments of the inventive concept relate to semiconductor devices and, more particularly, to semiconductor memory devices with a vertical channel structure.

BACKGROUND

Semiconductor memory devices may include vertical channel structures to increase the integration degree of the memory device as compared to previous plane transistor structures. Vertical channel structures may be formed by forming a channel hole and growing silicon in the channel hole. However, polysilicon on a side wall of the channel hole may be oxidized or damaged during a process of forming the channel structure which may negatively affect electrical characteristics of the resulting semiconductor memory device.

SUMMARY

According to some embodiments of the incentive concept, semiconductor devices are provided. A semiconductor device may include a substrate, a first insulating layer on a top surface of the substrate, a ground selection gate electrode on the first insulating layer, a second insulating layer on the ground selection gate electrode, a channel structure, and a gate insulating layer. The channel structure may contact the substrate, extend through the first insulating layer, the ground selection gate electrode, and the second insulating layer in a first direction perpendicular to the top surface of the substrate, and include a channel layer, a channel contact layer, and a stepped portion. The gate insulating layer may surround portions of an outer wall of the channel structure. The gate insulating layer may include a tunnel insulating layer on the channel structure, a charge storage layer on the tunnel insulating layer, and a blocking insulating layer on the charge storage layer. The channel contact layer may contact the substrate, extend in the first direction, include a conductive material doped with impurities of a first impurity type, and include a first width in a second direction perpendicular to the first direction. The channel layer may contact the channel contact layer, extend in the first direction, include a conductive material doped with impurities of the first impurity type, include a bottom surface between a bottom surface of the ground selection gate electrode and the top surface of the substrate in the first direction, and include a second width in the second direction different from the first width.

In some embodiments, the channel layer may include an inner surface contacting portions of an outer surface of the channel contact layer. The second width may be greater than the first width. The bottom surface of the channel layer may form a stepped portion of the channel structure.

In some embodiments, the semiconductor device may include an etch stop layer between the substrate and the first insulating layer. The bottom surface of the channel layer may be between top and bottom surfaces of the etch stop layer in the first direction. The bottom surface of the channel layer may contact a top surface of the channel contact layer. The second width may be less than the first width.

In some embodiments, the semiconductor device may include a word line gate electrode on the second insulating layer. The word line gate electrode may include a first semiconductor material. The ground selection gate electrode may include a second semiconductor material different from the first semiconductor material.

In some embodiments, the blocking insulating layer may include a first blocking insulating layer on the charge storage layer and a second blocking insulating layer separating the first blocking insulating layer from the ground selection gate electrode.

In some embodiments, the first and second insulating layers may contact the second blocking insulating layer.

In some embodiments, the first and second insulating layers may contact the first blocking insulating layer.

In some embodiments, the first and second insulating layers may contact the charge storage layer.

According to some embodiments of the inventive concept, a semiconductor device may include a channel structure, a ground selection line, a plurality of word lines, and a string selection line. The channel structure may protrude a top surface of a substrate and extend in a first direction perpendicular to the top surface of the substrate. The ground selection line, plurality of word lines, and string selection line may be sequentially disposed on the substrate, separated from each other in the first direction, and each may surround a respective portion of a side surface of the channel structure. The channel structure may include a stepped portion formed in the side surface of the channel structure between the ground selection line and the top surface of the substrate.

In some embodiments, a portion of the channel structure located at the same height as the ground selection line in the first direction may have a first width in a second direction perpendicular to the first direction. A portion of the channel structure located at the same height as the top surface of the substrate in the first direction may have a second width, smaller than the first width, in the second direction.

In some embodiments, the channel structure may include a channel contact layer connected to the substrate and extending in the first direction, and a channel layer surrounding portions of an outer surface of the channel contact layer. A bottom portion of the channel layer may form the stepped portion of the channel structure.

In some embodiments, the semiconductor device may include an etch stop layer disposed between the ground selection line and the substrate. A distance between the stepped portion of the channel structure and the top surface of the substrate may be less than a distance between a top surface of the etch stop layer and the top surface of the substrate.

In some embodiments, the etch stop layer may surround a portion of an outer surface of the channel contact layer.

In some embodiments, a portion of the channel structure located at the same height as the ground selection line in the first direction may have a first width in a second direction perpendicular to the first. A portion of the channel structure located at the same height as the top surface of the substrate in the first direction may have a second width, larger than the first width, in the second direction.

In some embodiments, the channel structure may include a channel contact layer connected to the substrate and a channel layer on the channel contact layer. An upper portion of the channel contact layer may form the stepped portion of the channel structure.

In some embodiments, the ground selection line may include a first material and the word line may include a second material different from the first material.

In some embodiments, the semiconductor device may include a gate insulating layer. The gate insulating layer may surround portions of an outer surface of the channel structure and extend in the first direction.

According to some embodiments of the inventive concept, a semiconductor device may include a ground selection line, a plurality of word lines, a string selection line, and a channel structure. The ground selection line, the plurality of word lines, and the string selection line may be sequentially disposed on a substrate in a first direction perpendicular to a top surface of the substrate. The channel structure may pass through the ground selection line, the word lines, and the string selection line and may contact the substrate. The channel structure may include a stepped portion comprising a step height in a second direction perpendicular to the first direction. The stepped portion may be formed in a side wall surface of the channel structure between the ground selection line and the top surface of the substrate.

In some embodiments, the channel structure may have a first width in the second direction in a portion of the side wall surface of the channel structure located at a higher level than the stepped portion in the first direction. The channel structure may have a second width, larger than the first width, in the second direction in a portion of the side wall surface of the channel structure located at a lower level than the stepped portion in the first direction.

It is noted that aspects of the inventive concept described with respect to one embodiment, may be incorporated in a different embodiments although not specifically described relative thereto. That is, all embodiments and/or features of any embodiments can be combined in any way and/or combination. These and other objects and/or aspects of the present inventive concept are explained in detail in the specification set forth below.

BRIEF DESCRIPTION OF THE DRAWINGS

The accompanying figures are included to provide a further understanding of the present inventive concept, and are incorporated in and constitute a part of this specification. The drawings illustrate some embodiments of the present inventive concept and, together with the description, serve to explain principles of the present inventive concept.

FIGS. 8A-8F are enlarged cross-sectional views of a portion 8A of FIG. 2A.

DETAILED DESCRIPTION OF THE EMBODIMENTS

Figure 1:
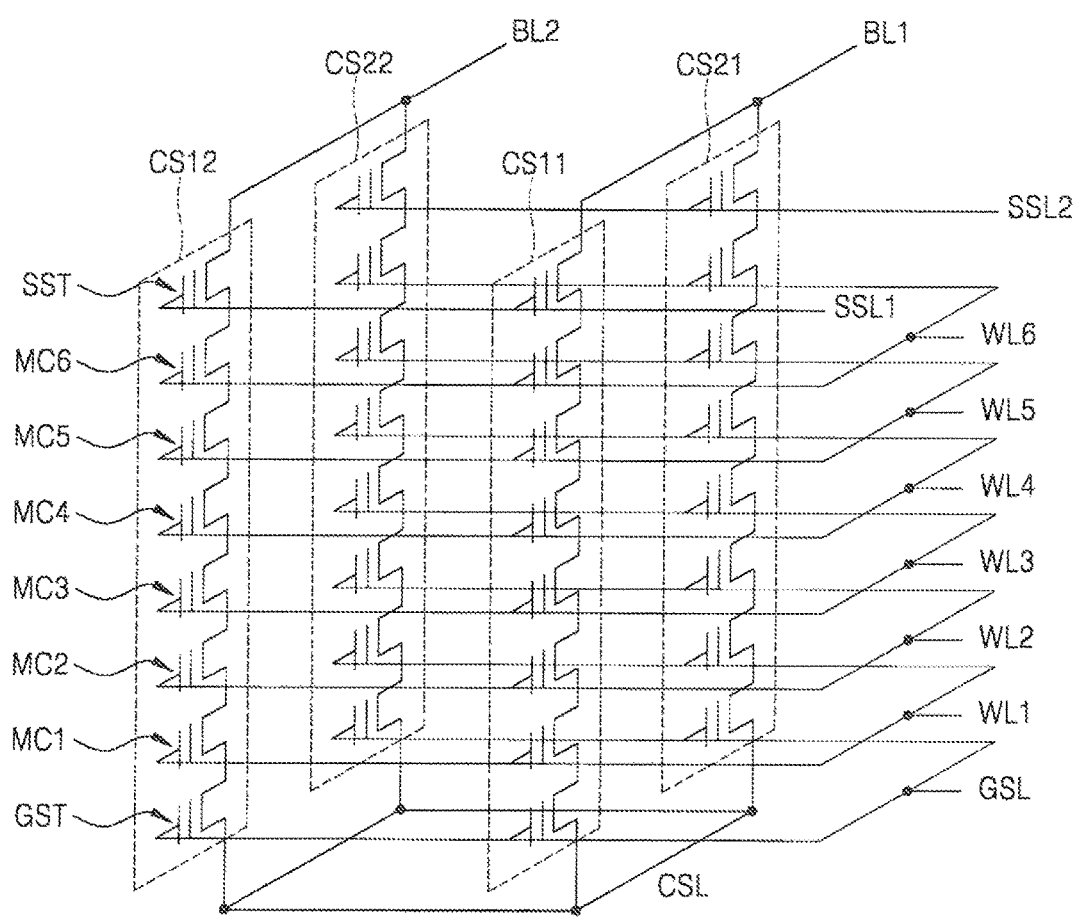
FIG. 1 is a schematic circuit diagram illustrating a memory cell array of a semiconductor device according to some embodiments of the inventive concept.

Embodiments are described in detail with reference to the accompanying drawings. The inventive concept, however, may be embodied in various different forms, and should not be construed as being limited only to the illustrated embodiments set forth herein. Rather, these embodiments are provided as examples so that this disclosure will be thorough and complete, and will fully convey the concept of the inventive concept to those skilled in the art. Unless otherwise noted, like reference numerals denote like elements throughout the attached drawings and written description, and thus descriptions may not be repeated.

The terminology used herein is for the purpose of describing particular embodiments only and is not intended to be limiting of the inventive concept. As used herein, the singular terms "a," "an" and "the" are intended to include the plural forms as well, unless the context clearly indicates otherwise. As used herein, the term "and/or" includes any and all combinations of one or more of the associated listed items.

It will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under"

can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concept. Example embodiments of aspects of the present inventive concept explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices, such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device. The devices according to various embodiments described herein may be interspersed among other devices depending on the functionality of the microelectronic device.

FIG. 1 is a schematic circuit diagram illustrating a memory cell array of a semiconductor device according to some embodiments of the inventive concept. FIG. 1 illustrates a schematic circuit diagram of a NAND flash memory device having a vertical structure which has a vertical channel structure. Referring to FIG. 1, a memory cell array 10 may have a three-dimensional structure. The memory cell array 10 may include a plurality of cell strings CS11, CS12, CS21, and CS22 extending in a vertical direction. Each of the cell strings CS11, CS12, CS21, and CS22 may include a ground selection transistor GST, a plurality of memory cell transistors MC1, MC2, . . . , MC6, and a string selection transistor SST that are connected to each other in series. Although FIG. 1 illustrates that one ground selection transistor GST and one string selection transistor SST are connected to the cell strings CS11, CS12, CS21, and CS22, two or more ground selection transistors GST and/or two or more string selection transistors SST may be connected to the cell strings CS11, CS12, CS21, and CS22 in series. In addition, the number of memory cell transistors MC1, MC2 . . . MC6 is not limited thereto.

The plurality of cell strings CS11, CS12, CS21, and CS22 may be connected to each other in row and column units. The string selection transistor SST of each of the cell strings CS11, CS12, CS21, and CS22 may be connected to corresponding bit lines BL1 and BL2. For example, the cell strings CS11 and CS21 may be connected in common to the first bit line BL1 form a first column, and the cell strings CS12 and CS22 may be connected in common to the second bit line BL2 form a second column. In addition, the string selection transistor SST of each of the cell strings CS11, CS12, CS21, and CS22 may be connected to string selection lines SSL1 and SSL2. For example, the cell strings CS11 and CS12 may be connected in common to the first string selection line SSL1 form a first row, and the cell strings CS21 and CS22 may be connected in common to the second string selection line SSL2 form a second row.

The ground selection transistors GST of the respective cell strings CS11, CS12, CS21, and CS22 may be connected to each other by a ground selection line GSL. A common source line CSL may be connected to the ground selection transistors GST of the respective cell strings CS11, CS12, CS21, and CS22.

The memory cell transistors MC1, MC2 . . . MC6 of each cell string may be located respectively at the same height as the respective cell transistors MC1, MC2 . . . MC6 of other cell strings and may be respectively connected to word lines WL1, WL2 . . . WL6 which may be respectively located at the same height. For example, the first memory cell transistor MC1 of cell string CS11 may be connected to the ground selection transistor GST of cell string CS11 and may be connected to the first memory cell transistor MC1 of the adjacent column through the first word line WL1.

Figure 2A:
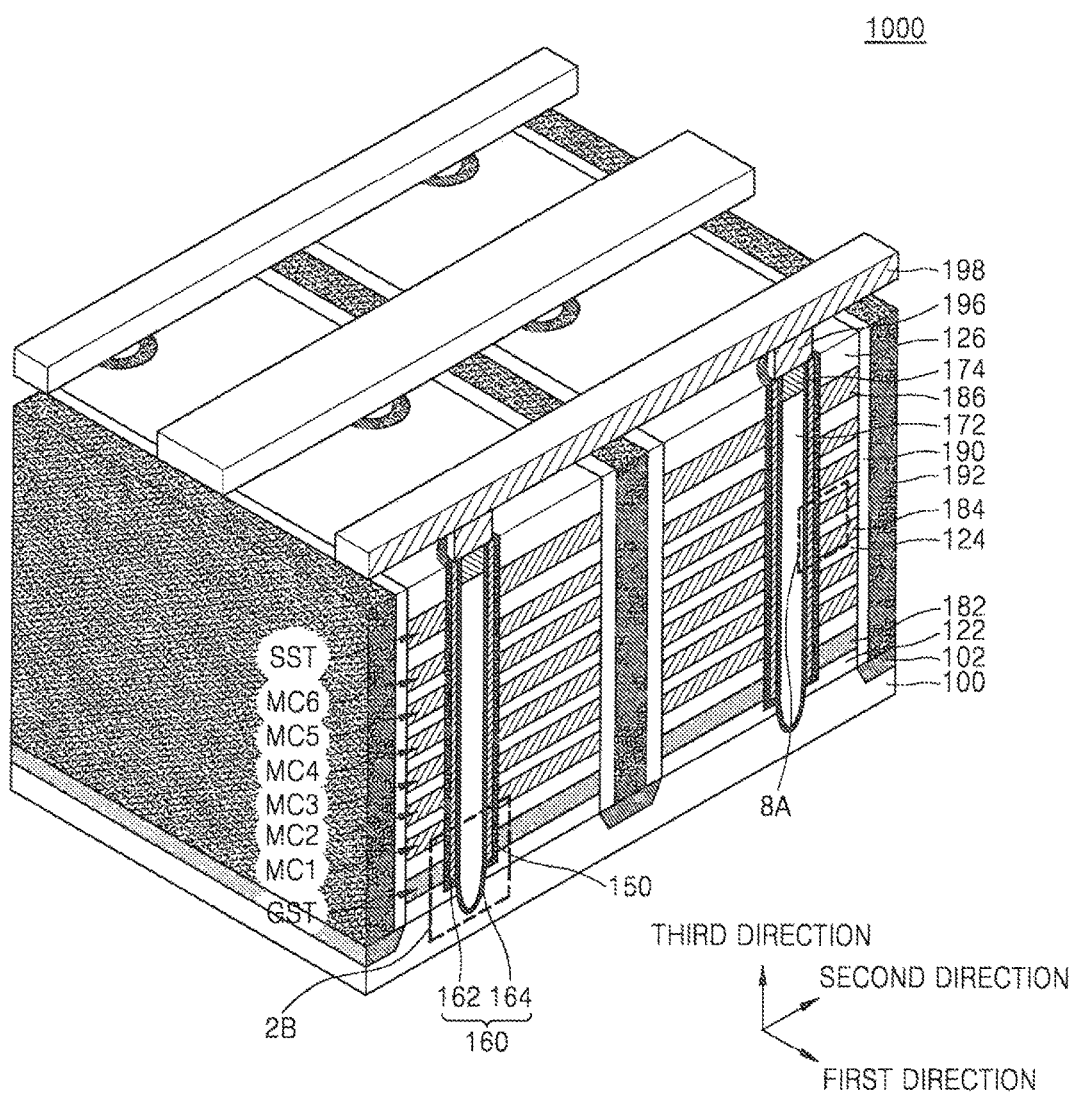
FIG. 2A is a perspective view schematically illustrating a semiconductor device according to some embodiments of the inventive concept.
Figure 2B:
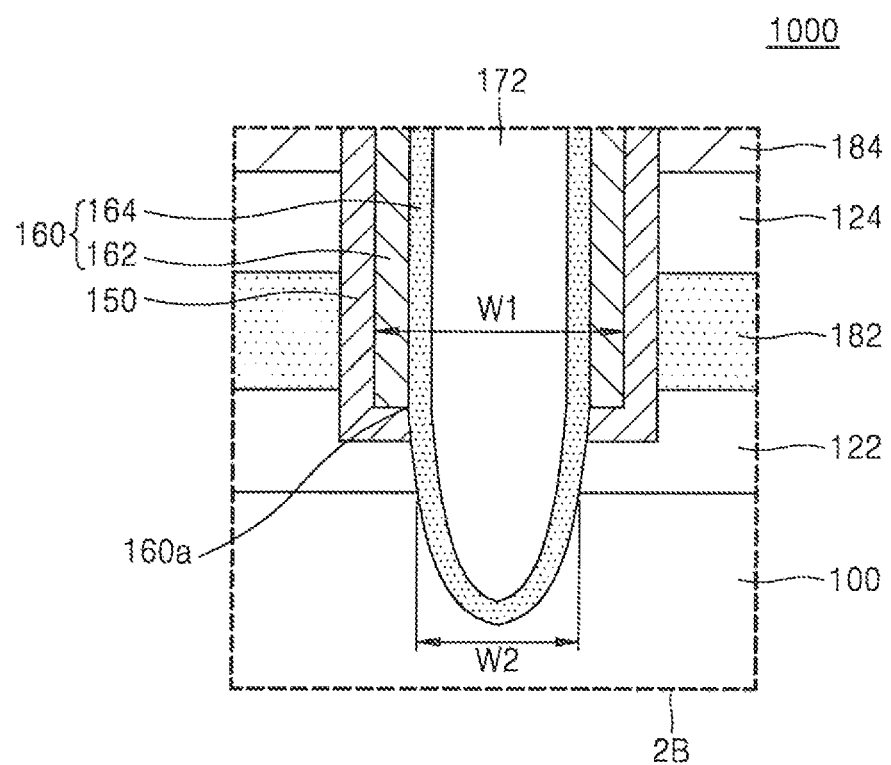
FIG. 2B is an enlarged cross-sectional view of a portion 2B of FIG. 2A.

FIG. 2A is a perspective view schematically illustrating a semiconductor device according to some embodiments of the inventive concept. FIG. 2B is an enlarged cross-sectional view of a portion 2B of FIG. 2A. The semiconductor device 1000 illustrated in FIG. 2A and FIG. 2B corresponds to the memory cell array 10 illustrated in FIG. 1. Referring to FIG. 2A and FIG. 2B, a substrate 100 may be provided. The substrate 100 may include a silicon substrate, a germanium substrate, a silicon-germanium substrate, a silicon-on-insulator (SOI) substrate, or the like. The substrate 100 may be a well having a first conductivity type. For example, the substrate 100 may be a P-well formed by injecting a Group 3 element such as boron (B) thereunto. Alternatively, the substrate 100 may be a pocket p-well provided in an n-well.

A plurality of impurity regions 102, extending along a first direction and separated from each other along a second direction perpendicular to the first direction, may be provided on the substrate 100. The plurality of impurity regions 102 may have a second conductivity type different from the conductivity type of the substrate 100. For example, the plurality of impurity regions 102 may have an n conductivity type.

A channel structure 160, extending along a third direction perpendicular to the first direction and the second direction, may be formed on the substrate 100 between adjacent impurity regions 102. The channel structure 160 may include a channel layer 162 formed to have a cylindrical shape on the outer side of the channel structure 160, and a channel contact layer 164 formed on the inner wall of the channel layer 162 and coming into contact with a top surface of the substrate 100. A bottom surface of the channel layer 162 may be formed at a higher level than the top surface of the substrate 100, and a bottom surface of the channel contact layer 164 may be formed to extend up to a lower level than the top surface of the substrate 100. For example, the channel structure 160 may include a silicon having the first conductivity type, an intrinsic silicon, or a silicon having the second conductivity type. The channel structure 160 may function as a channel region for each of the cell strings (CS11, CS12, CS21, and CS22 of FIG. 1) that are illustrated in FIG. 1.

The channel structure 160 may include a stepped portion 160a having a step height in the first direction and/or the second direction in a side wall portion of the channel structure 160. A bottom portion of the channel layer 162 may form the stepped portion 160a of the channel structure 160. The stepped portion 160a may be formed in the side wall portion of the channel structure 160 between a first gate electrode 182 and the top surface of the substrate 100. The channel structure 160 may have a first width W1 in the second direction in a side wall portion of the channel structure 160 that is located at a higher level than the stepped portion 160a. The channel structure 160 may have a second width W2, smaller than the first width, in the second direction in a side wall portion of the channel structure 160 that is located at a lower level than the stepped portion 160a.

A buried insulating layer 172 may be formed within the channel structure 160. The buried insulating layer 172 may include an insulating material such as silicon oxide, silicon oxynitride, or silicon nitride, or may include an air-gap.

In addition, a first conductive layer 174 may be formed on the buried insulating layer 172 within the channel structure 160. The first conductive layer 174 may function as a drain region for each of the cell strings (CS11, CS12, CS21, and CS22 of FIG. 1) that are illustrated in FIG. 1. The first conductive layer 174 may be any of polysilicon materials doped with the second conductivity type. For example, the first conductive layer 174 may include an n conductivity type polysilicon containing n-type impurities such as phosphorus (P) or arsenic (As).

A gate insulating layer 150 may be formed on an outer wall of the channel structure 160. The gate insulating layer 150 may have a structure in which a tunnel insulating layer, a charge storage layer, a first blocking insulating layer, and a second blocking insulating layer are sequentially laminated. The structure of the gate insulating layer 150 is described in detail with reference to FIGS. 8A-8F.

A first gate electrode 182, extending along the first direction, may be formed on a region of the substrate 100 between the adjacent impurity regions 102. The first gate electrode 182 may be formed to surround an outer wall of the channel structure 160. The first gate electrode 182 may include a conductive material such as a metal or a metal silicide. For example, the first gate electrode 182 may include titanium, tantalum, tungsten, cobalt, titanium nitride, tantalum nitride, titanium silicide, tantalum silicide, tungsten silicide, cobalt silicide, nickel silicide, or the like. The first gate electrode 182 may function as the ground selection line (GSL of FIG. 1) of FIG. 1.

A plurality of second gate electrodes 184 may be formed above the first gate electrode 182 such that they may be separated from each other in the third direction along the outer wall of the channel structure 160. The gate insulating layer 150 may be interposed between the channel structure 160 and the plurality of second gate electrodes 184. The plurality of second gate electrodes 184 may include a metal silicide material. For example, the second gate electrodes 184 may include titanium silicide, tantalum silicide, tungsten silicide, cobalt silicide, nickel silicide, or the like. The plurality of second gate electrodes 184 may function as the word lines (WL1, WL2 . . . WL6 of FIG. 1) of FIG. 1.

A third gate electrode 186 may be formed above the plurality of second gate electrodes 184 such that they may be separated from each other in the third direction along the outer wall of the channel structure 160. The third gate electrode 186 may include a conductive material such as a metal or metal silicide. For example, the third gate electrode 186 may include titanium, tantalum, tungsten, cobalt, titanium nitride, tantalum nitride, titanium silicide, tantalum silicide, tungsten silicide, cobalt silicide, nickel silicide, or the like. The third gate electrode 186 may function as the string selection lines (SSL1 and SSL2 of FIG. 1) of FIG. 1.

A first insulating layer 122 may be interposed between the first gate electrode 182 and the substrate 100, and a plurality of second insulating layers 124 may be interposed between the first gate electrode 182 and the plurality of second gate electrodes 184. In addition, a third insulating layer 126 may be formed on the third gate electrode 186. The first, second, and third insulating layers 122, 124, and 126 may include an insulating material such as silicon oxide, silicon nitride, or silicon oxynitride.

A common source line 192 may be formed on each impurity region 102 to extend along the first direction. A fifth insulating layer 190 may be formed on opposing side walls of the common source line 192 to electrically insulate the first, second, and third gate electrodes 182, 184, and 186 and the common source line 192 from each other.

A bit line contact 196 may be formed on the channel structure 160 and the first conductive layer 174, and a bit line 198 extending in the second direction may be formed on the bit line contact 196.

Referring to FIG. 1 and FIGS. 2A and 2B, the channel structure 160, the adjacent gate insulating layer 150, and portions of the first, second, and third gate electrodes 182, 184, and 186 may constitute cell strings C11, C12, C21, and C22. For example, the channel structure 160, the first gate electrode 182, and the portion of the gate insulating layer 150 that is interposed between the channel structure 160 and the first gate electrode 182 may function as the ground selection transistor GST. The channel structure 160, the plurality of second gate electrodes 184, and the portion of the gate insulating layer 150 that is interposed between the channel structure 160 and the plurality of second gate electrodes 184 may functions as the memory cell transistors MC1, MC2, . . . , MC6. The channel structure 160, the third gate electrode 186, and the portion of the gate insulating layer 150 that is interposed between the channel structure 160 and the third gate electrode 186 may function as the string selection transistor SST.

The memory cell array 10 illustrated in FIG. 1 and FIGS. 2A and 2B is just illustrative of the inventive concept, and the number of word lines, the number of string selection lines, and the number of ground selection lines described as an example are not limited thereto. For example, two or more string selection lines may be sequentially provided along the second direction, or two or more ground selection lines may be sequentially provided along the second direction. In addition, the number of word lines may vary, for example, eight, sixteen, or thirty-two. Furthermore, the number of cell strings connected to the bit line BL is not limited to the number illustrated in FIG. 1 and FIGS. 2A and 2B, and may vary according to the design of the memory cell array 10. In addition, the structure of the memory cell array 10 illustrated in FIG. 1 and FIGS. 2A and 2B are merely illustrative of the inventive concept. In addition, the structure is not limited to the embodiments described herein, and may include various types of memory cell arrays formed to have a three-dimensional array structure.

Figure 3A:
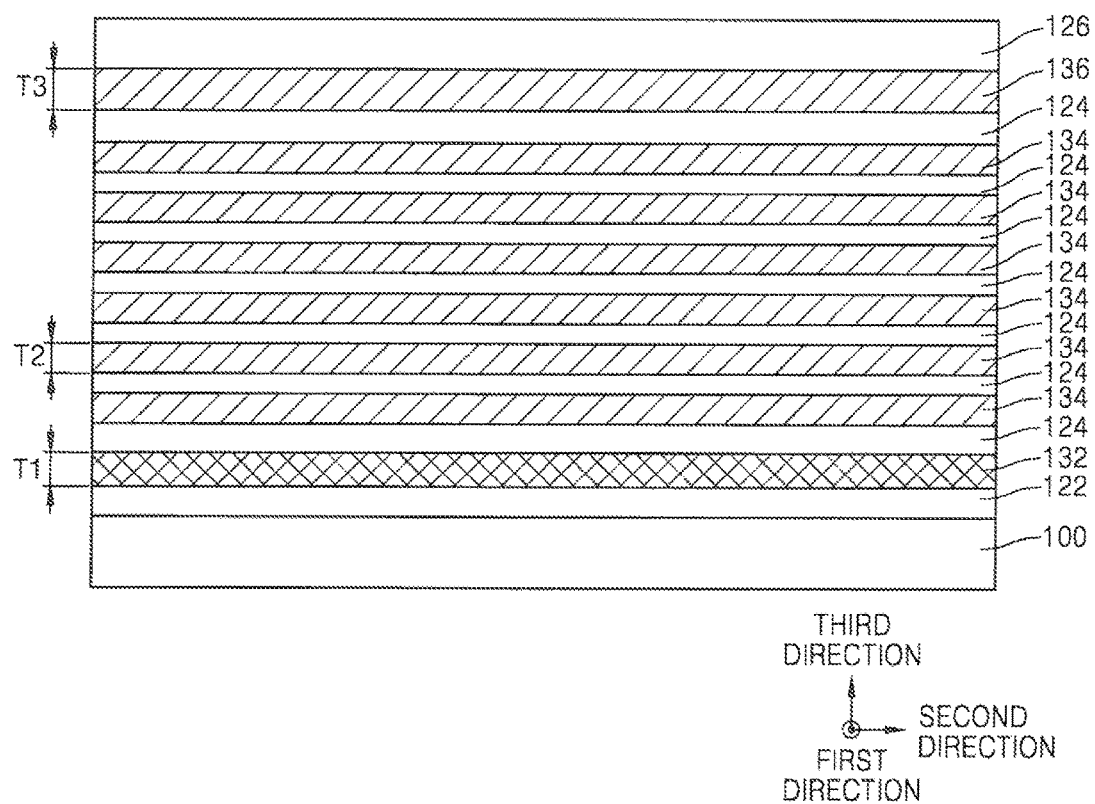
FIGS. 3A-3M are cross-sectional views schematically illustrating a method of manufacturing semiconductor devices according to some embodiments of the inventive concept.

FIGS. 3A-3M are cross-sectional views schematically illustrating a method of manufacturing semiconductor devices according to some embodiments of the inventive concept. FIGS. 3A-3M are cross-sectional views of the perspective views of FIGS. 2A and 2B that are seen from in the first direction according to a process procedure. Referring to FIG. 3A, the first insulating layer 122 may be formed on the substrate 100, and a first sacrificial layer 132 may be formed on the first insulating layer 122. The plurality of second insulating layers 124 and a plurality of second sacrificial layers 134 may be alternately laminated on the first sacrificial layer 132. The number of laminated second sacrificial layers 134 may vary depending on the number of memory cell transistors to be formed. In addition, a third sacrificial layer 136 may be formed on the uppermost second insulating layer 124, and the third insulating layer 126 may be formed on the third sacrificial layer 136.

The first, second, and third insulating layers 122, 124, and 126 may be formed of an insulating material such as silicon oxide, silicon nitride, or silicon oxynitride. The first, second, and third insulating layers 122, 124, and 126 may have different thicknesses.

The first sacrificial layer 132 may be formed to have a first thickness T1 using silicon nitride ($SiN_x$), aluminum oxide ($AlO_x$), silicon carbide (SiC), or the like. For example, the first thickness T1 of the first sacrificial layer 132 may be in a range of approximately 2 nm to 20 nm. The first sacrificial layer 132 may be formed using a material having etch selectivity with respect to the first, second, and third insulating layers 122, 124, and 126. FIG. 3A illustrates that the first sacrificial layer 132 may be formed as a single layer, but two or more first sacrificial layers 132 may be laminated.

The plurality of second sacrificial layers 134 may be formed to have a second thickness T2 using a conductive material such as polysilicon. For example, the second thickness T2 may be formed to be smaller than the first thickness T1, but is not limited thereto.

The third sacrificial layer 136 may be formed to have a third thickness T3 using a conductive material such as polysilicon. Alternatively, the third sacrificial layer 136 may be formed using silicon nitride, aluminum oxide, silicon carbide, or the like. For example, the third thickness T3 of the third sacrificial layer 136 may be formed to be larger than the second thickness T2, but is not limited thereto.

Figure 3B:
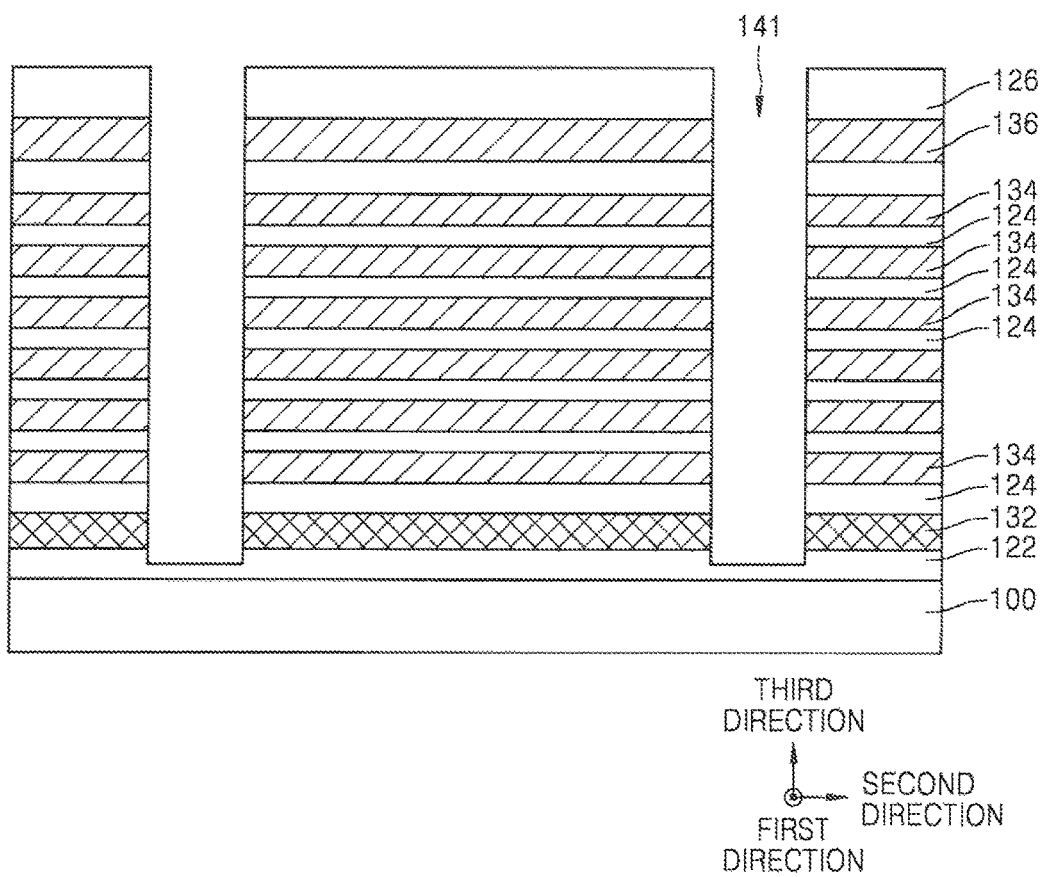

Referring to FIG. 3B, a first opening 141 passing through the second and third insulating layers 124 and 126 and the first, second, and third sacrificial layers 132, 134, and 136 may be formed. A mask pattern may be formed on the third insulating layer 126, and the third insulating layer 126, the plurality of second insulating layers 124, the plurality of second sacrificial layers 134, and the first sacrificial layer 132 may be anisotropically etched in order using the mask pattern as an etching mask until a top surface of the first insulating layer 122 may be exposed, thereby forming the first opening 141. The first insulating layer 122 may be etched to a predetermined depth by the first opening 141 so that a bottom portion of the first opening 141 may be formed within the first insulating layer 122.

Figure 3C:
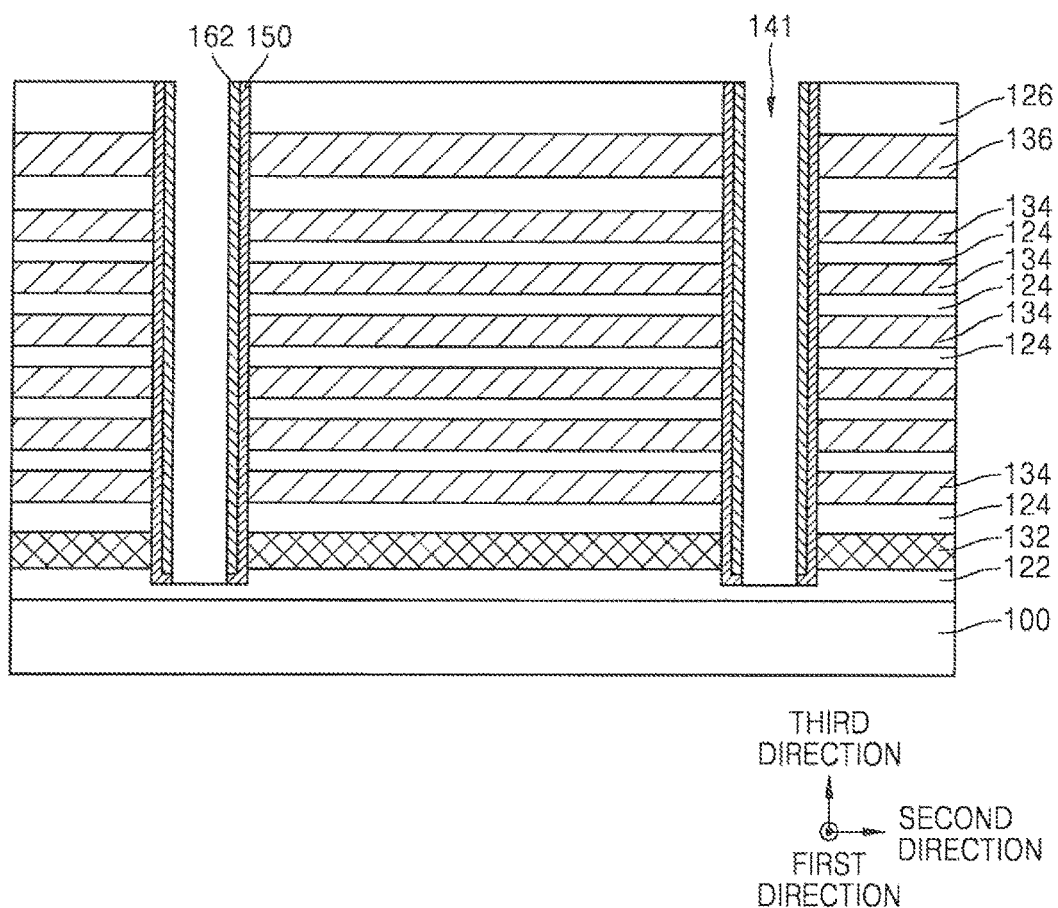

Referring to FIG. 3C, the gate insulating layer 150 may be formed on a side wall and bottom portion of the first opening 141. The gate insulating layer 150 may be conformally formed on the side wall and bottom portion of the first opening 141 to have a predetermined thickness and the first opening 141 may not be completely filled.

The gate insulating layer 150 may be formed to include a tunnel insulating layer, a charge storage layer, a first blocking insulating layer, and a second blocking insulating layer that are sequentially laminated. The tunnel insulating layer, the charge storage layer, and the first and second blocking insulating layers may be formed using an atomic layer deposition (ALD) process, a chemical vapor deposition (CVD) process, or the like. The tunnel insulating layer may include silicon oxide. The charge storage layer may be a charge trapping layer or a floating gate layer. The charge storage layer may include a quantum dot or nanocrystal. The first and second blocking insulating layers may include a high-k dielectric material having a high dielectric constant. In addition, the second blocking insulating layer may be formed using a material having a dielectric constant that is greater than a dielectric constant of the first blocking insulating layer.

Thereafter, the channel layer 162 may be formed on the gate insulating layer 150 within the first opening 141. The channel layer 162 may be formed on the side wall of the first opening 141 to have predetermined thickness.

A conductive layer may be conformally formed on the bottom portion and side wall of the first opening 141, an anisotropic etching process may be performed on the conductive layer to remove the portion of the conductive layer formed on the bottom portion of the first opening 141, thereby forming the channel layer 162. Thereafter, the portion of the gate insulating layer 150 that is exposed by the bottom portion of the first opening 141 may also be removed by an anisotropy etching process to expose the top surface of the first insulating layer 122. Thus, a structure in which the gate insulating layer 150 and the channel layer 162 are sequentially laminated may be formed on the side wall of the first opening 141.

The channel layer 162 may be formed using a conductive material such as polysilicon doped with impurities. For example, the impurities may be p-type impurities such as phosphorus (P) or arsenic (As) or n-type impurities such as boron (B). The impurities may be in-situ doped in a process of forming the channel layer 162. Alternatively, after the channel layer 162 is formed, the impurities may be injected into the channel layer 162 using an ion implantation process.

Figure 3D:
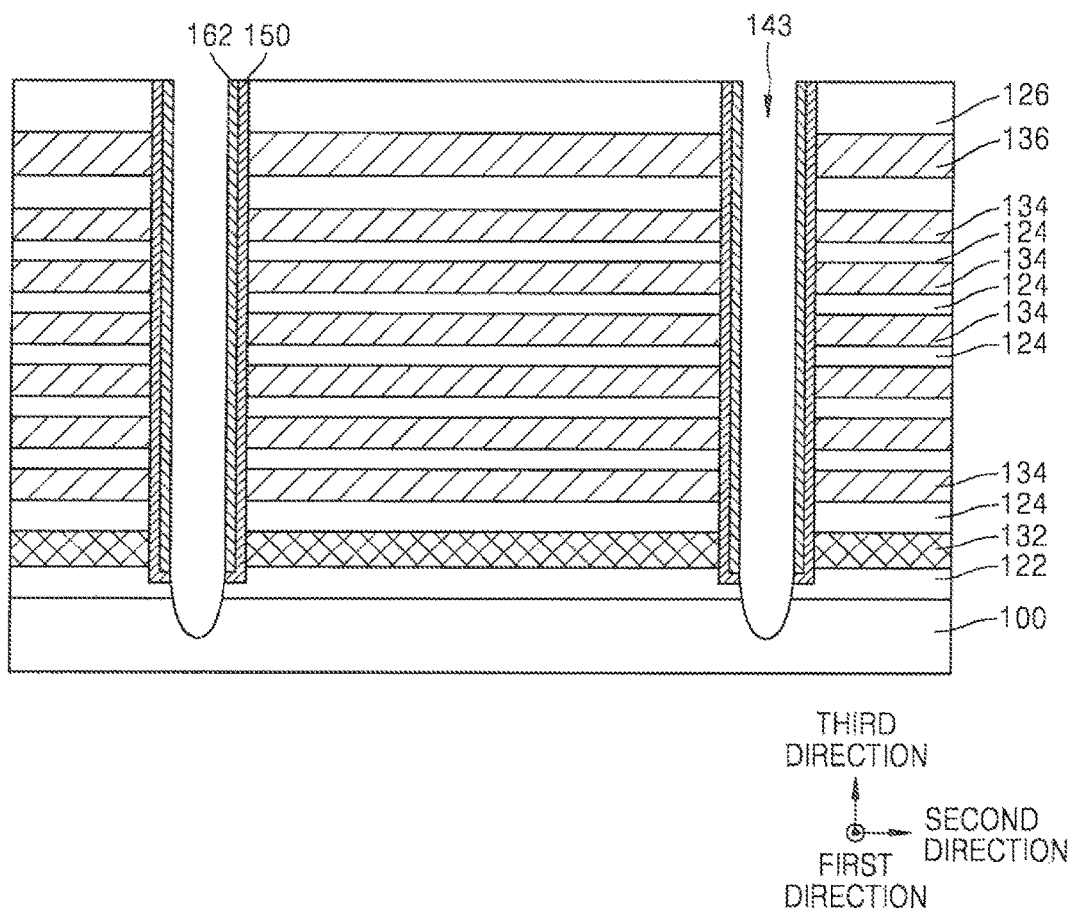

Referring to FIG. 3D, a second opening 143 may be formed to extend downwards below the first opening 141 (see FIG. 3C) and to expose an upper portion of the substrate 100. The portion of the first insulating layer 122 that is exposed within the first opening 141 may be removed, and an anisotropy etching process may be performed until the top surface of the substrate 100 is exposed, thereby forming the second opening 143. The second opening 143 may be recessed up to a predetermined depth from the top surface of the substrate 100.

Figure 3E:
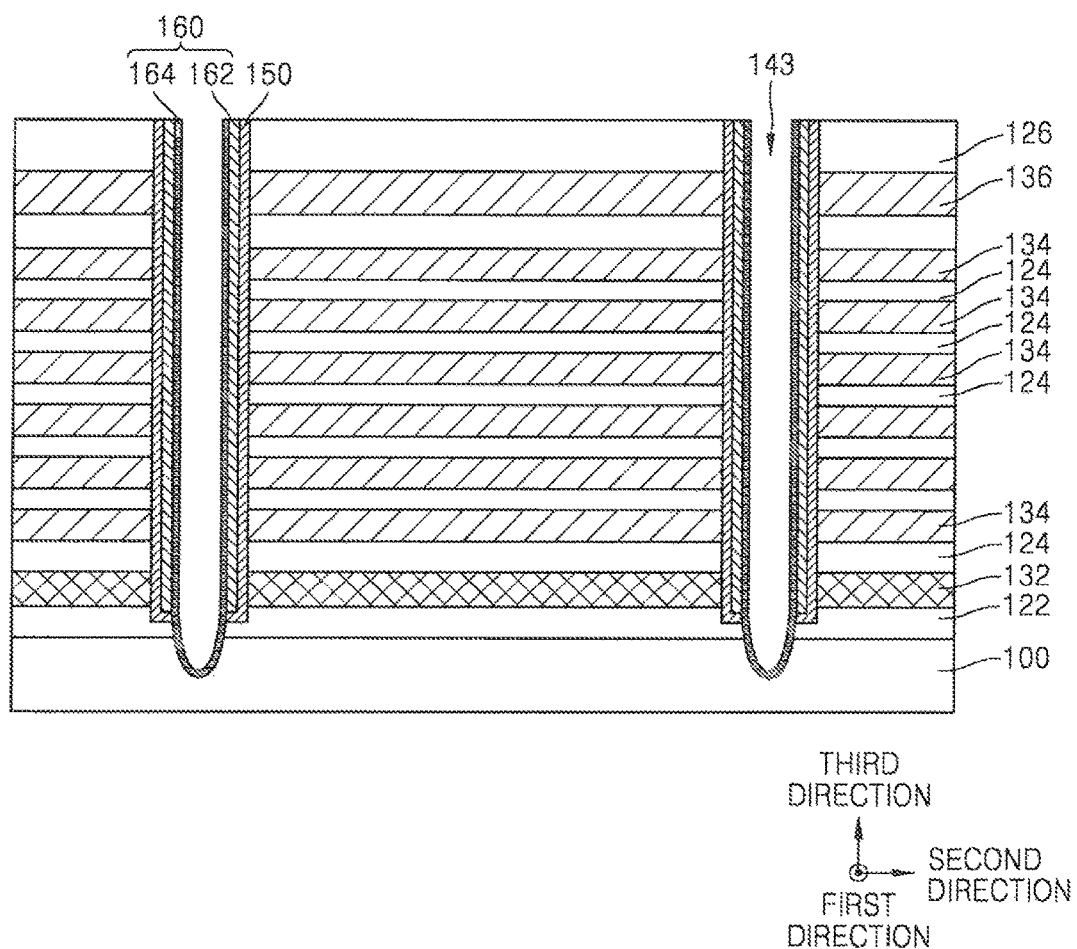

Referring to FIG. 3E, the channel contact layer 164 may be formed on a side wall and bottom portion of the second opening 143. The channel contact layer 164 may be formed on the channel layer 162 within the second opening 143 to have a predetermined thickness, and the channel contact layer 164 may be formed to come into contact with the top surface of the substrate 100 exposed by the bottom portion of the second opening 143.

The channel contact layer 164 may be formed using a conductive material such as polysilicon doped with impurities. The channel contact layer 164 may be formed using the same material as the channel layer 162, but the material of the channel contact layer 164 is not limited thereto. In addition, an impurity doping concentration of the channel contact layer 164 may be the same as or different from an impurity doping concentration of the channel layer 162.

The laminated structure of the channel layer 162 and the channel contact layer 164 may be defined as the channel structure 160. The channel structure 160 may include the channel contact layer 164 coming into contact the substrate 100 and extending in a vertical direction, and the channel layer 162 surrounding an outer wall of the channel contact layer 164.

Figure 3F:
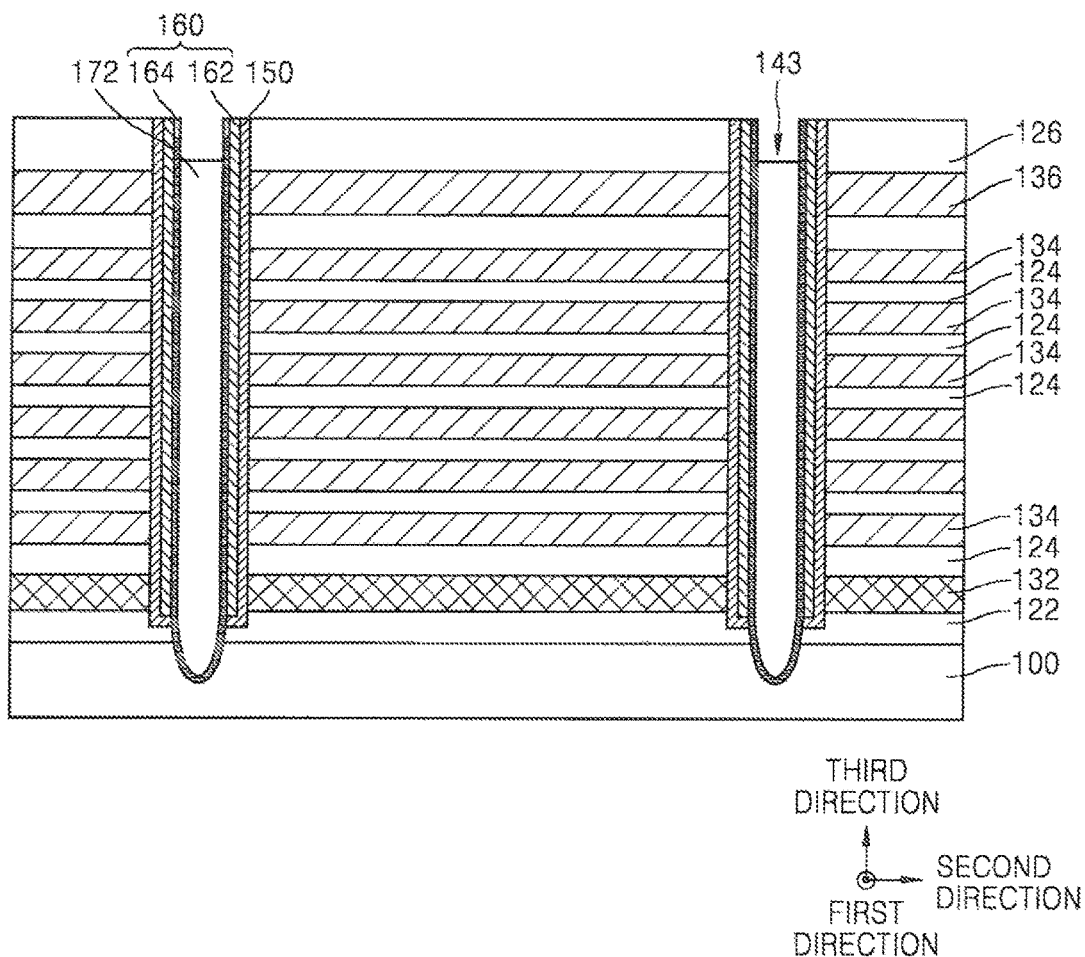

Referring to FIG. 3F, a buried insulating layer 172 may be formed on the channel contact layer 164 within the second opening 143. An insulating layer filling the second opening 143 may be formed, and a chemical mechanical polishing (CMP) process and/or an etch-back process may be performed on the insulating layer, thereby forming the buried insulating layer 172. A top surface of the buried insulating layer 172 may be formed at a lower level than a top surface of the third insulating layer 126 so as not to fill a portion of an upper portion of the third opening 143. The top surface of the buried insulating layer 172 may be formed at a higher level than a top surface of the third sacrificial layer 134.

Figure 3G:
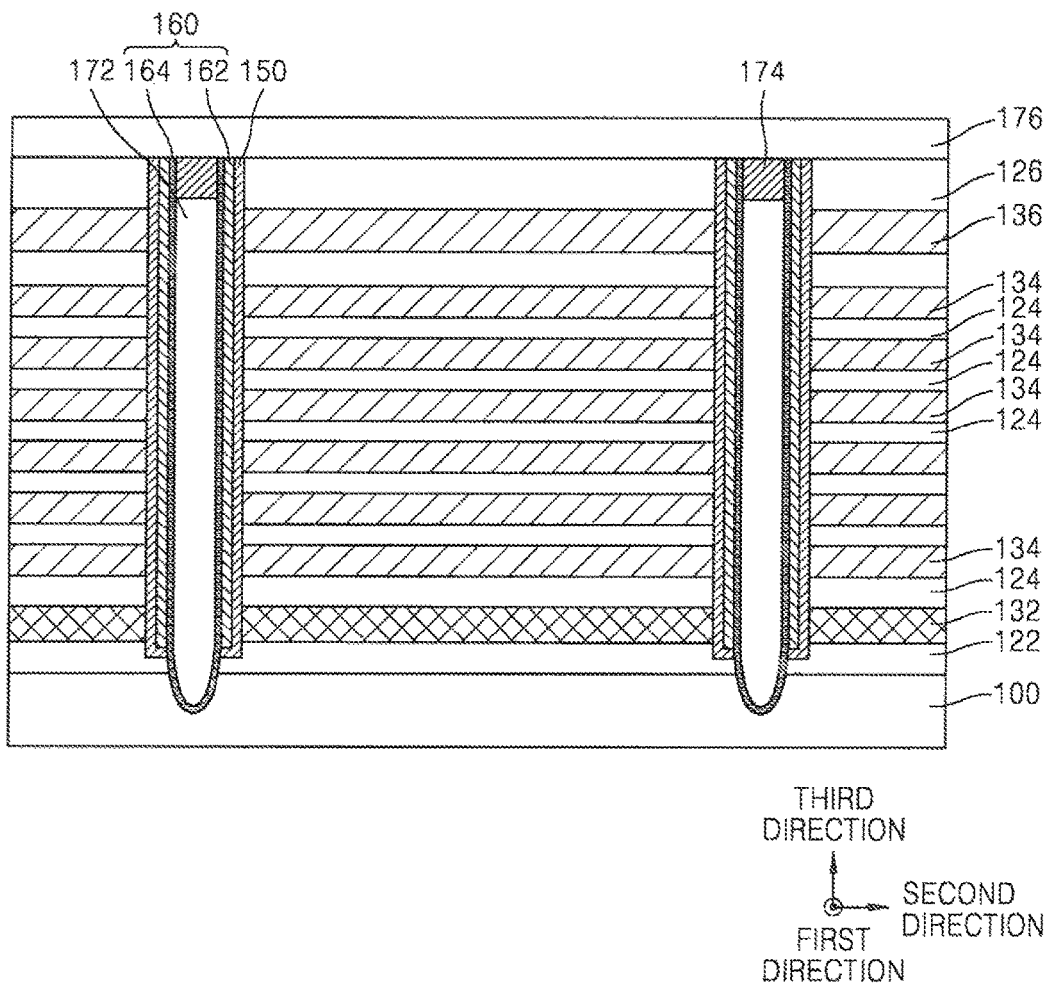

Referring to FIG. 3G, a first conductive layer 174 filling the third opening 143 (see FIG. 3F) may be formed on a side wall of the channel contact layer 164 and the buried insulating layer 172. For example, a conductive material may be formed on the side wall of the channel contact layer 164, the buried insulating layer 172, and the third insulating layer 126, and then an upper portion of the conductive material may be planarized until a top surface of the third insulating layer 126 is exposed, thereby forming the first conductive layer 174. The first conductive layer 174 may be formed using a conductive material such as polysilicon doped with impurities.

Thereafter, a fourth insulating layer 176 may be formed on the third insulating layer 126, the channel structure 160, and the first conductive layer 174.

Figure 3H:
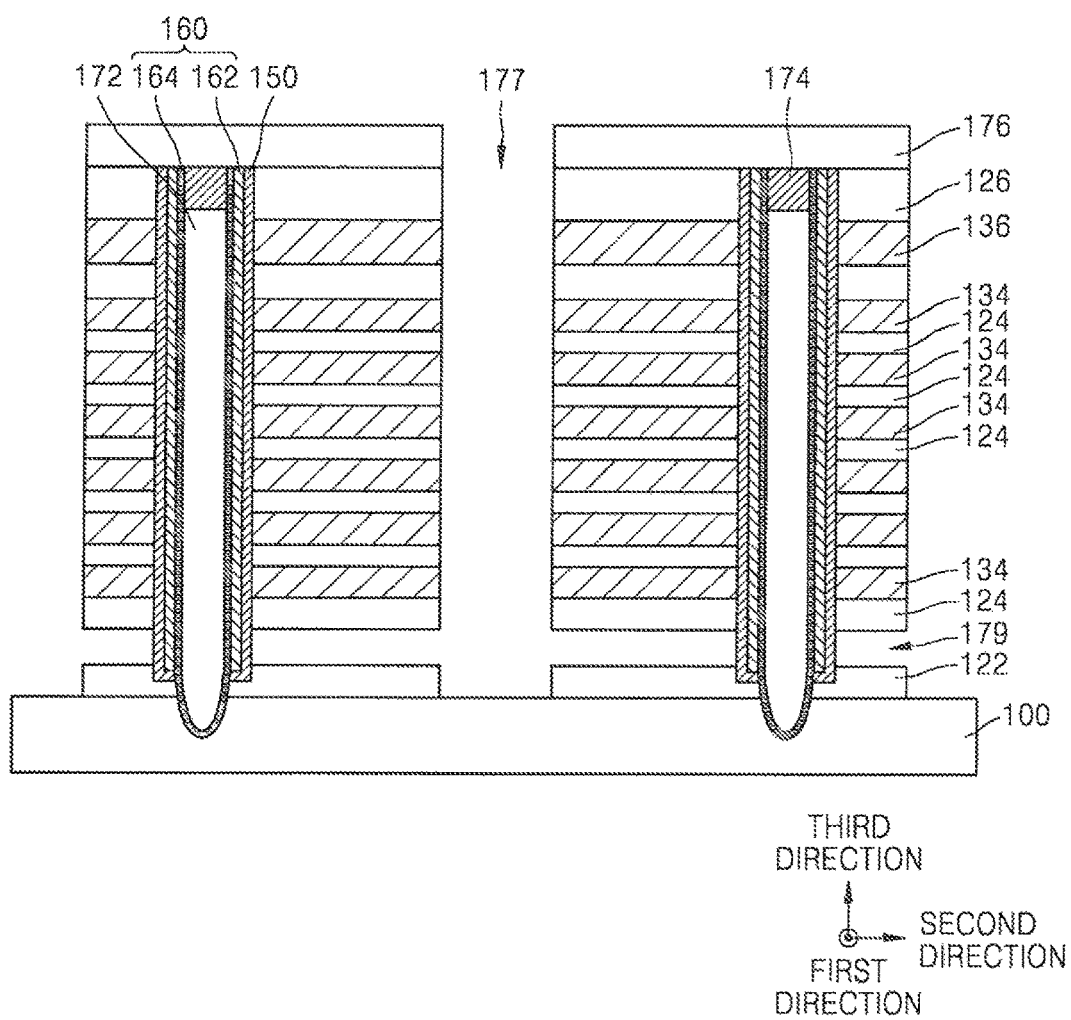

Referring to FIG. 3H, the first, second, third, and fourth insulating layers 122, 124, 126, and 176 and the first, second, and third sacrificial layers 132, 134, and 136 (see FIG. 3G) between the adjacent channel structures 160 may be anisotmpically etched, and thus a third opening 177 exposing the top surface of the substrate 100 may be formed. The third opening 177 may be formed to extend along the first direction. In addition, side surfaces of the first, second, third, and fourth insulating layers 122, 124, 126, and 176 and the first, second, and third sacrificial layers 132, 134, and 136 may be exposed by the formation of the third opening 177.

Thereafter, the first sacrificial layer 132 may be removed, and thus a fourth opening 179 may be formed in a space between the first insulating layer 122 and the second insulating layer 124. A side wall of the gate insulating layer 150 may be exposed by the fourth opening 179.

The first sacrificial layer 132 may be formed using a material having etch selectivity with respect to the plurality of second sacrificial layers 134, and thus only the first sacrificial layer 132 may be selectively removed. For example, when the first sacrificial layer 132 includes silicon nitride, the plurality of second sacrificial layers 134 includes polysilicon, and the first, second, third, and fourth insulating layers 122, 124, 126, and 176 includes silicon oxide, only the first sacrificial layer 132 may be selectively removed by performing a wet etching process using an etchant containing phosphoric acid ($H_3PO_4$).

Figure 3I:
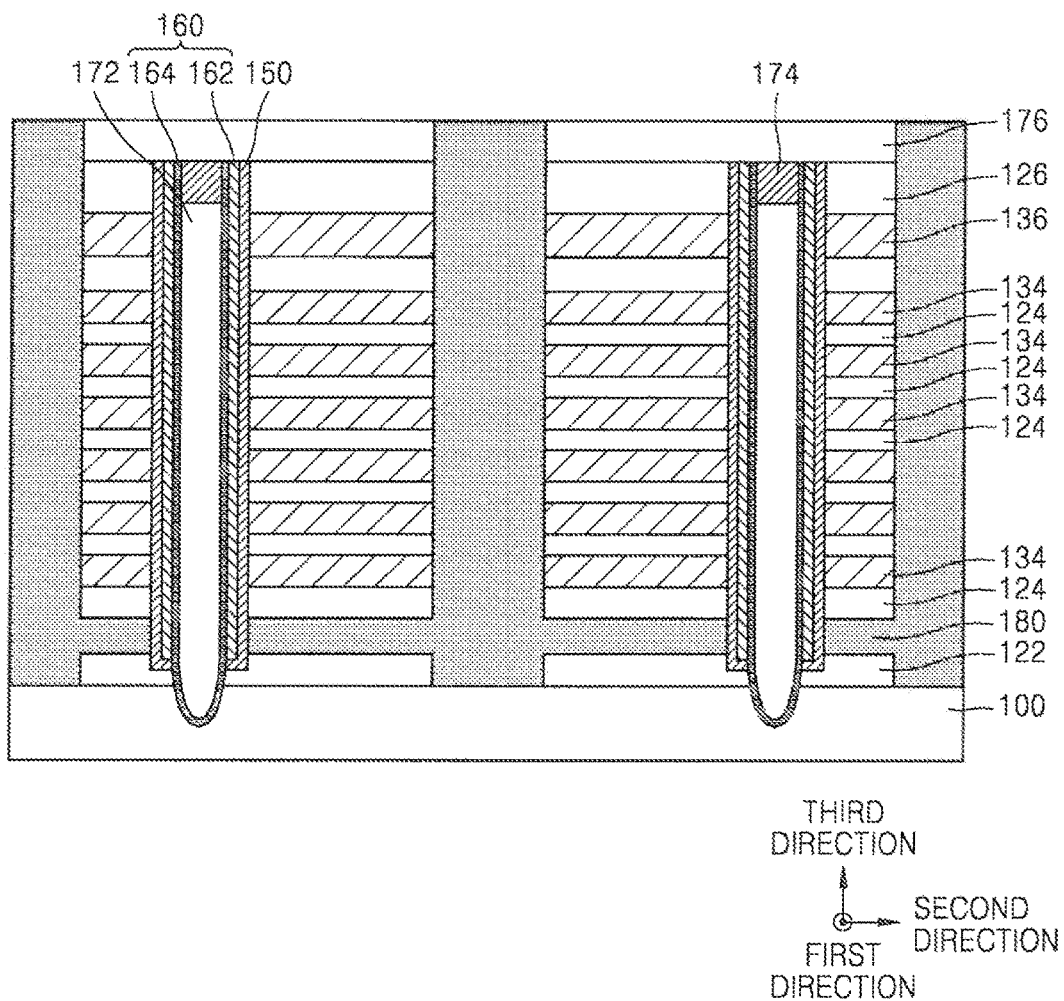

Referring to FIG. 3I, a second conductive layer 180 filling the third opening 177 (see FIG. 3H) and the fourth opening 179 (see FIG. 3H) may be formed. The second conductive layer 180 may completely fill a space between the gate insulating layer 150 which may be exposed by the fourth opening 179, the first insulating layer 122, and the lowermost second insulating layer 124, and may be formed on the top surface of the substrate 100, which may be exposed by the third opening 177, side walls of the second and third sacrificial layers 134 and 136, and side walls of the first, second, third, and fourth insulating layers 122, 124, 126, and 176.

The second conductive layer 180 may be formed by an electroplating process using a conductive material such as tungsten, copper, aluminum, titanium, titanium nitride, tantalum, tantalum nitride, or ruthenium. Alternatively, the second conductive layer 180 may be formed using polysilicon doped with impurities. Before the second conductive layer 180 is formed, a process of forming a diffusion barrier layer on the gate insulating layer 150 exposed by the fourth opening 179 may further be performed. The diffusion barrier layer may include tungsten nitride, tantalum nitride, or titanium nitride.

A portion of the second conductive layer 180 formed on the fourth insulating layer 176 may be removed by performing a planarization process until a top surface of the fourth insulating layer 176 is exposed, and a top surface of the second conductive layer 180 may be formed at the same level as the fourth insulating layer 176.

Figure 3J:
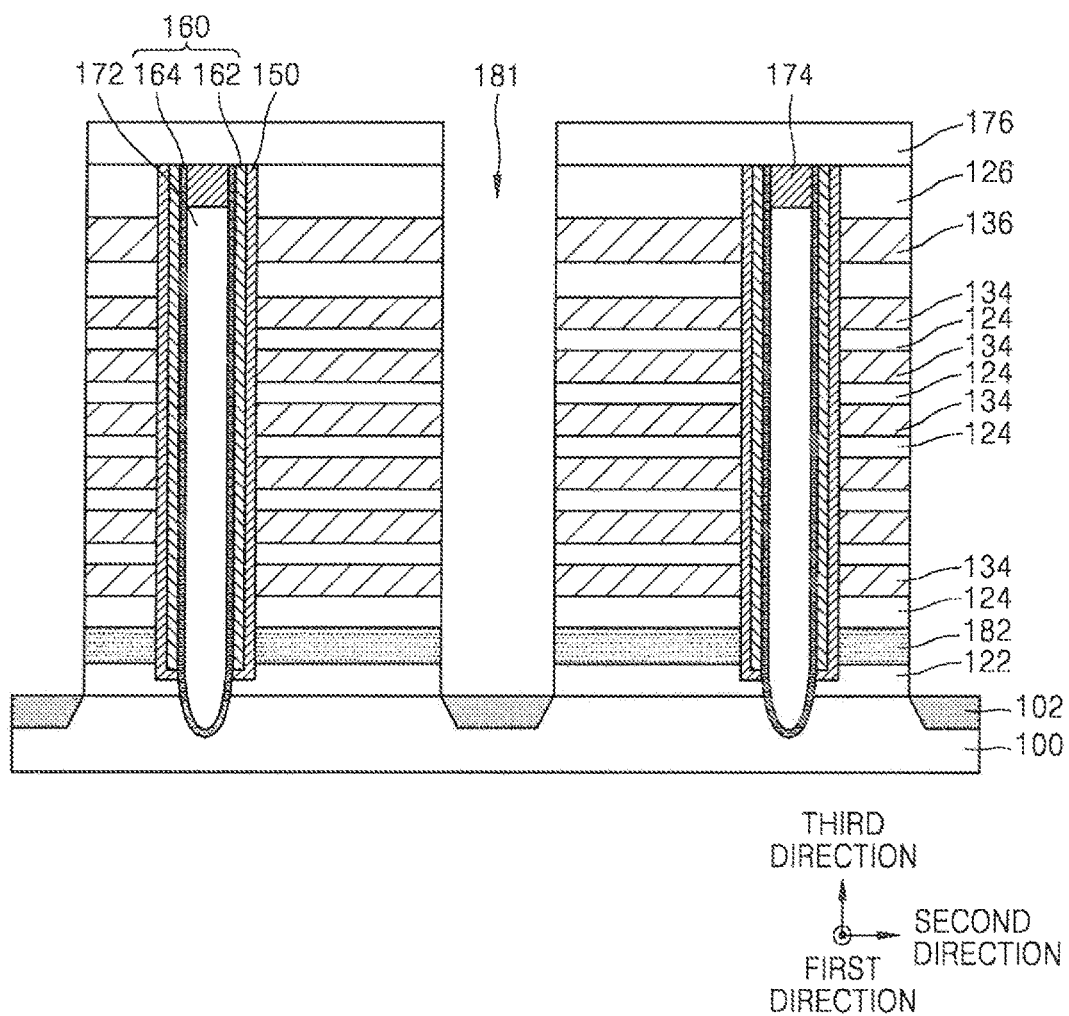

Referring to FIG. 3J, an anisotropy etching process may be performed using the exposed top surface of the fourth insulating layer 176 as an etching mask to form a fifth opening 181 exposing the top surface of the substrate 100. The side surfaces of the insulating layers 122, 124, 126, and 176 and the second and third sacrificial layers 134 and 136 may be exposed by the formation of the fifth opening 181. In addition, a space between the first insulating layer 122 and the lowermost second insulating layer 124 and a portion of the second conductive layer 180 that is buried on the side wall of the gate insulating layer 150 in the second conductive layer 180 (see FIG. 3I) only remain, thereby forming the first gate electrode 182.

Thereafter, impurities may be injected into the upper portion of the substrate 100 that is exposed by the fifth opening 181 to form the impurity region 102 on the substrate 100. The impurities may be n-type impurities such as phosphorus or arsenic or p-type impurities such as boron. The impurity region 102 may function as a source region.

Figure 3K:
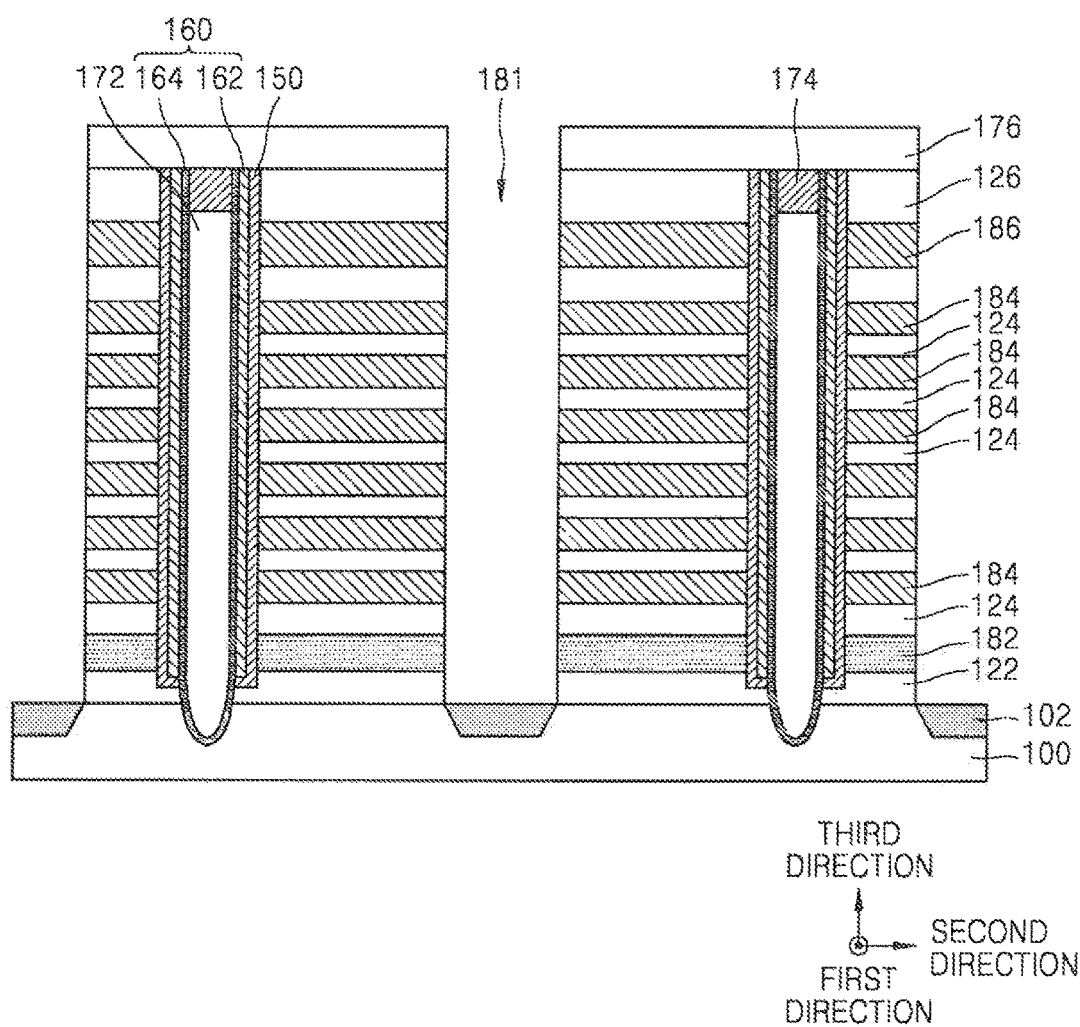

Referring to FIG. 3K, a silicidation process may be performed on the second and third sacrificial layers 134 and 136 exposed by the fifth opening 181 to change the plurality of second sacrificial layers 134 to the plurality of second gate electrodes 184 and to change the third sacrificial layer 136 to the third gate electrode 186.

The second and third gate electrodes 184 and 186 may include titanium silicide, tantalum silicide, tungsten silicide, cobalt silicide, nickel silicide, or the like. In addition, the silicidation process may be performed such that a portion of the impurity region 102 on the substrate 100 that is exposed may be changed to metal silicide.

When the first gate electrode 182 is formed to include a metal or metal nitride, the material of the first gate electrode 182 does not change by the silicidation process, and thus the first gate electrode 182 may include a material different from those of the plurality of second gate electrodes 184. Alternatively, when the first gate electrode 182 is formed to include polysilicon doped with impurities, the first gate electrode 182 may also change to a metal silicide material by the silicidation process. In this case, the first gate electrode 182 may be formed to include the same material as the second gate electrodes 184.

Figure 3L:
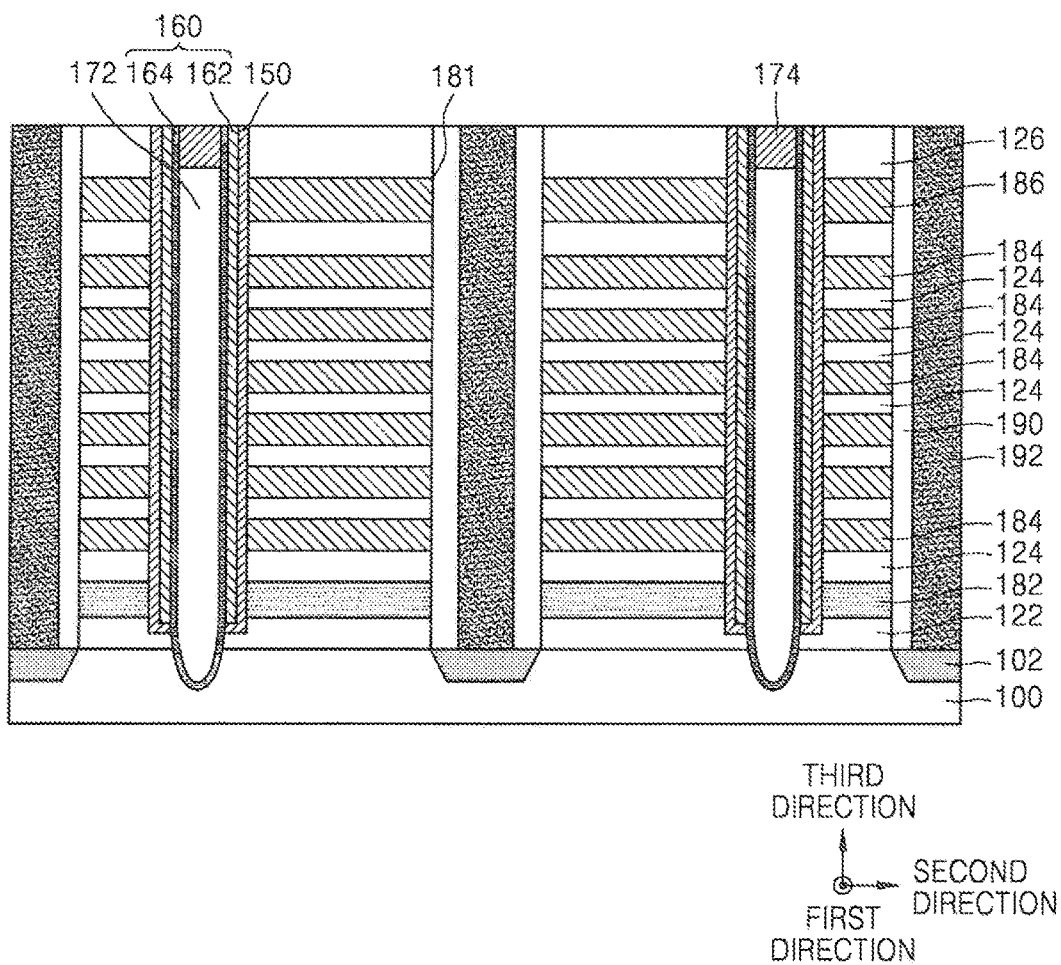

Referring to FIG. 3L, the fourth insulating layer 176 (see FIG. 3K) may be removed to expose top surfaces of the channel structure 160 and the first conductive layer 174.

Thereafter, an insulating layer having a predetermined thickness may be formed on exposed surfaces of the third insulating layer 126, the first conductive layer 174, and the fifth opening 181, and then an anisotropy etching process may be performed on the insulating layer until the top surface of the substrate 100 of the bottom portion of the fifth opening 181 may be exposed, thereby forming a fifth insulating layer 190 covering side walls of the fifth opening 181. The top surfaces of the channel structure 160, the first conductive layer 174, and the third insulating layer 126 may also be exposed by the anisotropy etching process.

Thereafter, a common source line 192 filling the fifth opening 181 may be formed on a side wall of the fifth insulating layer 190. The common source line 192 may be electrically connected to the impurity region 102 of the substrate 100, and may be formed to extend in the first direction.

In the exemplary process, a conductive material may be formed on the exposed surfaces of the third insulating layer 126 and the first conductive layer 174 and side walls of the fifth opening 181. An upper portion of the conductive material may be planarized until the top surfaces of the first conductive layer 174 and the third insulating layer 126 are exposed, thereby forming the common source line 192. For example, the common source line 192 may be formed of a metal, metal silicide, or a combination thereof. For example, the common source line 192 may be formed using tungsten, aluminum, copper, cobalt silicide, or the like.

Figure 3M:
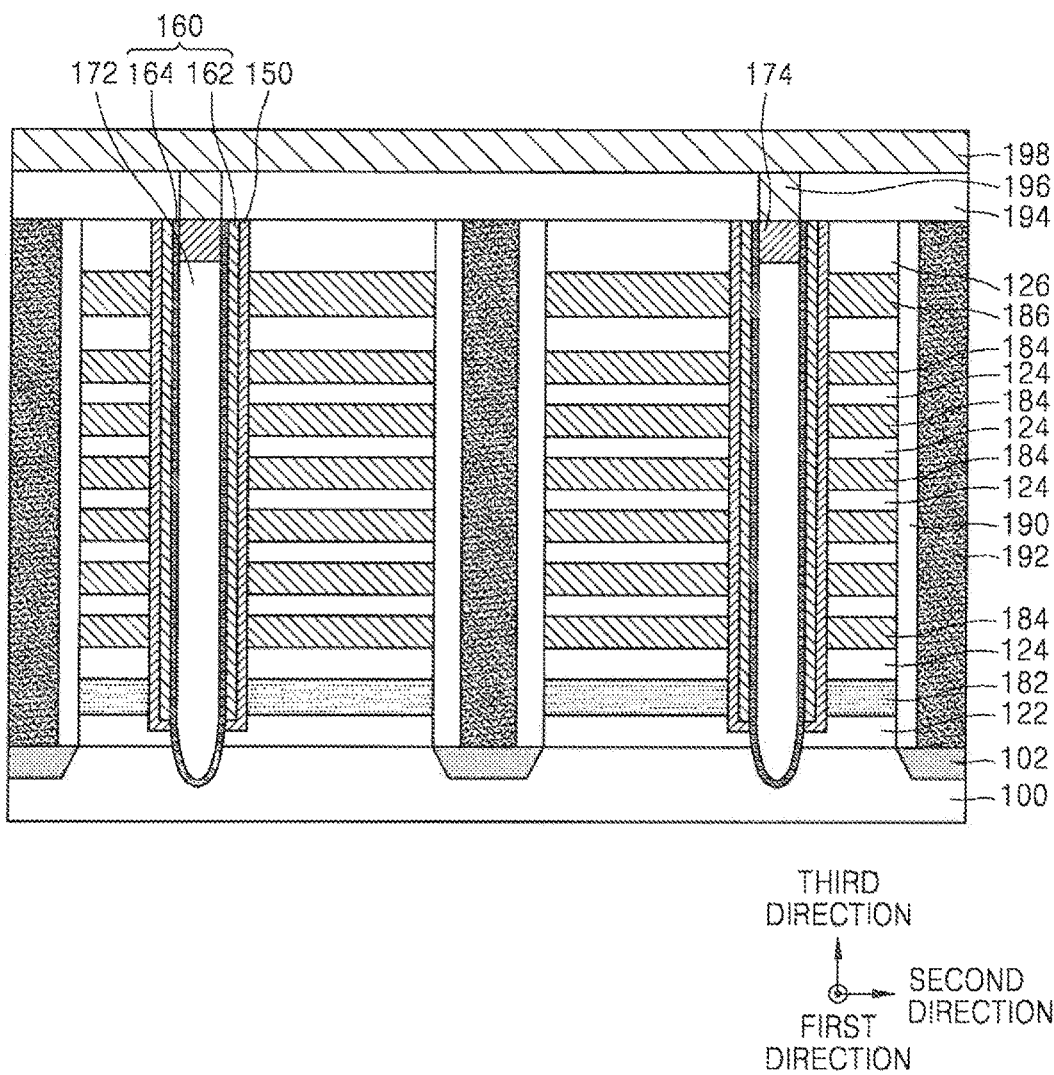

Referring to FIG. 3M, a sixth insulating layer 194 may be formed on the channel structure 160, the first conductive layer 174, the third insulating layer 126, and the common source line 192, and a plurality of bit line contacts 196 passing through the sixth insulating layer 196 and electrically connected to the channel structure 160 and the first conductive layer 174 may be formed.

Thereafter, a bit line 198 connecting the bit line contacts 196, arranged in the second direction, to each other may be formed on the sixth insulating layer 196. The bit line 198 may be formed to have a linear shape extending in the second direction.

Thus the formation of the semiconductor device 1000 may be completed.

According to some methods of manufacturing a semiconductor device 1000, the first sacrificial layer 132 for forming the first gate electrode 182 may be formed using a material different from that of the second sacrificial layers 134 for forming the second gate electrodes 184, and thus the first gate electrode 182 may be formed to have a material and/or a height different from that of the second gate electrodes 184. A threshold voltage of a transistor may vary depending on the material of the gate electrode and/or the height (width depending on the third direction of the gate electrode) of the gate electrode. Thus, according to the inventive concept, a threshold voltage of the ground selection transistor may be adjusted, and thus the reliability of the semiconductor device 1000 may be improved.

In addition, according to some methods of manufacturing a semiconductor device 1000, the second sacrificial layers 134 including a conductive material such as polysilicon may be formed, and then the second sacrificial layers 134 may be changed to the second gate electrodes 184 by a silicidation process. The method of manufacturing a semiconductor device 1000 may be facilitated by omitting the processes of removing the second sacrificial layers 134 and a process of burying the conductive material, and instead forming the second gate electrodes 184 using a silicidation process.

In addition, the second sacrificial layers 134 including a conductive material may be prevented from being oxidized or damaged during a process of forming the channel contact layer 164, and thus an electrical characteristic of the semiconductor device 1000 may be improved.

FIGS. 4A-4F are cross-sectional views schematically illustrating a method of manufacturing a semiconductor device 1000a according to some embodiments of the inventive concept. The manufacturing method may be similar to the method of manufacturing a semiconductor device 1000 described with reference to FIG. 3A to FIG. 3M except, for example, that an etch stop layer 202 may be further formed, and thus a description will be made with an emphasis on the differences therebetween. In FIG. 4A to FIG. 4F, the same reference numerals and signs as FIG. 3A to FIG. 3M denote the same components.

Figure 4A:
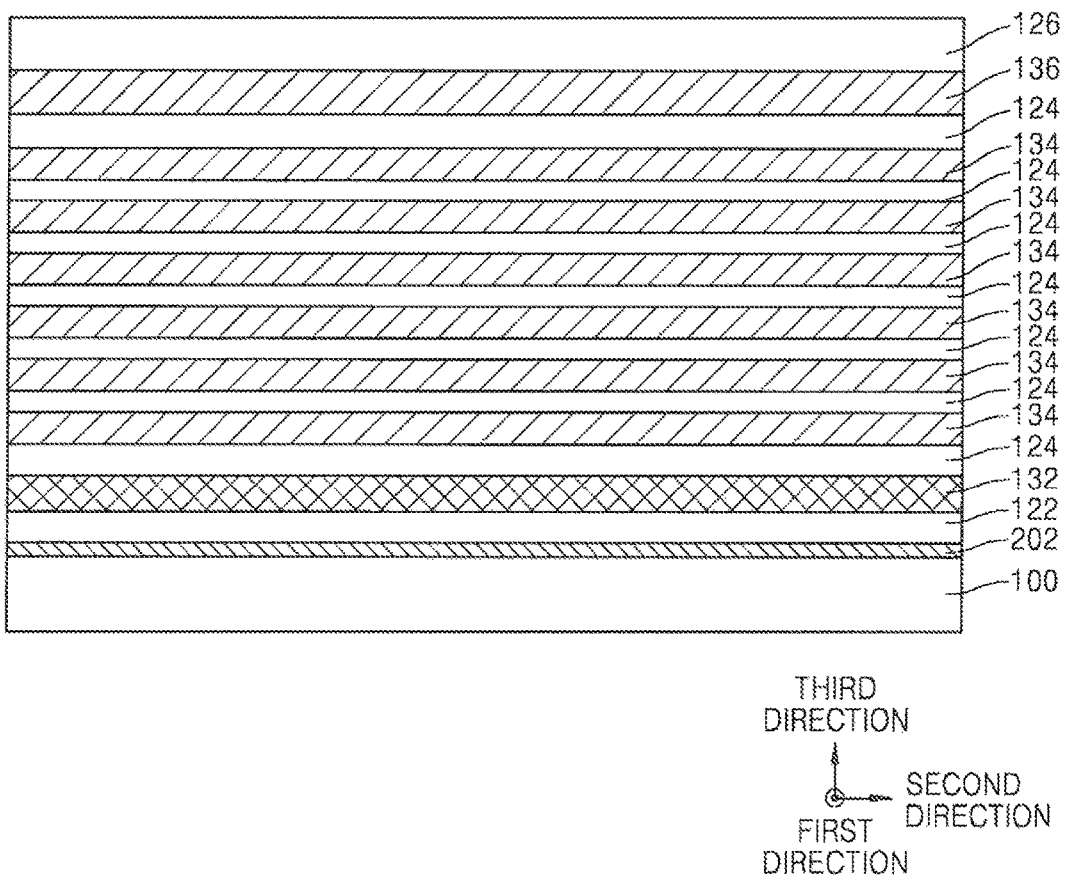
FIGS. 4A-4F are cross-sectional views schematically illustrating a method of manufacturing a semiconductor device according to some embodiments of the inventive concept.

Referring to FIG. 4A, the etch stop layer 202 may be formed on the substrate 100 to have a predetermined thickness. Thereafter, a first insulating layer 122 and a first sacrificial layer 132 may be sequentially formed on the etch stop layer 202, a plurality of second insulating layers 124 and a plurality of second sacrificial layers 134 may be alternately laminated, and a third sacrificial layer 136 and a third insulating layer 126 may be formed on the uppermost insulating layer 124.

The etch stop layer 202 may be formed using a material such as aluminum oxide (AlOx), silicon nitride, or silicon carbide. The etch stop layer 202 may be formed using a material having etch selectivity with respect to the first sacrificial layer 132. In addition, the etch stop layer 202 may be formed using a material having etch selectivity with respect to the plurality of second sacrificial layers 134 and the third sacrificial layer 136. The etch stop layer 202 may be formed to have a thickness smaller than that of the first sacrificial layer 132, but is not limited thereto.

Figure 4B:
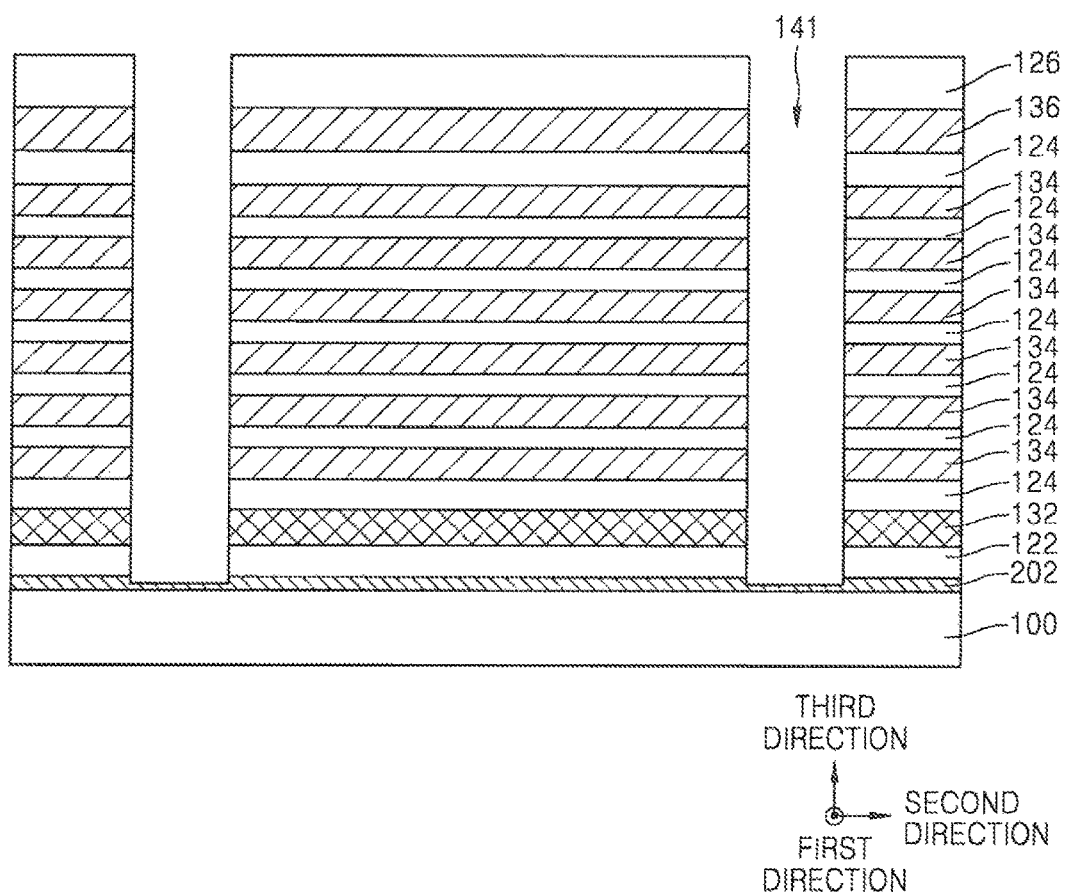

Referring to FIG. 4B, the first, second, and third insulating layers 122, 124, and 126 and the first, second, and third sacrificial layers 132, 134, and 136 may be anisotropically etched until a top surface of the etch stop layer 202 is exposed, thereby forming a first opening 141 passing through the first, second, and third insulating layers 122, 124, and 126 and the first, second, and third sacrificial layers 132, 134, and 136. A portion of the top surface of the etch stop layer 202 may be etched by the anisotropy etching process, and thus a bottom portion of the first opening 141 may be formed within the etch stop layer 202.

Figure 4C:
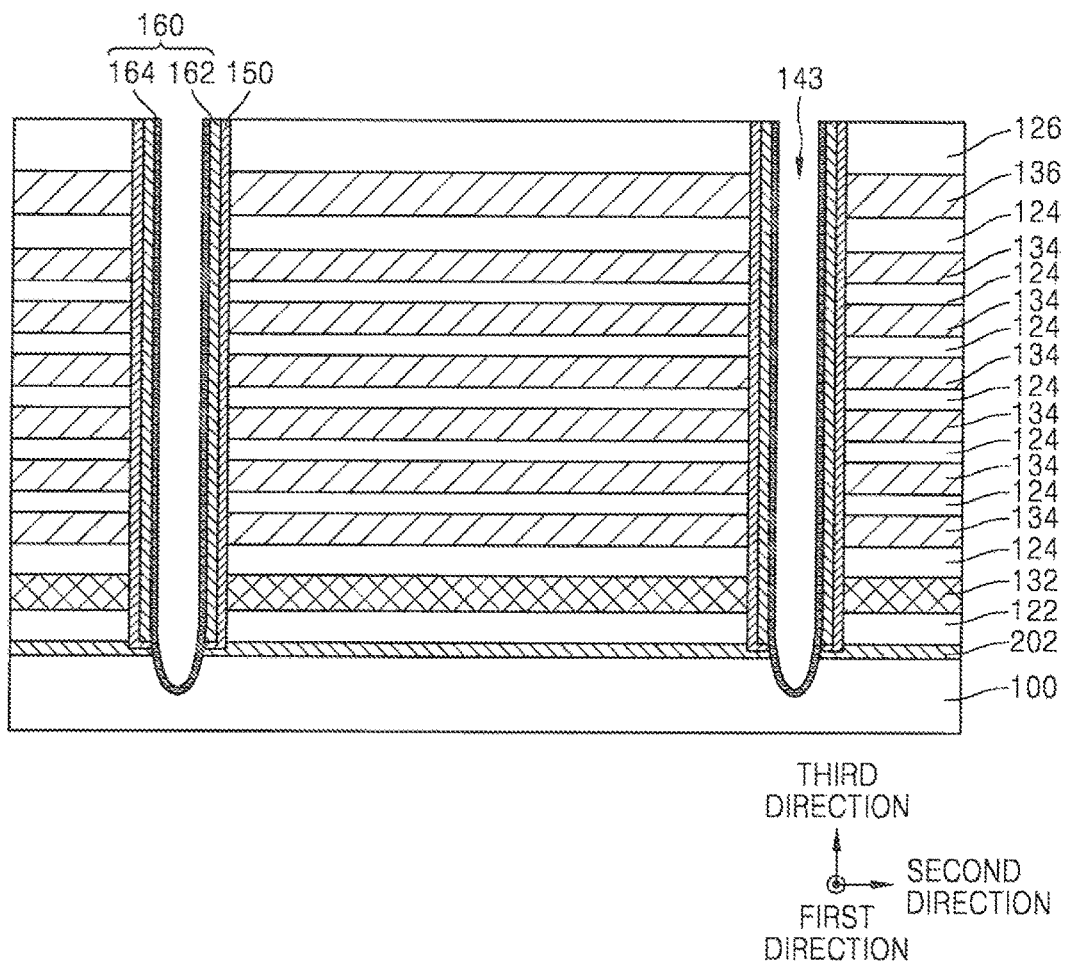

Referring to FIG. 4C, a gate insulating layer 150 and a channel layer 162 may be formed on a side wall of the first opening 141 using a process similar to the process described with reference to FIG. 3C to FIG. 3E. Thereafter, a second opening 143 may be formed to extend downwards below the first opening 141 (see FIG. 4B) and to expose an upper portion of the substrate 100, and then a channel contact layer 164 may be formed on a side wall and bottom portion of the second opening 143. A laminated structure of the channel layer 162 and the channel contact layer 164 may be defined as a channel structure 160.

Figure 4D:
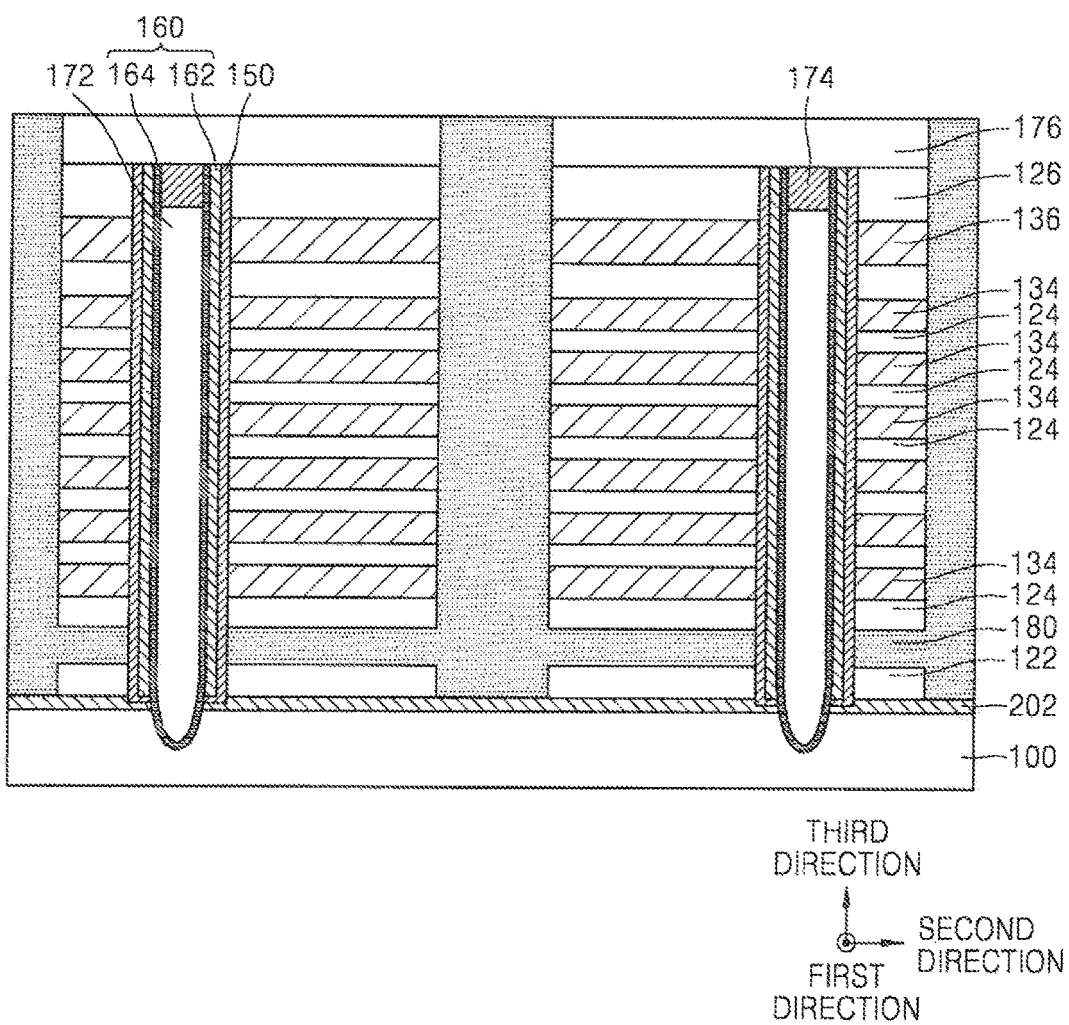

Referring to FIG. 4D, a buried insulating layer 172 and a first conductive layer 174 may be formed within the second opening 143 (see FIG. 4C) by performing processes similar to the processes described with reference to FIG. 3F to FIG. 3I, and a third opening 177 exposing the top surface of the etch stop layer 202 may be formed by anisotropically etching the first, second, third, and fourth insulating layers 122, 124, 126, and 176 and the first to third sacrificial layers 132, 134, 136 (see FIG. 4C) between the adjacent channel structures 160. Thereafter, the first sacrificial layer 132 may be removed, and a fourth opening 179 may be formed in a space between the first insulating layer 122 and the second insulating layer 124.

A second conductive layer 180 filling the third opening 177 and the fourth opening 179 may be formed. The second conductive layer 180 may completely fill a space between the gate insulating layer 150, exposed by the fourth opening 179, the first insulating layer 122, and lowermost second insulating layer 124, and may be formed on the top surface of the etch stop layer 202, which may be exposed by the third opening 177, and side walls of the first, second, third, and fourth insulating layers 122, 124, 126, and 176.

FIG. 4D illustrates that the etch stop layer 202 remains on the substrate 100 when forming the third opening 177, but the exposed etch stop layer 202 may be additionally removed during the anisotropy etching process for forming the third opening 177 and the top surface of the substrate 100 may be exposed.

Figure 4E:
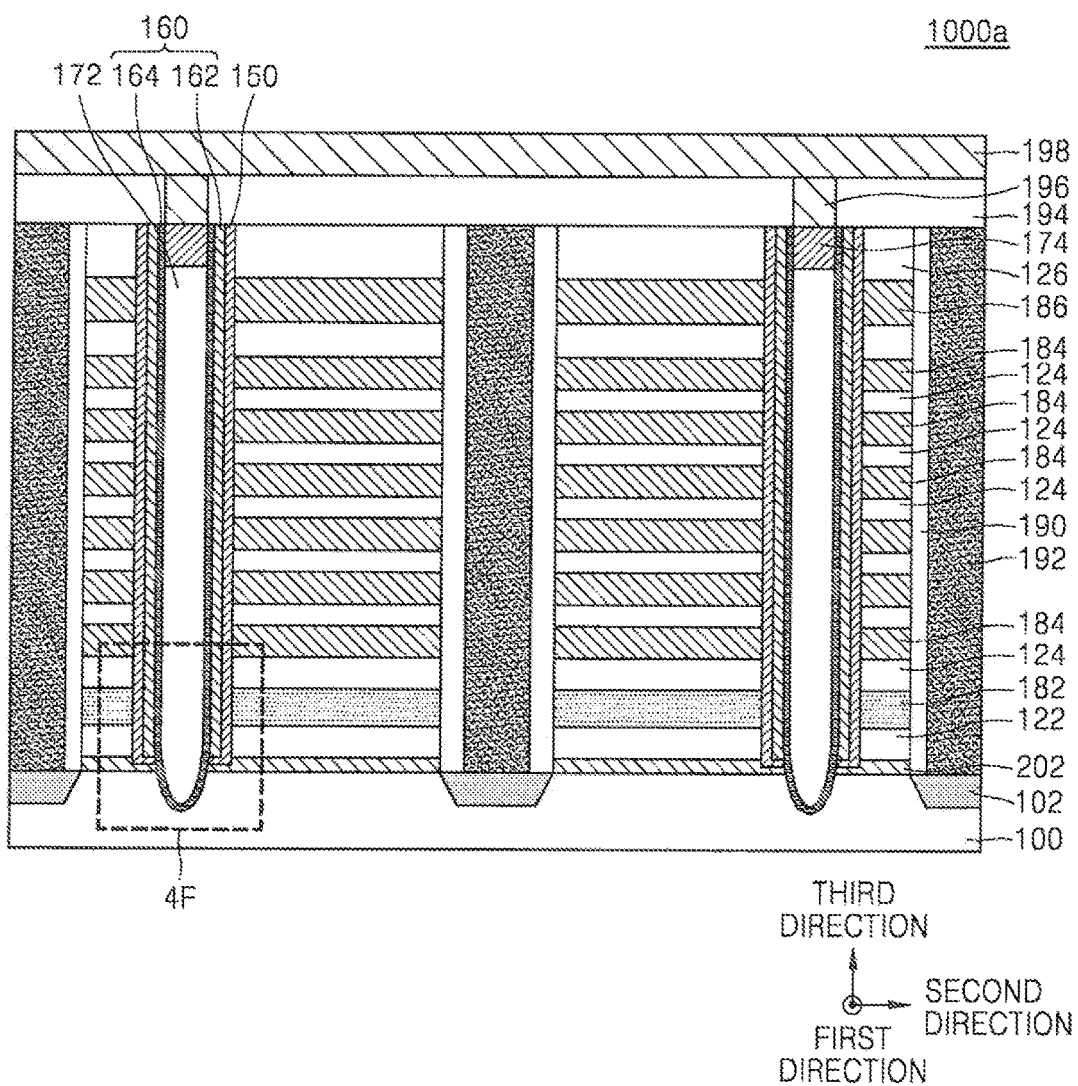
Figure 4F:
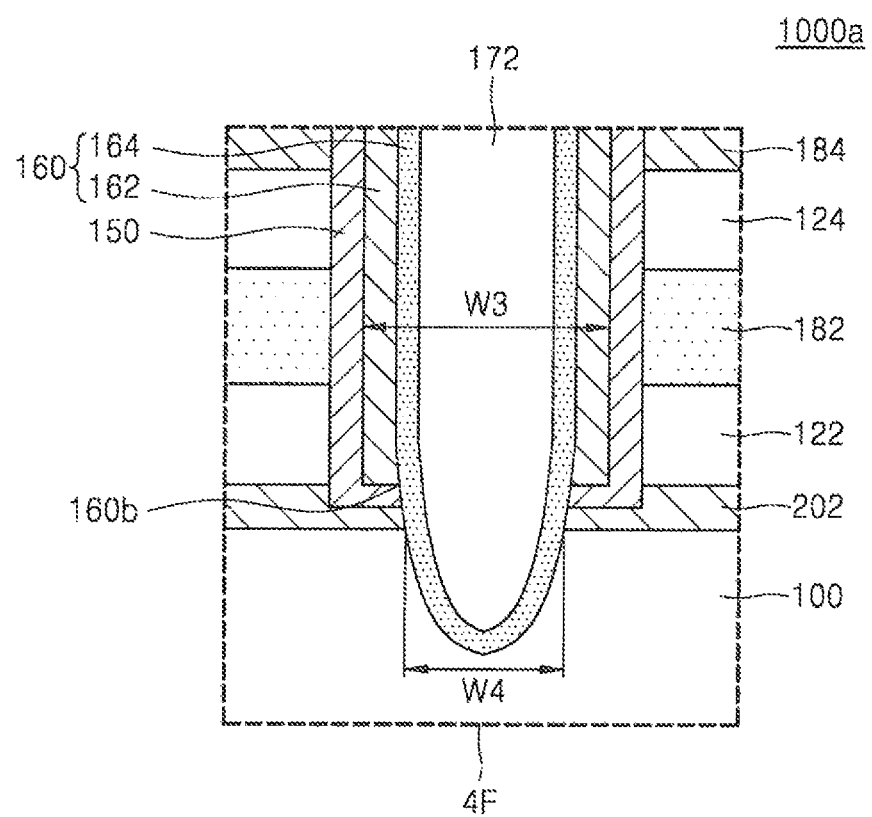

Referring to FIG. 4E and FIG. 4F, an anisotropy etching process may be performed using the exposed top surface of the fourth insulating layer 176 as an etching mask through a process similar to the processes described with reference to FIGS. 3J-3M, thereby forming the fifth opening 181 exposing the top surface of the etch stop layer 202.

Thereafter, an anisotropy etching process for removing the portion of the etch stop layer 202 which may be exposed by the fifth opening 181 may be additionally performed to expose the top surface of the substrate 100, and impurities may be injected into the upper portion of the substrate 100 which may be exposed, thereby forming an impurity region 102 in the upper portion of the substrate 100. Thereafter, a silicidation process may be performed on the second and third sacrificial layers 134 and 136 exposed by the fifth opening 181 to change the plurality of second sacrificial layers 134 to a plurality of second gate electrodes 184 and to change the third sacrificial layer 136 to a third gate electrode 186.

The fifth insulating layer 126 and a common source line 192 may be formed on a side wall of the fifth opening 181, and a bit line contact 196 and a bit line 198 may be formed on the channel structure 160 and the first conductive layer 174. Thus the formation of a semiconductor device 1000a may be completed.

According to the method of manufacturing the semiconductor device 1000a, the channel structure 160 may be formed by a sequential etching process using the etch stop layer 202, and thus etching precision may be improved, thereby improving reliability of the semiconductor device 1000a.

The channel structure 160 of the semiconductor device 1000a illustrated in FIG. 4E and FIG. 4F is briefly described. FIG. 4F is an enlarged cross-sectional view of a portion 4F of FIG. 4E.

Referring to FIGS. 4E and 4F, the etch stop layer 202 may be formed between the substrate 100 and the first insulating layer 122, and the etch stop layer 202 may be formed to cover an outer wall of the channel contact layer 164. The channel structure 160 may include a stepped portion 160b that has a step height in the first direction or the second direction in a side wall portion of the channel structure 160. A bottom portion of the channel layer 162 may form the stepped portion 160b of the channel structure 160. In addition, the etch stop layer 202 and the stepped portion 160b of the channel structure 160 may overlap each other in a horizontal direction.

The stepped portion 160b may be formed in the side wall portion of the channel structure 160 between the first gate electrode 182 and the top surface of the substrate 100. The channel structure 160 may have a first width W3 in the second direction in a side wall portion of the channel structure 160 that is located at a higher level than the stepped portion 160b, and the channel structure 160 may have a second width W4 smaller than the first width in the second direction in a side wall portion of the channel structure 160 that is located at a lower level than the stepped portion 160b.

FIG. 5A to FIG. 5H are cross-sectional views illustrating a method of manufacturing a semiconductor device 1000b according to other example embodiments of the inventive concept. The manufacturing method may be similar to the manufacturing method described with reference to FIG. 3A to FIG. 3M except, for example, a structure of a channel structure 220 (see FIG. 5E), and thus a description will be made with an emphasis on the differences therebetween.

Figure 5A:
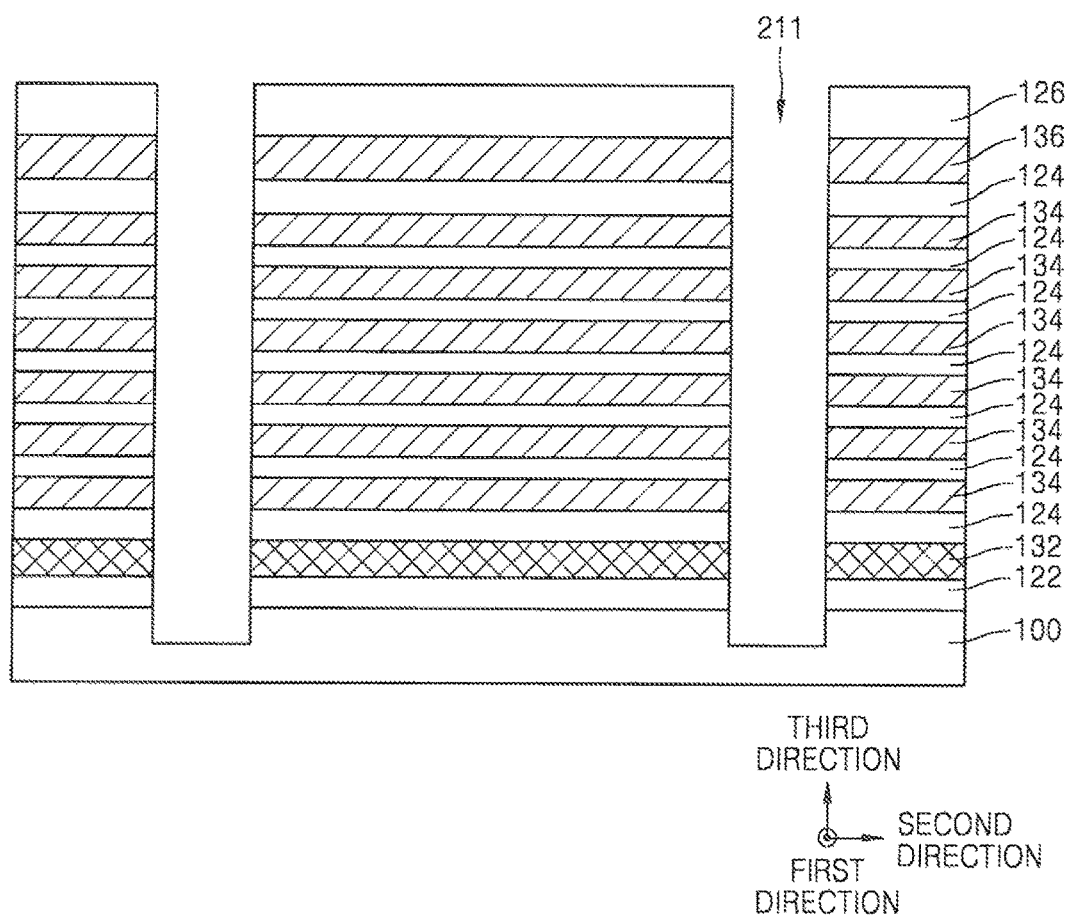
FIGS. 5A-5H are cross-sectional views schematically illustrating a method of manufacturing a semiconductor device according to some embodiments of the inventive concept.

Referring to FIG. 5A, a first insulating layer 122 and a first sacrificial layer 132 may be formed on a substrate 100, a plurality of second insulating layers 124 and a plurality of second sacrificial layers 134 may be alternately formed on the first sacrificial layer 132, and a third sacrificial layer 136 and a third insulating layer 126 may be sequentially formed on the uppermost second insulating layer 124.

Thereafter, a first opening 211 may be formed to expose a top surface of the substrate 100 by passing through a laminated structure of the first, second, and third insulating layers 122, 124, and 126 and the first, second, and third sacrificial layers 132, 134, and 136. An upper portion of the substrate 100 may be recessed when forming the first opening 211 so that a bottom portion of the first opening 211 may be formed within the substrate 100.

Figure 5B:
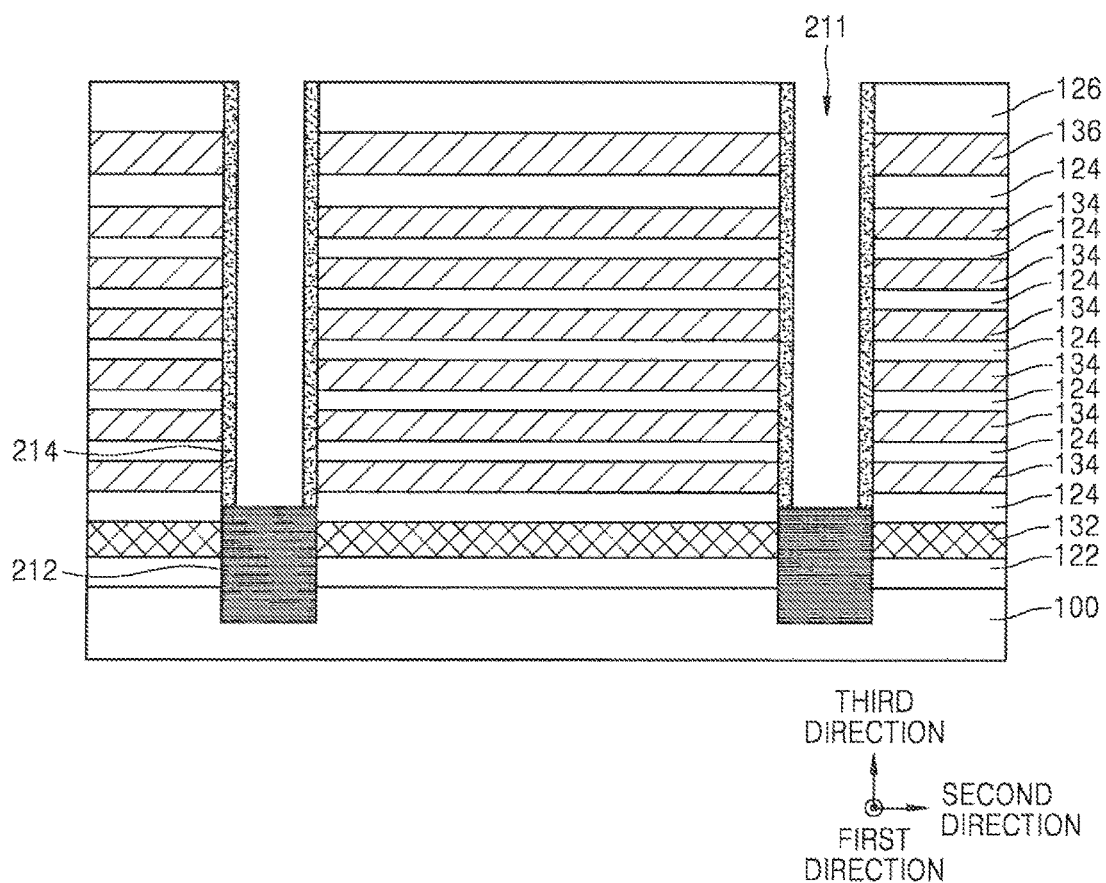

Referring to FIG. 5B, an insulating material filling the first opening 211 may be formed, and then a planarization process and/or an etch-back process may be formed on an upper portion of the insulating material to cause the insulating material to remain to a predetermined height from the bottom portion of the first opening 211, thereby forming a first protection layer 212 within the first opening 211.

The first protection layer 212 may include an insulating material such as a spin-on hardmask (SOH) material. A top surface of the first protection layer 212 may be formed at a level that is higher than the top surface of the substrate 100 and lower than a bottom surface of the lowermost second sacrificial layer 134.

Thereafter, a second protection layer 214 may be formed on a side wall of the first opening 211. The second protection layer 214 may be formed to completely cover side walls of the plurality of second sacrificial layers 134.

In an exemplary process for forming the second protection layer 214, an insulating material covering an inner wall of the first opening 211 may be formed on the third insulating layer 126 to have a predetermined thickness, and an etching process may be performed on the insulating material so that the insulating material remains only on the side wall of the first opening 211, thereby forming the second protection layer 214. The second protection layer 214 may include silicon oxide, silicon nitride, or silicon oxynitride.

Figure 5C:
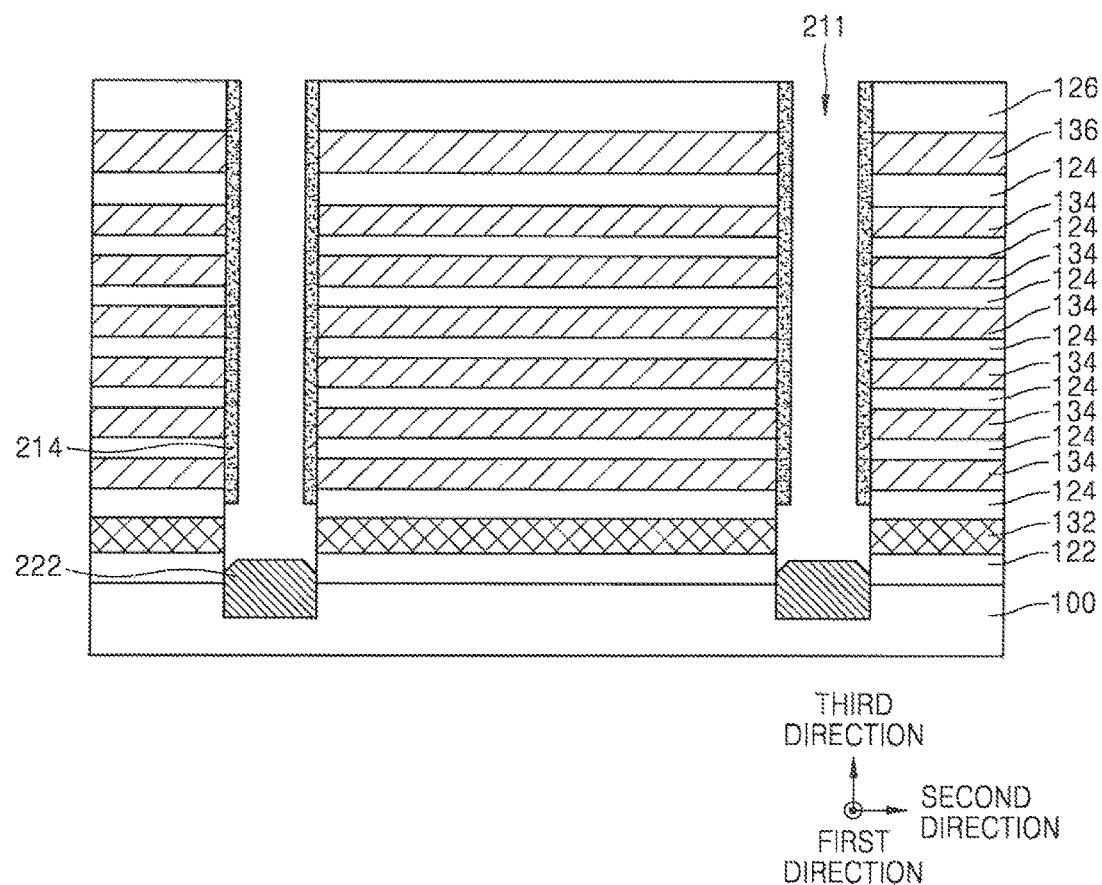

Referring to FIG. 5C, the first protection layer 212 (see FIG. 5B) which may be located in the bottom portion of the first opening 211 may be removed, and thus the top surface of the substrate 100 may be exposed again. The second protection layer 214 on the side wall of the first opening 211 may not be removed and may remain. Thus, the second protection layer 214 may cover the side walls of the second sacrificial layers 134 and a sidewall of third sacrificial layer 136 which may be exposed on the side wall of the first opening 211. In addition, since the top surface of the first protection layer 212 may be formed at a higher level than a top surface of the first sacrificial layer 132, a side wall of the first sacrificial layer 132 may be exposed again by the first opening 211 through the removal of the first protection layer 212.

Thereafter, a channel contact layer 222 may be formed in the upper portion of the substrate 100 that is exposed by the first opening 211. In an exemplary process for forming the channel contact layer 222, a selective epitaxial growth process may be performed using the exposed upper portion of the substrate 100 as a seed layer, thereby growing the channel contact layer 222 from the upper portion of the substrate 100.

The selective epitaxial growth process may be performed at a temperature of approximately 950° C. to 1100° C. using a reaction gas such as $SiH_4$ or $Si_2Cl_2$. For example, the channel contact layer 222 may be located at a higher level than the top surface of the substrate 100. In addition, a top surface of the channel contact layer 222 may be grown to be located at a lower level than a bottom surface of the first sacrificial layer 132.

The second protection layer 214 may cover the side walls of the second sacrificial layers 134, and thus even when the plurality of second sacrificial layers 134 include a conductive material such as polysilicon, undesired silicon layers may be prevented from being grown from the side walls of the plurality of second sacrificial layers 134 by the selective epitaxial growth process.

Thereafter, an ion implantation process may be performed to dope the channel contact layer 222 with impurities. The impurities may be p-type impurities such as P or As or n-type impurities such as B. Alternatively, the impurities may be in-situ doped during a process of forming the channel contact layer 222.

Figure 5D:
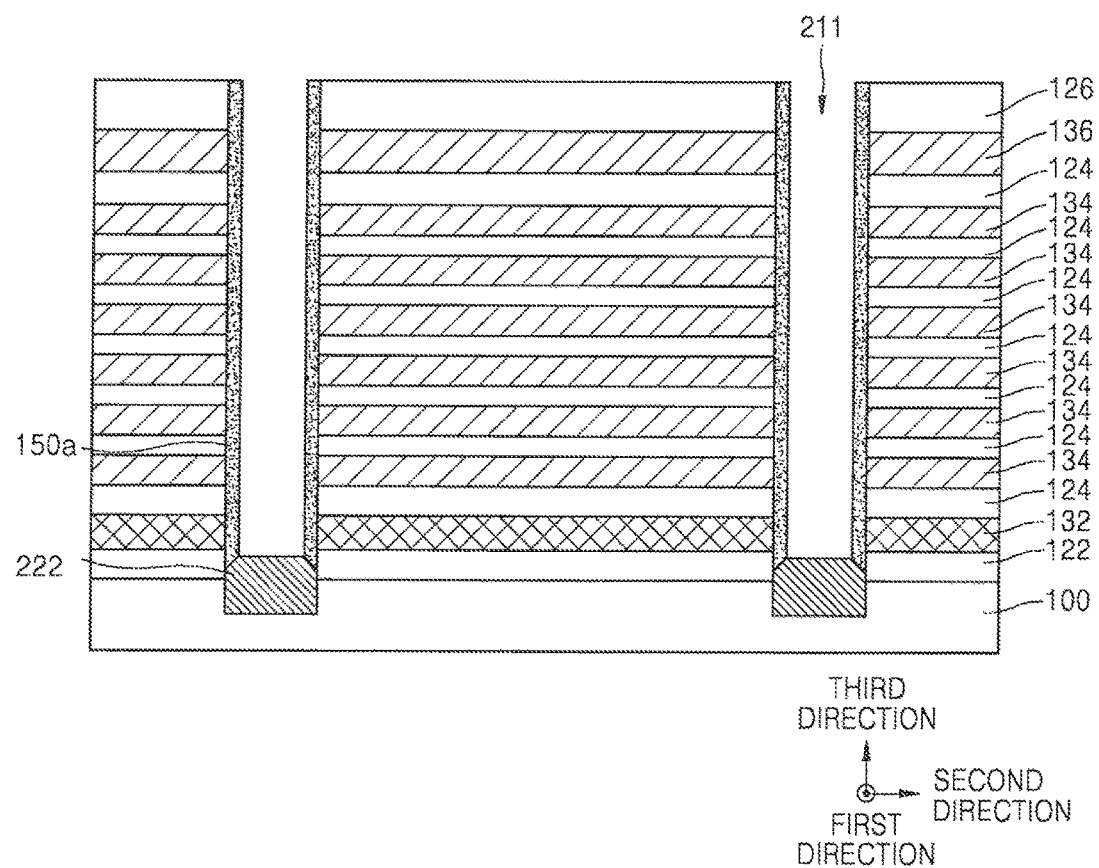

Referring to FIG. 5D, the second protection layer 214 (see FIG. 5C) may be removed, and a gate insulating layer 150a may be formed on the side wall of the first opening 211.

In an exemplary process for forming the gate insulating layer 150a, the gate insulating layer 150a may be formed on exposed surfaces of the third insulating layer 126 and the first opening 211, and then an anisotropy etching process may be performed on the gate insulating layer 150a, and thus the gate insulating layer 150a may remain only on the side wall of the first opening 211.

The gate insulating layer 150a may be formed to completely cover the side walls of the first sacrificial layer 132, the plurality of second sacrificial layers 134, and the third sacrificial layer 136. Thus, when first to third gate electrodes are formed at the positions of the first, second, and third sacrificial layers 132, 134, and 136 in the subsequent process, an electrical short circuit or leakage of current may be prevented from occurring between the first to third gate electrodes and the channel layer 224 (see FIG. 5E).

Figure 5E:
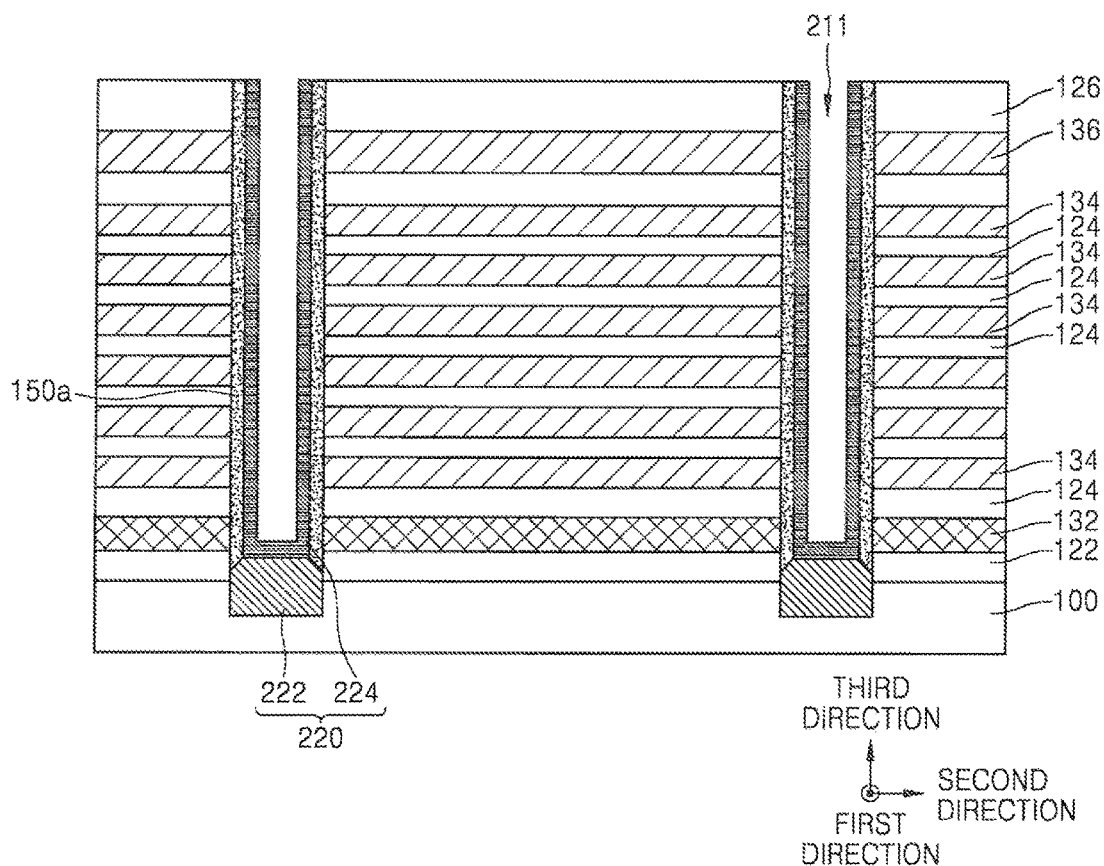

Referring to FIG. 5E, the channel layer 224 coming into contact with the channel contact layer 222 may be formed on an inner wall of the first opening 211. FIG. 5E illustrates that the channel layer 224 may be conformally formed on the inner wall of the first opening 211 and may be formed not to completely fill the first opening 211, but the channel layer 224 may be formed to completely fill the inside of the first opening 211.

In an exemplary process for forming the channel layer 224, a conductive layer may be formed to cover the inner walls of the third insulating layer 126 and the first opening 211, and an insulating layer may further be formed to bury the conductive layer within the first opening 211, and then upper portions of the insulating layer and the conductive layer may be planarized until a top surface of the third insulating layer 126 is exposed, thereby forming the channel layer 224. Thereafter, the portion of the insulating layer which fills the inside of the first opening 211 may be removed.

In another exemplary process for forming the channel layer 224, a conductive layer may be formed to cover the inner walls of the third insulating layer 126 and the first opening 211, and then an anisotropy etching process may be performed on the upper portion of the conductive layer, thereby forming the channel layer 224.

The channel layer 224 may be formed using a conductive material such as polysilicon doped with impurities. For example, the impurities may be p-type impurities such as P or As or n-type impurities such as B. The impurities may be in-situ doped in a process o forming the channel layer 224, or may be injected into the channel layer 224 using an ion implantation process after the channel layer 224 is formed.

A laminated structure of the channel contact layer 222 and the channel layer 224 may be defined as the channel structure 220. That is, the channel structure 220 may include the channel contact layer 222 coming into contact the upper portion of the substrate 100 at a bottom portion of the first opening 211, and the channel layer 224 which may be formed on the side wall of the first opening 211 and may come into contact with the channel contact layer 222 at the bottom portion of the first opening 211.

Figure 5F:
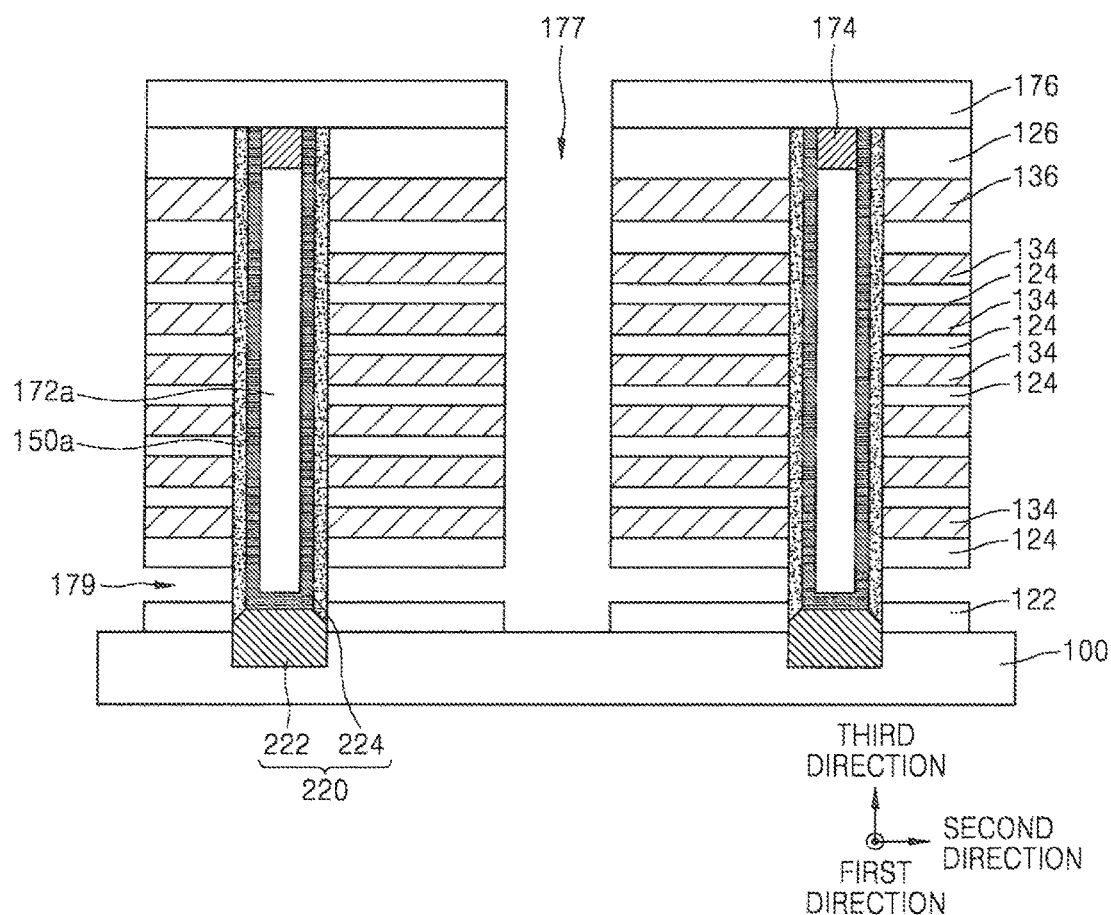

Referring to FIG. 5F, a buried insulating layer 172a and a first conductive layer 174 which fill the inside of the channel layer 224 may be formed by performing processes similar to the processes described with reference to FIG. 3F to FIG. 3H, and a fourth opening 179 may be formed in a space in which a third opening 177, exposing the top surface of the substrate 100, and the first sacrificial layer 132 are removed.

If the channel layer 224 is formed to completely fill the inside of the first opening 211 (see FIG. 5E), the buried insulating layer 172a and the first conductive layer 174 may not be formed.

Figure 5G:
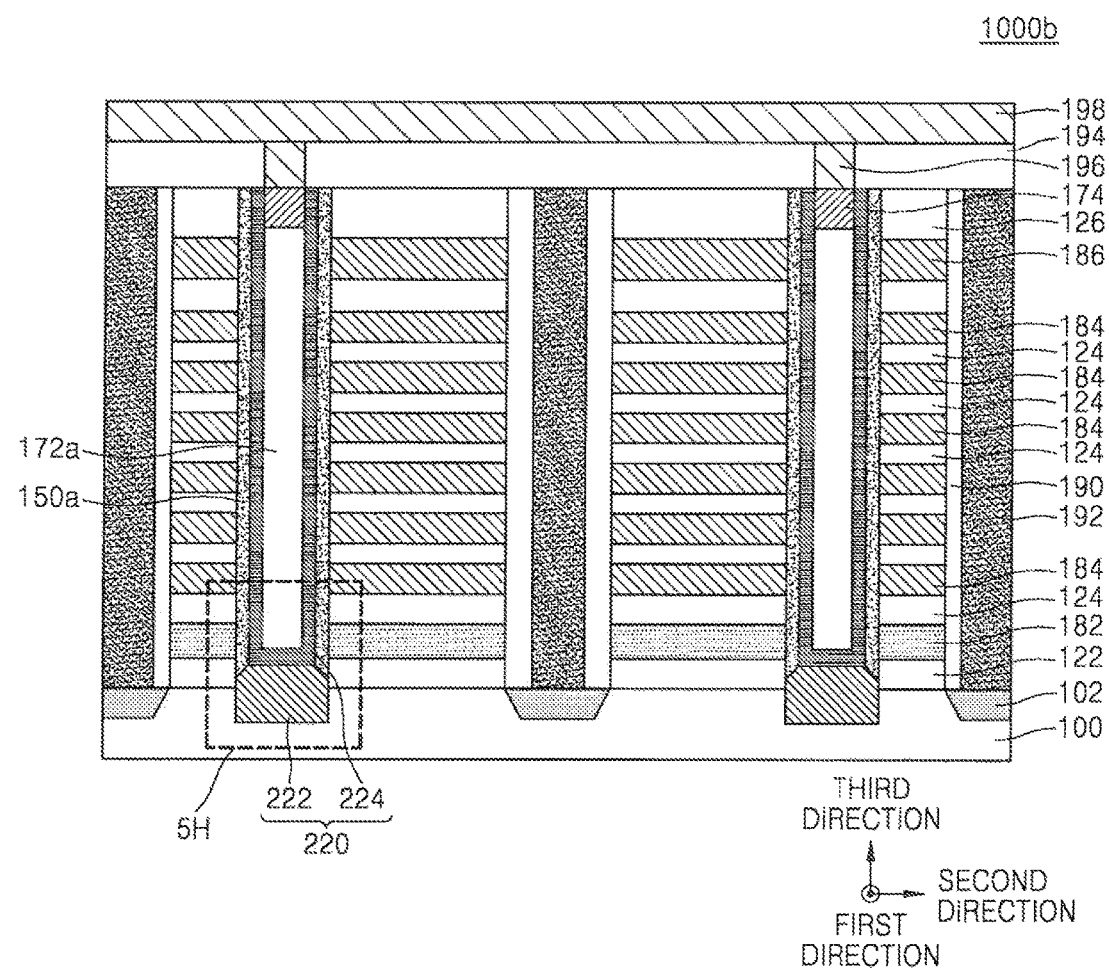
Figure 5H:
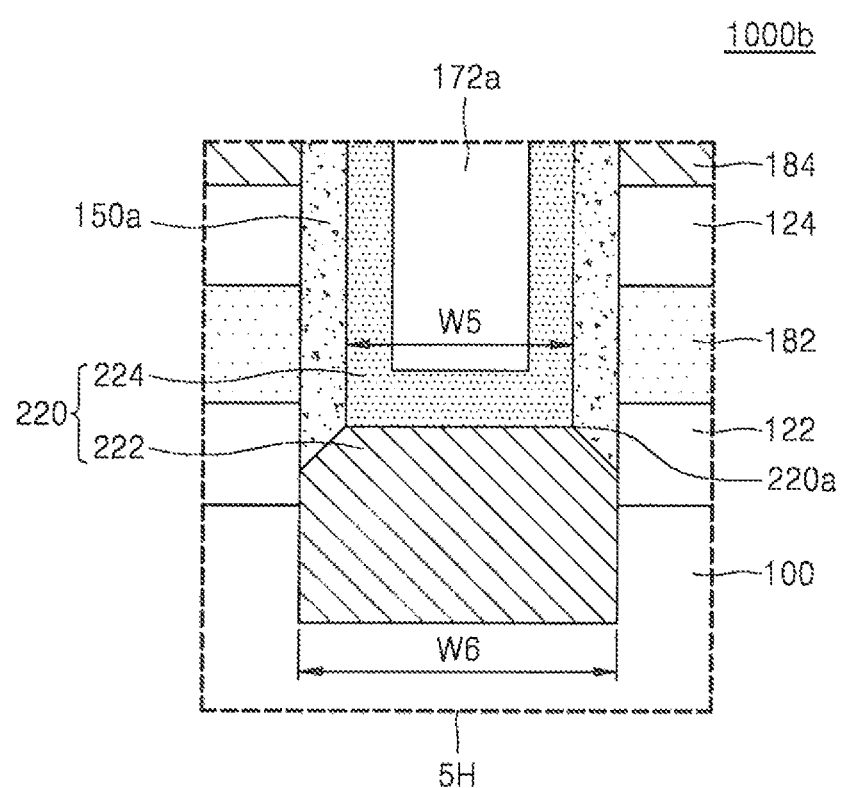

Referring to FIG. 5G and FIG. 5H, processes similar to the processes described with reference to FIG. 3I to FIG. 3M may be performed to form a semiconductor device 1000b. FIG. 5H is an enlarged cross-sectional view of a portion 5H of FIG. 5G.

According methods of manufacturing the semiconductor device 1000b, the second protection layer 214 may be formed on the inner wall of the first opening 211, and then a selective epitaxial growth process for forming the channel contact layer 222 may be performed on the upper portion of the substrate 100. Thus, the side walls of the second sacrificial layers 134 may be prevented from being oxidized during a high-temperature epitaxial growth process, or undesired conductive layers may be prevented from being grown from the side walls of the sacrificial layers 134.

The semiconductor device 1000b manufactured using the described method is briefly described with reference to FIG. 5G and FIG. 5H. Referring to FIG. 5G and FIG. 5H, the semiconductor device 1000b may include the channel structure 220 extending in the third direction on the substrate 100. The channel structure 220 may include the channel contact layer 222 coming into contact with the upper portion of the substrate 100, and the channel layer 224 which comes into contact with the upper portion of the channel contact layer 222 and extends in the third direction in a cylindrical shape.

The channel structure 220 may include a stepped portion 220a having a step height in the first direction or the second direction in a side wall portion of the channel structure 220. An upper portion of the channel structure 220 may form the stepped portion 220a of the channel structure 220. The stepped portion 220a may be formed in the side wall portion of the channel structure 220 between the first gate electrode 182 and the top surface of the substrate 100. The channel structure 220 may have a first width W5 in the second direction in a side wall portion of the channel structure 220 that is located at a higher level than the stepped portion 220a, and the channel structure 220 may have a second width W6, larger than the first width, in the second direction in a side wall portion of the channel structure 220 that is located at a lower level than the stepped portion 220a.

The gate insulating layer 150a may be formed on an outer wall of the channel structure 220. The gate insulating layer 150a may be formed to have a cylindrical shape surrounding the channel layer 224.

The first gate electrode 182, the plurality of second gate electrodes 184, and the third gate electrode 186 may be disposed in the third direction along a side wall of the gate insulating layer 150a from the top surface of the substrate 100 to be separated from each other. The first gate electrode 182 maybe formed to include a material that is different from the material of the plurality of second gate electrodes 184 and/or the third gate electrode 186. For example, the plurality of second gate electrodes 184 may include a metal silicide material, and the first gate electrode 182 may include a metal, metal nitride, or metal silicide material.

The semiconductor device 1000b may include the channel structure 220 which may be the laminated structure of the channel contact layer 222 and the channel layer 224, and thus the semiconductor device 1000b may have an excellent electrical characteristic.

FIG. 6A to FIG. 6H are cross-sectional views illustrating a method of manufacturing a semiconductor device 1000c according to some embodiments of the inventive concept. The manufacturing method may be similar to the manufacturing method described with reference to FIG. 5A to FIG. 5H except, for example, a structure of a channel structure 230 (see FIG. 6C), and thus a description will be made with an emphasis on the differences therebetween.

Figure 6A:
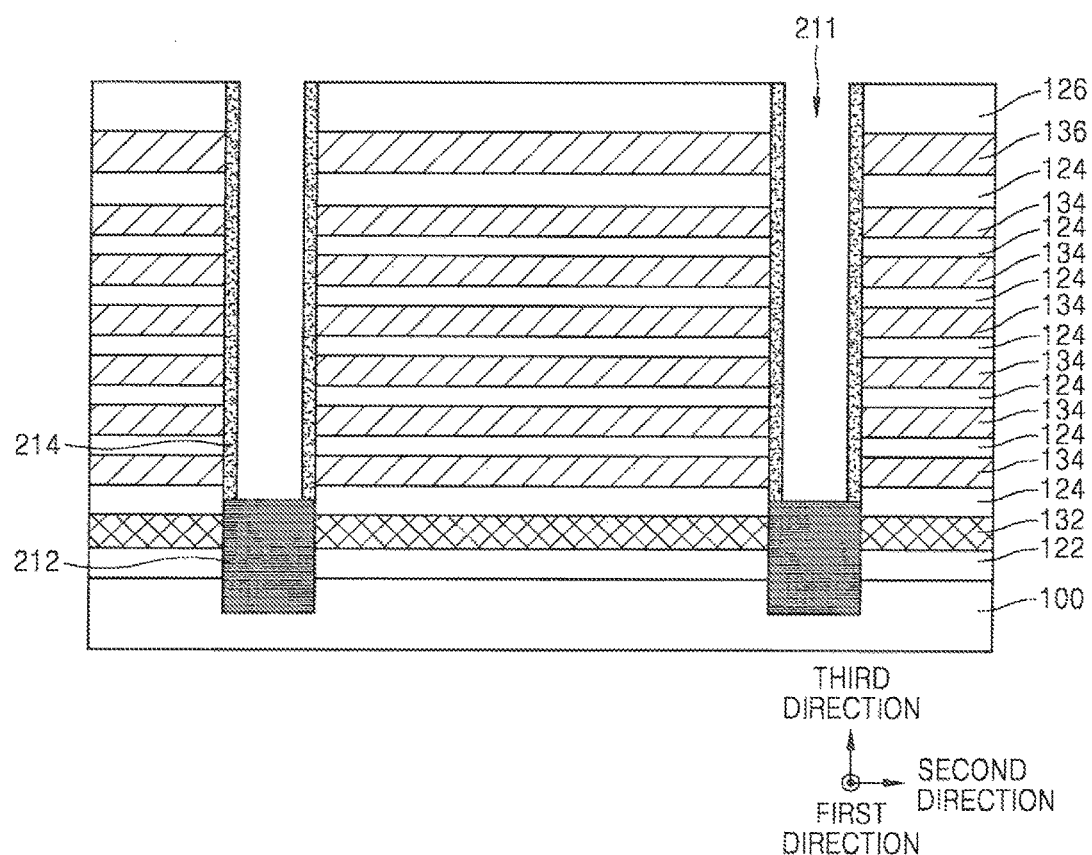
FIGS. 6A-6H are cross-sectional views schematically illustrating a method of manufacturing a semiconductor device according to some embodiments of the inventive concept.

Referring to FIG. 6A, processes similar to the processes described with reference to FIG. 5A and FIG. 5B may be performed to form a first protection layer 212 in a bottom portion of a first opening 211 and to form a second protection layer 214 on a side wall of the first opening 211.

A top surface of the first protection layer 212 may be located at a higher level than a top surface of the first sacrificial layer 132 and may be located at a lower level than a bottom surface of a lowermost second sacrificial layer 134. A bottom surface of the second protection layer 214 may be formed to come into contact with the top surface of the first protection layer 212, and thus the bottom surface of the second protection layer 214 may be located at a higher level than the top surface of the first sacrificial layer 132 and may be located at a lower level than the bottom surface of a lowermost second sacrificial layer 134. Accordingly, the second protection layer 214 may cover the plurality of second sacrificial layers 134 and a third sacrificial layer 136 that are exposed by the first opening 211.

Figure 6B:
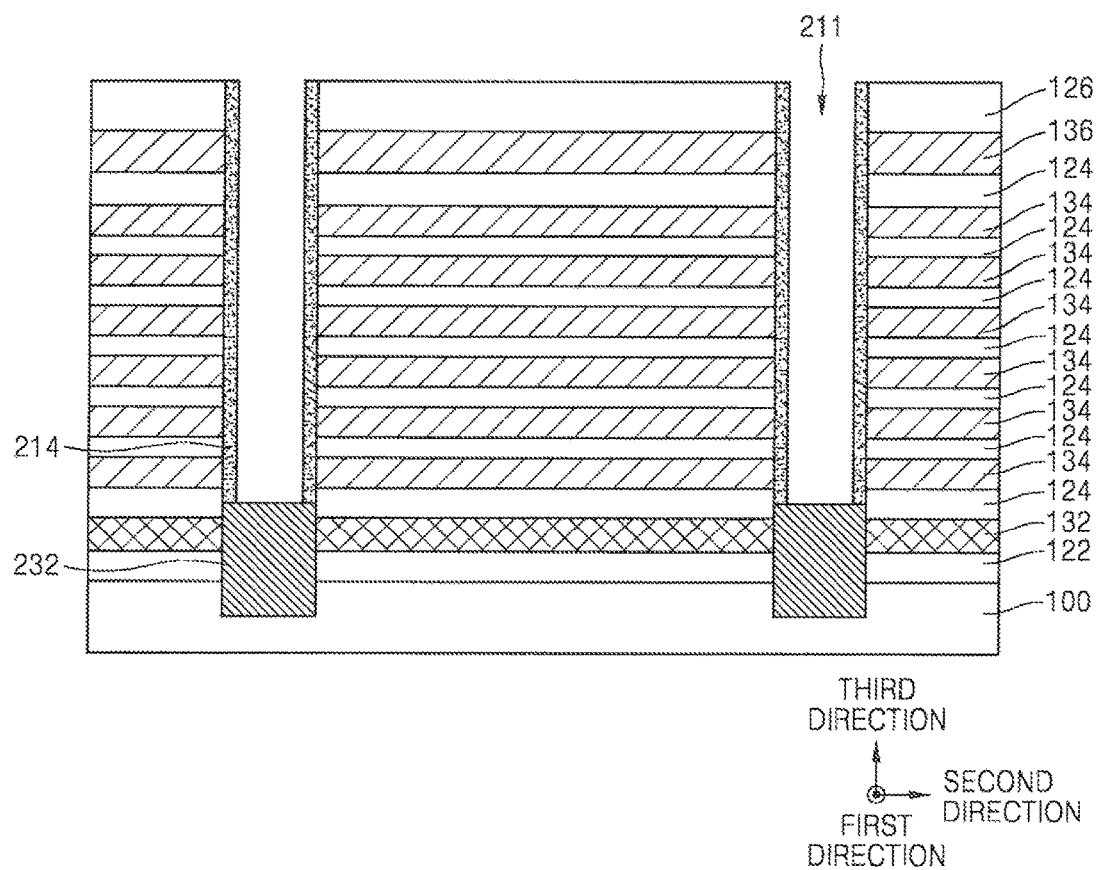

Referring to FIG. 6B, the first protection layer 212 may be removed. The second protection layer 214 formed on the side wall of the first opening 211 may remain, and thus a portion of the substrate 100 and side walls of the first insulating layer 122, the first sacrificial layer 132, and the lowermost second insulating layer 124 may be exposed below the first opening 211.

Thereafter, a selective epitaxial growth process may be performed using the portion of the substrate 100 that is exposed by the first opening 211 as a seed layer, and thus a channel contact layer 232 filling a lower portion of the first opening 211 may be formed.

The channel contact layer 232 may be grown until the channel contact layer 232 comes into contact with the bottom surface of the second protection layer 214. A top surface of the channel contact layer 232 may be formed at a higher level than the top surface of the first sacrificial layer 132 and may be formed at a lower level than the bottom surface of the lowermost second sacrificial layer 134. Thus, a side wall of the channel contact layer 232 may come into contact with the side wall of the first sacrificial layer 132.

Figure 6C:
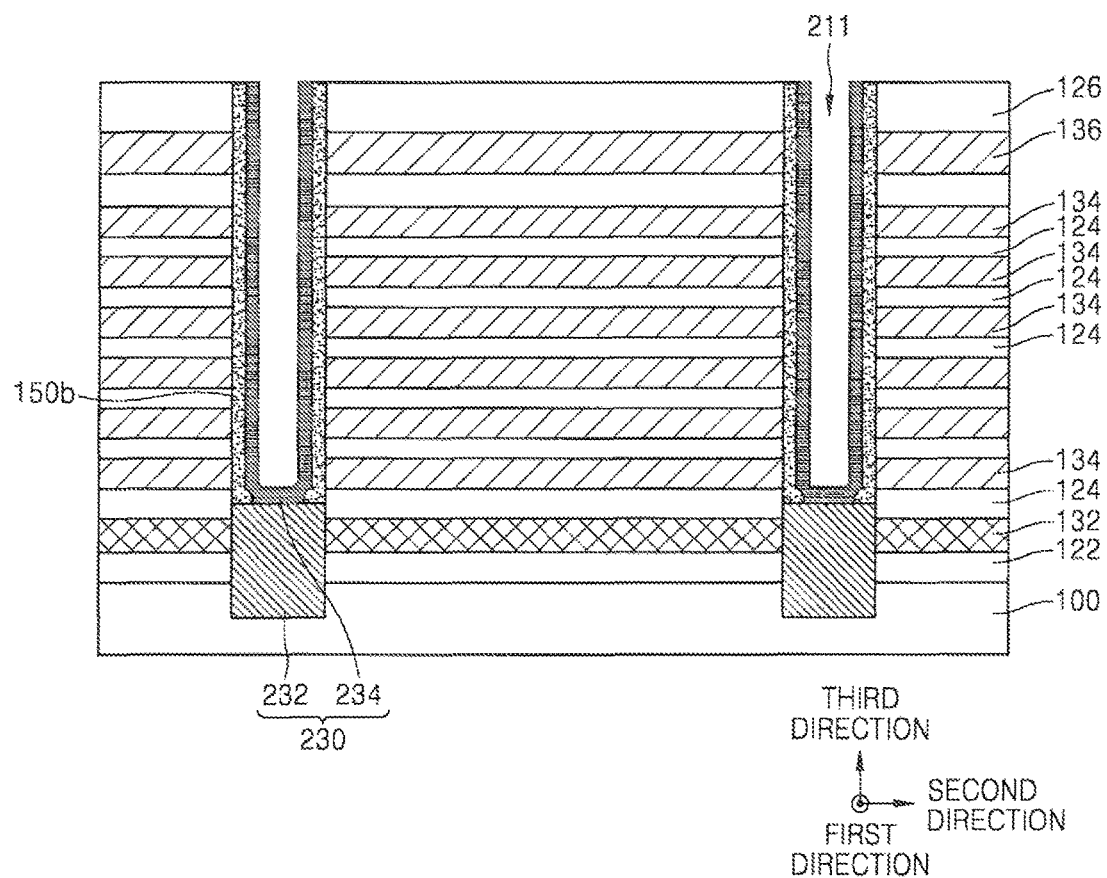

Referring to FIG. 6C, the second protection layer 214 (see FIG. 6B) may be removed. Thus, side walls of the plurality of second sacrificial layers 134, the plurality of second insulating layers 124, the third sacrificial layer 136, and the third insulating layer 126 may be exposed again.

Thereafter, a first gate insulating layer 150b may be formed on the side wall of the first opening 211.

In an exemplary process, the first gate insulating layer 150b covering inner walls of the third insulating layer 126 and the first opening 211 may be formed, and then an anisotropy etching process may be performed on an upper portion of the first gate insulating layer 150b, thereby causing the first gate insulating layer 150b to remain on the side wall of the first opening 211. A portion of the first gate insulating layer 150b which covers the top surface of the channel contact layer 232 may be removed and a portion of the top surface of the channel contact layer 232 may be exposed so that the channel layer 234 to be formed in a subsequent process may be electrically connected to the channel contact layer 232.

Thereafter, the channel layer 234 may be formed on the first gate insulating layer 150b within the first opening 211. A bottom surface of the channel layer 234 may be formed to come into contact with the top surface of the channel contact layer 232. A laminated structure of the channel layer 234 and the channel contact layer 232 may be defined as the channel structure 230.

Figure 6D:
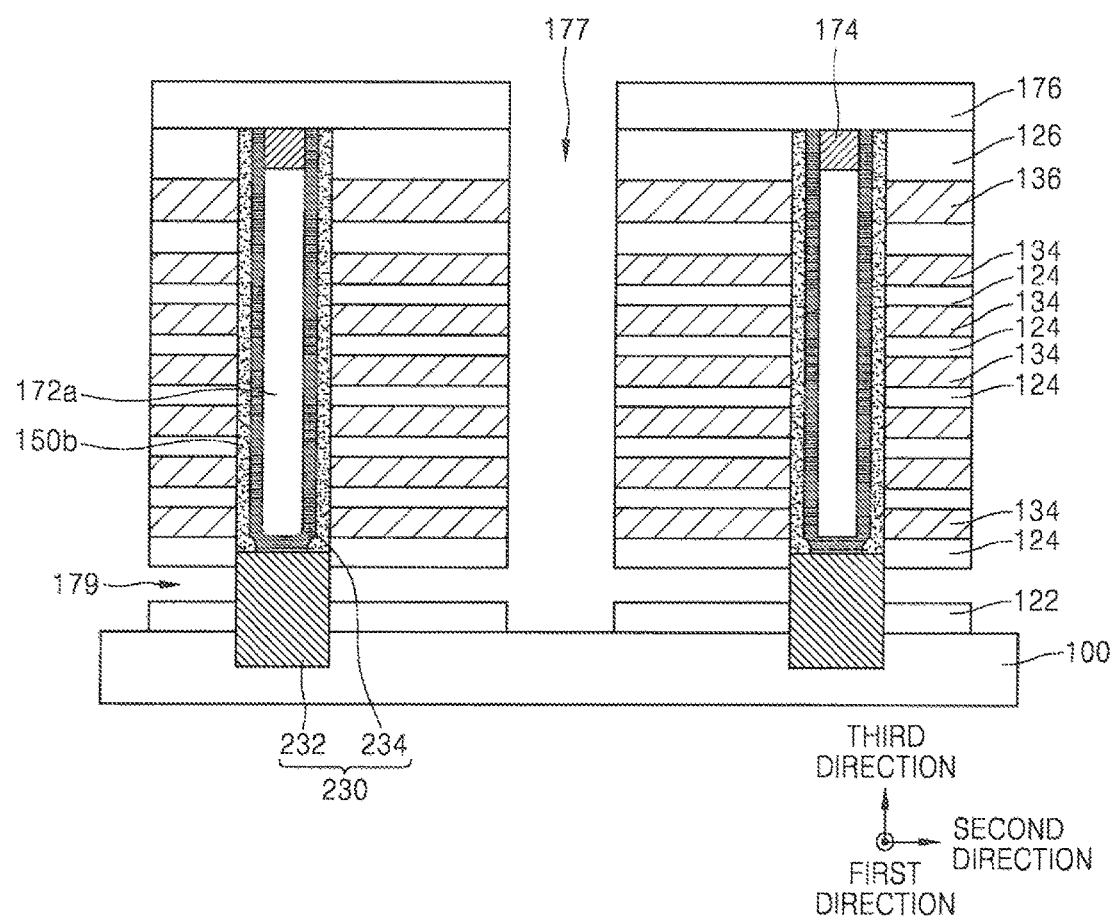

Referring to FIG. 6D, a buried insulating layer 172a and a first conductive layer 174 which fill the inside of the channel layer 234 may be formed, and a fourth insulating layer 176 may be formed on the buried insulating layer 172a, the first conductive layer 174, and the third insulating layer 126.

Thereafter, a second opening 177 exposing an upper portion of the substrate 100 between the adjacent channel structures 230 may be formed, and a portion of the first sacrificial layer 132 that is exposed by the second opening 177 may be removed, thereby forming a third opening 179 in a space between the first insulating layer 122 and the lowermost second insulating layer 124. The side wall of the channel contact layer 232 may be exposed by the formation of the third opening 179.

Alternatively, a thermal oxidation process may be performed, and thus a thermal oxide layer may be formed on a side wall of the channel contact layer 232 that is exposed by the third opening 179.

Figure 6E:
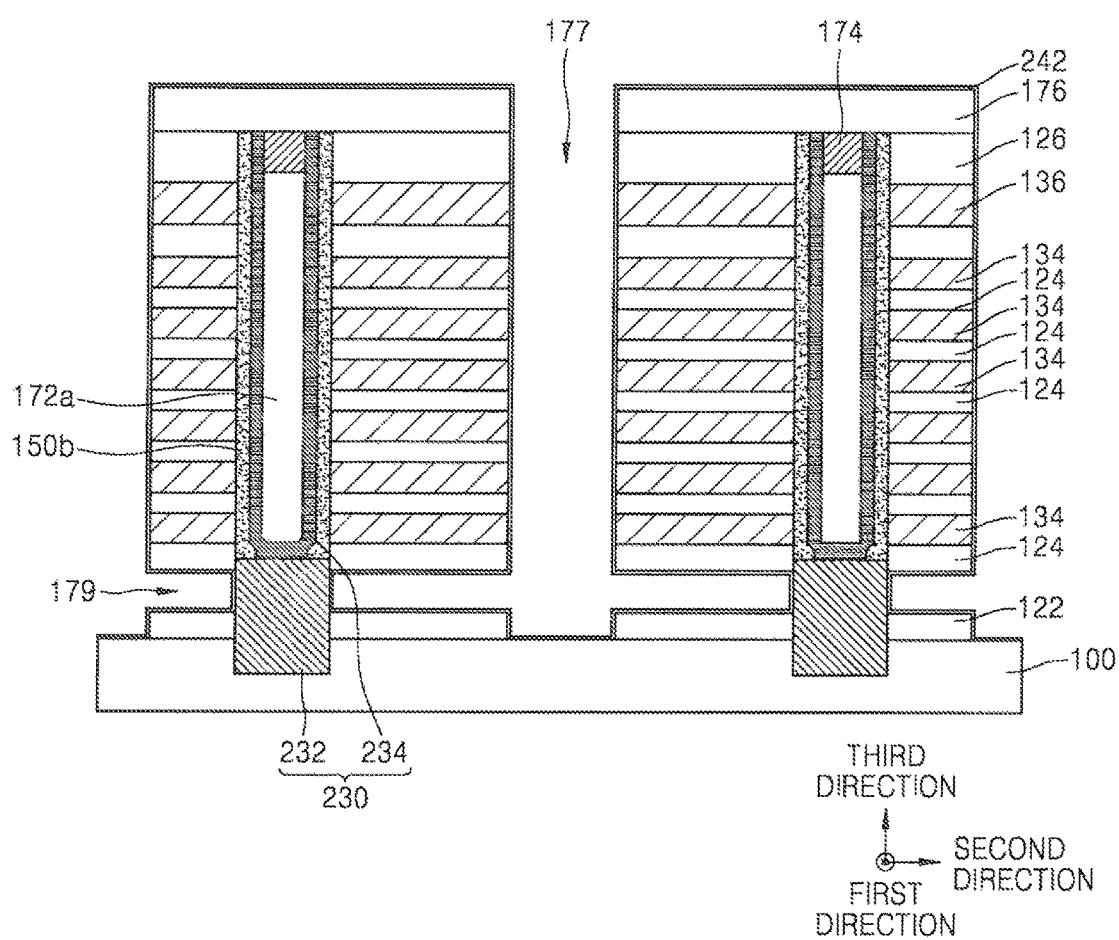

Referring to FIG. 6E, a preliminary second gate insulating layer 242 may be formed on the top surface of the substrate 100 and the side walls of the first, second, third, and fourth insulating layers 122, 124, 126, and 176, the second and third sacrificial layers 134 and 136, and the channel contact layer 232 that are exposed by the second opening 177 and third opening 179. The preliminary second gate insulating layer 242 may be formed using the same material and/or structure as that of the first gate insulating layer 150*b*, but may be formed using a different material and/or structure from that of the first gate insulating layer 150*b*.

Figure 6F:
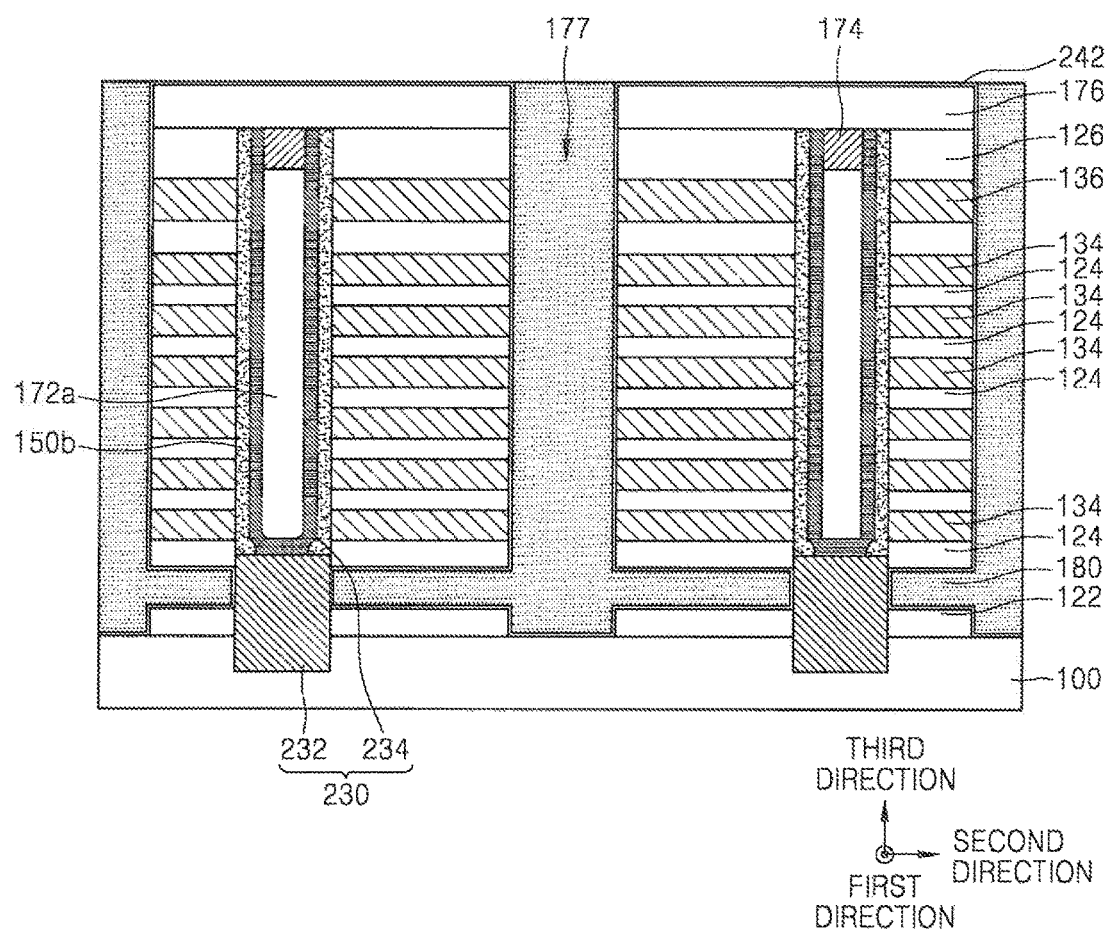

Referring to FIG. 6F, a second conductive layer 180 filling the second opening 177 and third opening 179 may be formed on the preliminary second gate insulating layer 242.

The second conductive layer 180 may be formed using a metal or metal nitride such as tungsten, copper, aluminum, titanium, tantalum, cobalt, ruthenium, titanium nitride, or tantalum nitride, or may be formed using a conductive material such as polysilicon doped with impurities.

Figure 6G:
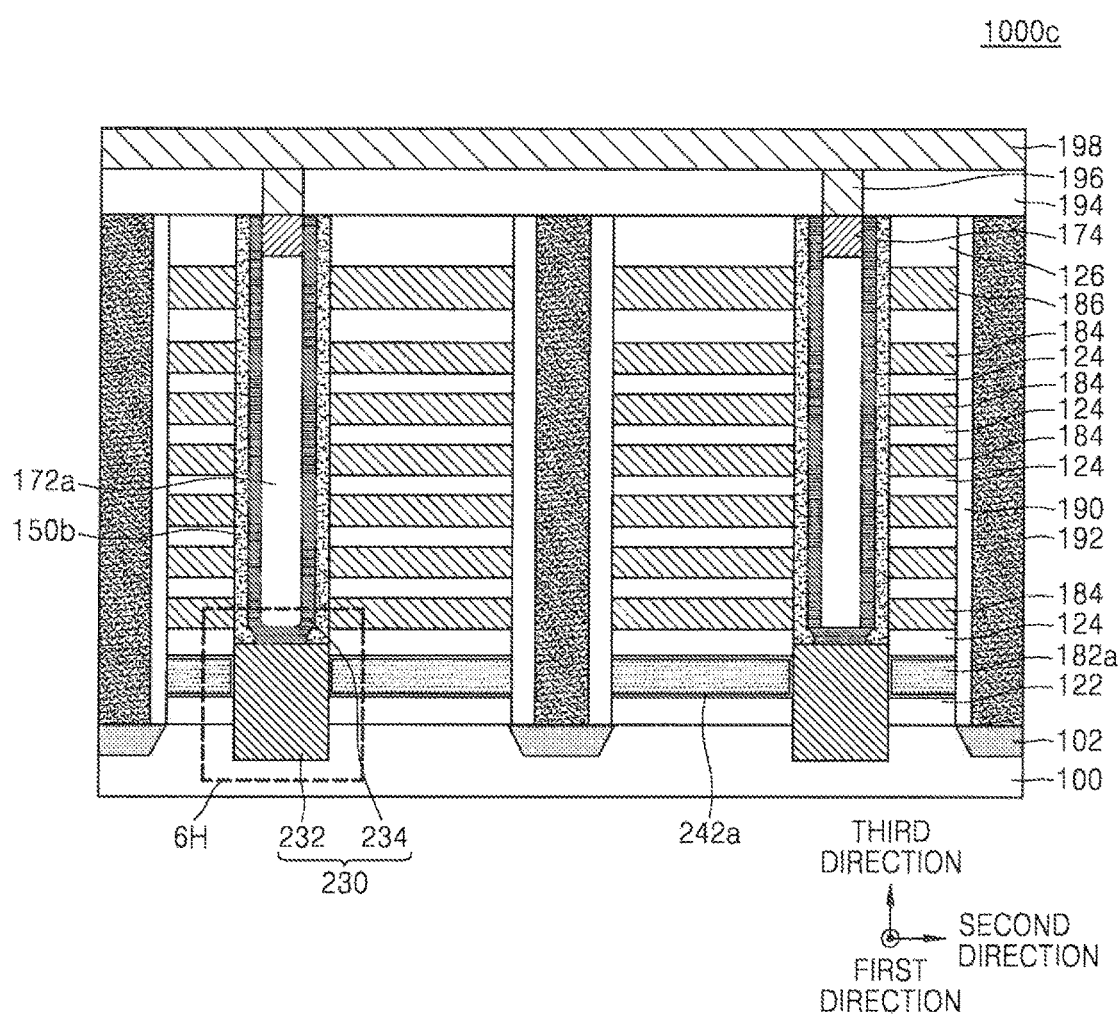
Figure 6H:
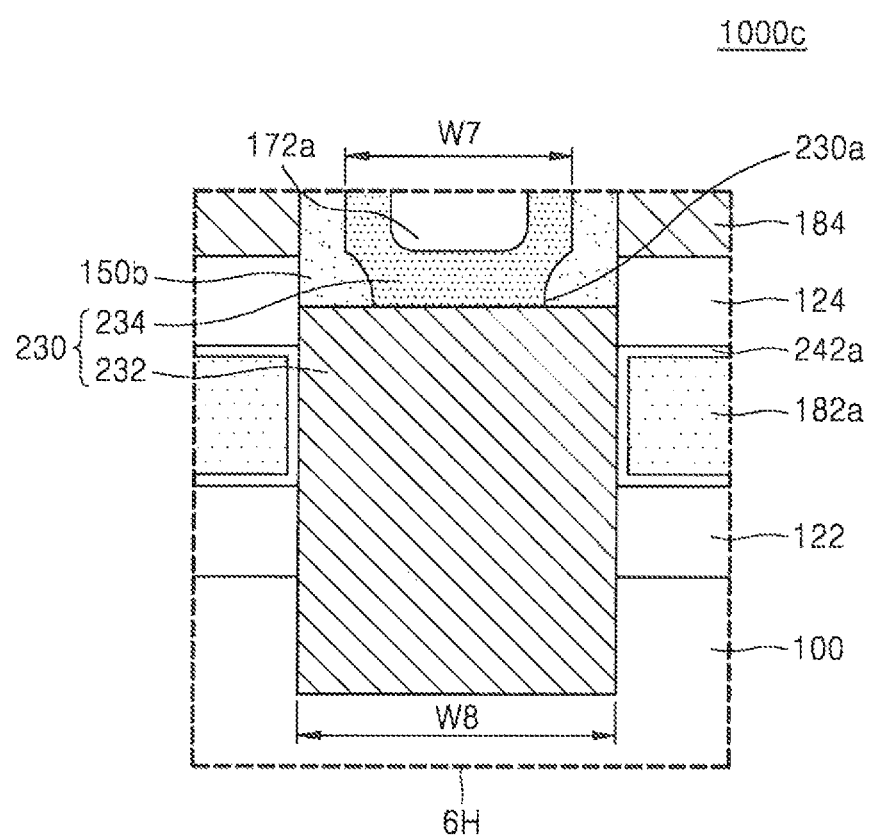

Referring to FIG. 6G and FIG. 6H, a portion of the preliminary second gate insulating layer 242 on the fourth insulating layer 176 (see FIG. 6F) may be removed by performing a planarization process, and a portion corresponding to the second opening 177 (see FIG. 6F) may be exposed again by performing an anisotropy etching process using the exposed fourth insulating layer 176 as an etching mask. The side walls of the plurality of second sacrificial layers 134 and the third sacrificial layer 136 that are covered by the preliminary second gate insulating layer 242 may be exposed again using the anisotropy etching process. In addition, the top surface of the substrate 100 that is covered by the preliminary second gate insulating layer 242 may also be exposed again using the anisotropy etching process.

Only the portions of the preliminary second gate insulating layer 242 that are formed on a top surface of the first insulating layer 122, a bottom surface of the lowermost second insulating layer 124, and the side wall of the channel contact layer 232 may remain within the third opening 179, and thus a second gate insulating layer 242*a* may be formed. In addition, only the portion of the second conductive layer 180 that is formed on the second gate insulating layer 242*a* may remain within the third opening 179, and thus a first gate electrode 182*a* may be formed.

Thereafter, processes similar to the processes described with reference to FIG. 3K to FIG. 3M may be performed to complete the formation of a semiconductor device 1000*c*.

The semiconductor device 1000*c* manufactured using the described method is briefly described with reference to FIG. 6G and FIG. 6H. FIG. 6H is an enlarged cross-sectional view of a portion 6H of FIG. 6G.

The semiconductor device 1000*c* includes a channel structure 230 extending in the third direction on the substrate 100. The channel structure 230 may include the channel contact layer 232 coming into contact with the upper portion of the substrate 100, and the channel layer 234 which comes into contact with an upper portion of the channel contact layer 232 and extends in the third direction m a cylindrical shape.

The channel structure 230 may include a stepped portion 230*a* having a step height in the first direction or the second direction in a side wall portion of the channel structure 230. The upper portion of the channel contact layer 232 may form the stepped portion 230*a* of the channel structure 230. The stepped portion 230*a* may be formed in the side wall portion of the channel structure 230 between a lowermost second gate electrode 184 and a gate electrode 182. The channel structure 230 may have a first width W7 in the second direction in a side wall portion of the channel structure 230 that is located at a higher level than the stepped portion 230*a*, and may have a second width W8, larger than the first width, in the second direction in a side wall portion of the channel structure 230 that is located at a lower level than the stepped portion 230*a*.

The top surface of the channel contact layer 232 may be formed at a higher level than a top surface of the first gate electrode 182*a*. The second gate insulating layer 242*a* may be interposed between the channel contact layer 232 and the first gate electrode 182*a*. The first gate insulating layer 150*b* may be interposed between a side wall of the channel layer 234 and the second and third gate electrodes 184 and 186.

The semiconductor device 1000*c* may include the channel structure 230 which may be a laminated structure of the channel contact layer 232 and the channel layer 234, and thus the semiconductor device 1000*c* may have an excellent electrical characteristic.

Figure 7A:
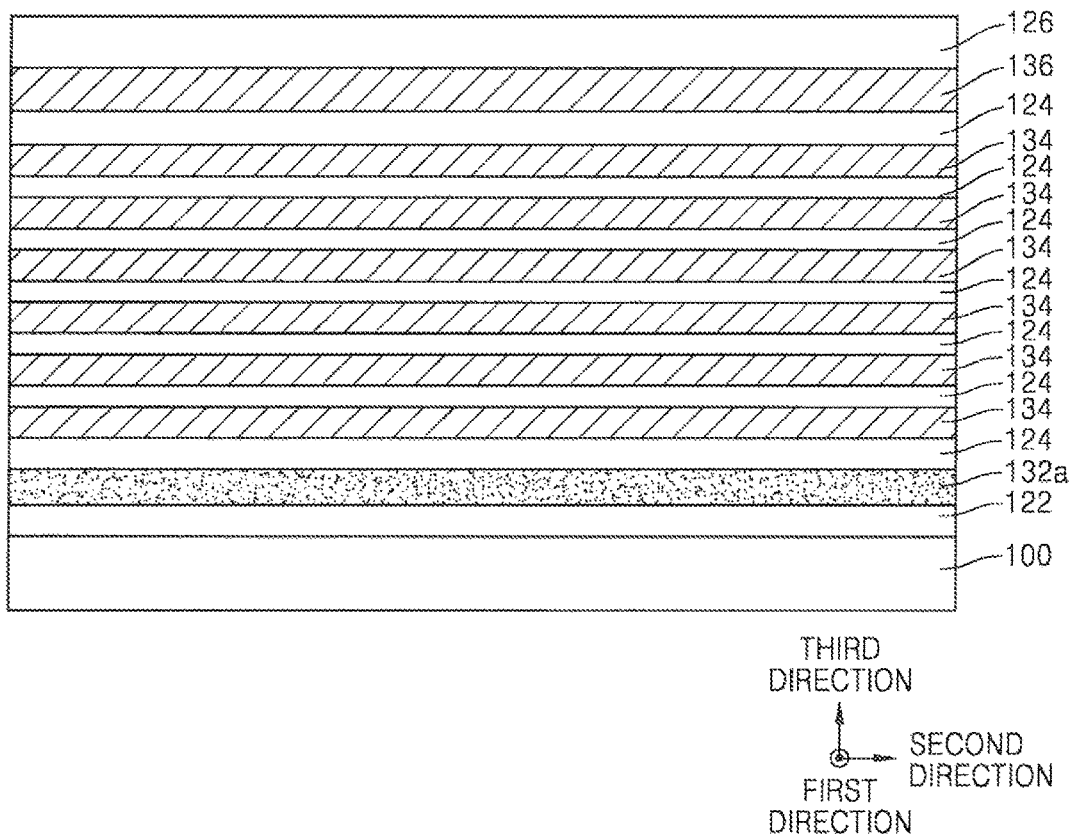
FIGS. 7A-7C are cross-sectional views schematically illustrating a method of manufacturing a semiconductor device according to some embodiments of the inventive concept.
Figure 7B:
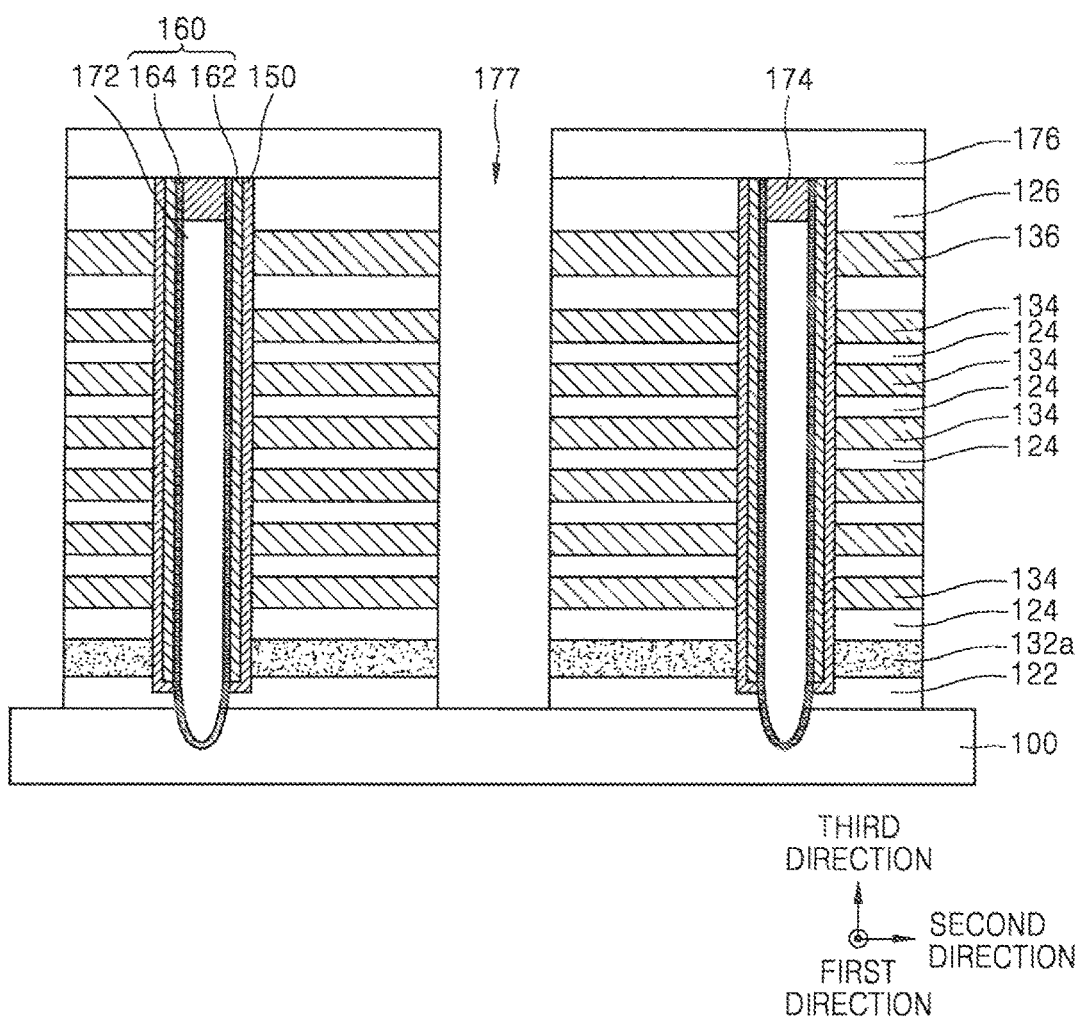
Figure 7C:
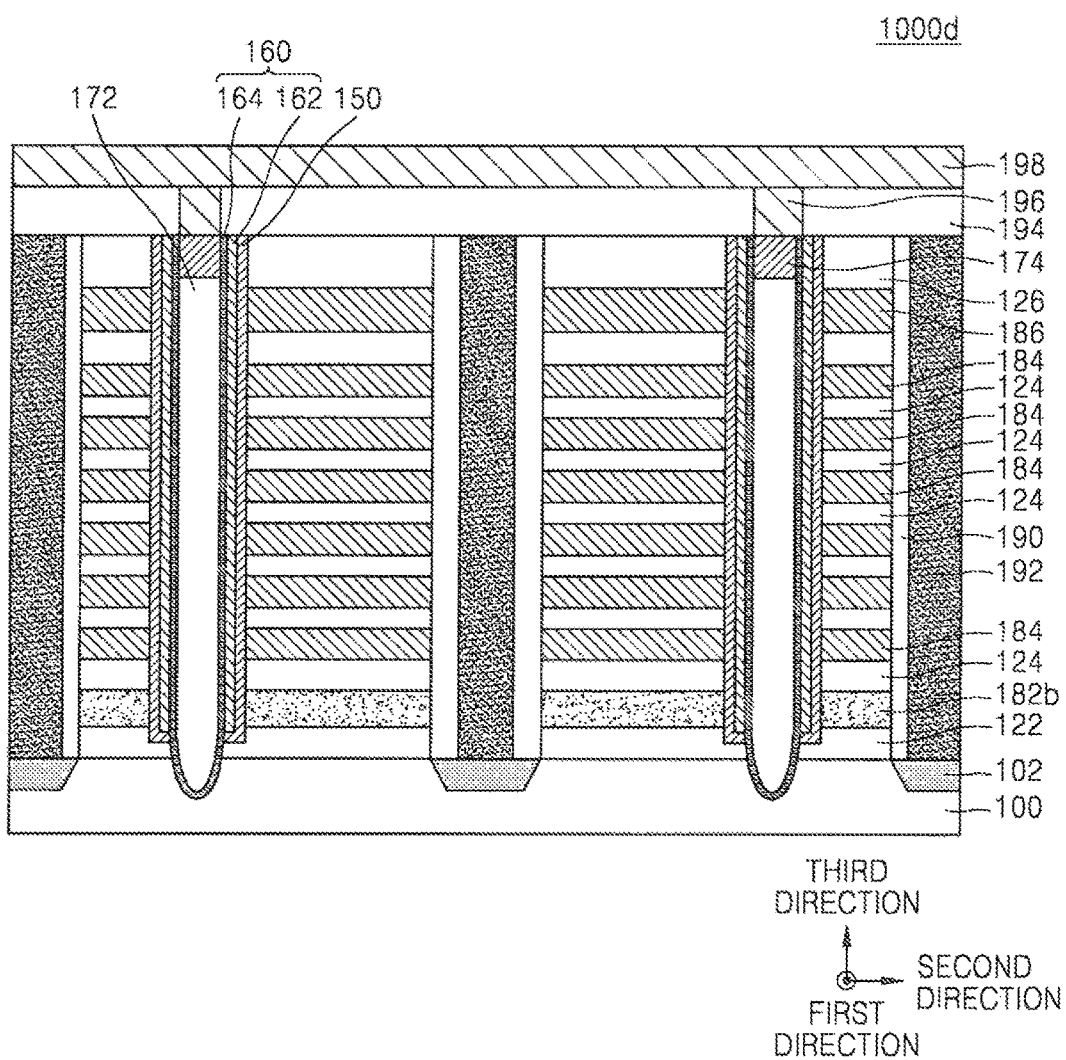

FIG. 7A to FIG. 7C are cross-sectional views illustrating a method of manufacturing a semiconductor device 1000*d* according to some embodiments of the inventive concept. The manufacturing method may be similar to the manufacturing method described with reference to FIG. 3A to FIG. 3M except for a first sacrificial layer 132*a*, for example, and thus a description will be made with an emphasis on the differences therebetween.

Referring to FIG. 7A, a first insulating layer 122 may be formed on a substrate 100, and a first sacrificial layer 132*a* may be formed on the first insulating layer 122. The first sacrificial layer 132*a* may be formed to include a metal or a metal silicide material. For example, the first sacrificial layer 132*a* may be formed using a conductive material such as titanium, tantalum, tungsten, titanium nitride, tantalum nitride, tungsten nitride, titanium silicide, tantalum silicide, tungsten silicide, cobalt silicide, or nickel silicide.

A plurality of second insulating layers 124 and a plurality of second sacrificial layers 134 may be alternately formed on the first sacrificial layer 132*a*. The second sacrificial layers 134 may be formed using a material having etch selectivity with respect to the first sacrificial layer 132*a*. For example, the second sacrificial layers 134 may be formed using polysilicon doped with impurities or the like.

Thereafter, processes similar to the processes described with reference to FIG. 3A to FIG. 3G may be performed.

Referring to FIG. 7B, a third opening 177 exposing a top surface of the substrate 100 may be formed by performing an anisotropy etching process using a fourth insulating layer 176 as an etching mask. In addition, side surfaces of the first, second, third, and fourth insulating layers 122, 124, 126, and 176 and the first, second, and third sacrificial layers 132*a*, 134, and 136 may be exposed by the formation of the third opening 177. The first sacrificial layer 132*a* may not be removed unlike the manufacturing method described with reference to FIG. 3H. Because the first sacrificial layer 132*a* may include a conductive material, the first sacrificial layer 132a may be used as a first gate electrode 182b (see FIG. 7C) without additionally performing a removing process.

Referring to FIG. 7C, processes similar to the processes described with reference to FIG. 3K to FIG. 3M may be performed to complete the formation of a semiconductor device 1000d.

According to some methods of manufacturing the semiconductor device 1000d, the first sacrificial layer 132a may be formed to include a metal or a metal silicide material, and thus the first sacrificial layer 132a may be used as the first gate electrode 182a without additionally performing a process of removing the first sacrificial layer 132a and a process of forming the first gate electrode 182a. Accordingly, a process of manufacturing the semiconductor device 1000d may be facilitated.

FIG. 8A to FIG. 8F are cross-sectional views schematically illustrating gate insulating layer structures of semiconductor devices according to other embodiments of the inventive concept. FIG. 8A to FIG. 8F are enlarged cross-sectional views of a portion 8A of FIG. 2A.

Figure 8A:
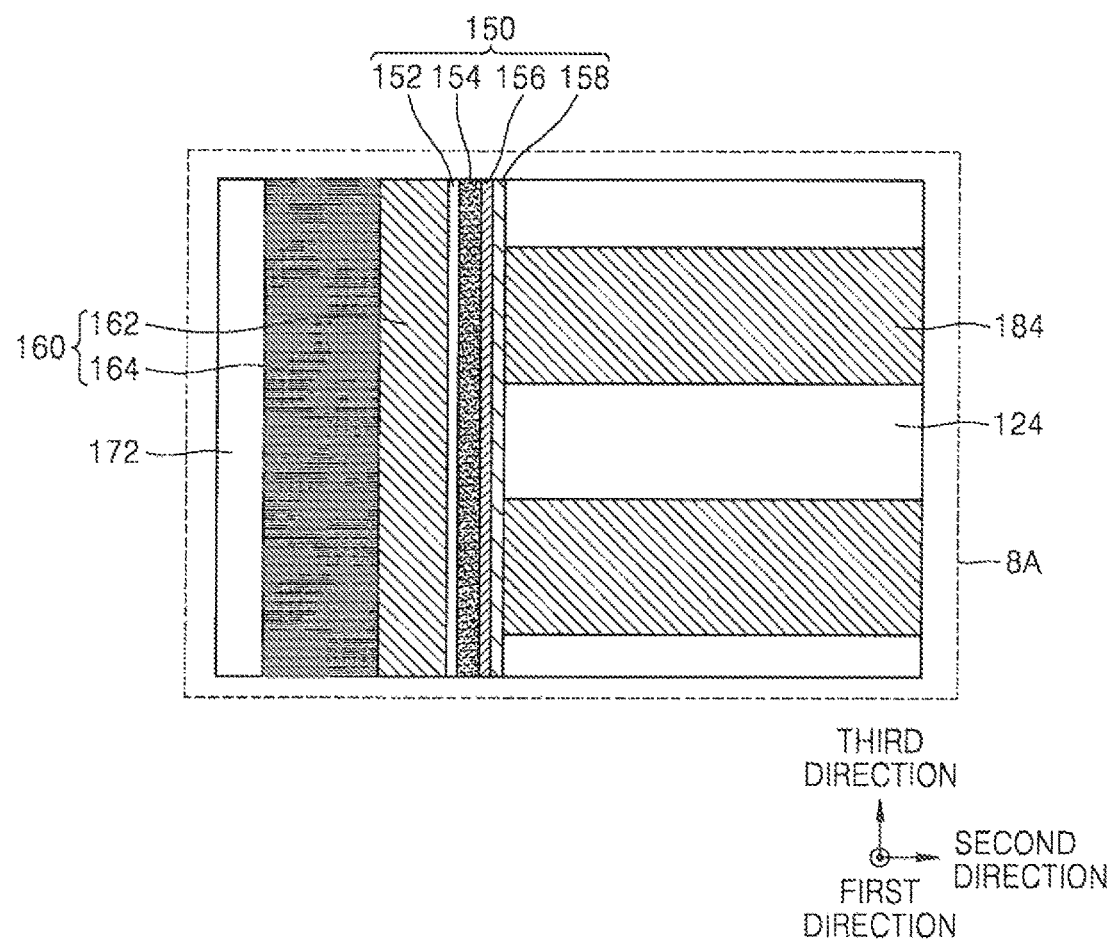
FIGS. 8A-8F are cross sectional views schematically illustrating gate insulating layer structures of semiconductor devices according to some embodiments of the inventive concept.

Referring to FIG. 8A, the channel structure 160 may be formed to have a cylindrical shape extending in the third direction. The channel structure 160 may be formed to have a laminated structure of the channel layer 162 extending in the third direction and the channel contact layer 164 formed on the inner wall of the channel layer 162.

The plurality of second insulating layers 124 and the plurality of second gate electrodes 184 may alternately have a laminated structure along the third direction on a substrate.

The gate insulating layer 150 may be interposed between the channel structure 160 and a laminated structure of the plurality of second insulating layers 124 and the plurality of second gate electrodes 184. The gate insulating layer 150 may be formed to surround portions of the outer wall of the channel layer 162.

The gate insulating layer 150 may have a laminated structure in which a tunnel insulating layer 152, a charge storage layer 154, a first blocking insulating layer 156, and a second blocking insulating layer 158 are sequentially laminated from the outer wall of the channel structure 160. The second blocking insulating layer 158 formed on an outermost side of the gate insulating layer 150 may come into contact with side walls of the plurality of second gate electrodes 184.

The tunnel insulating layer 152 may include silicon oxide. The charge storage layer 154 may be a charge trapping layer or a floating gate layer. The charge storage layer 154 may include a quantum dot or nanocrystal. The first and second blocking insulating layers 156 and 158 may include a high-k dielectric material. In addition, the second blocking insulating layer 158 may include a material having a higher dielectric constant than a dielectric constant of the first blocking insulating layer 156.

Figure 8B:
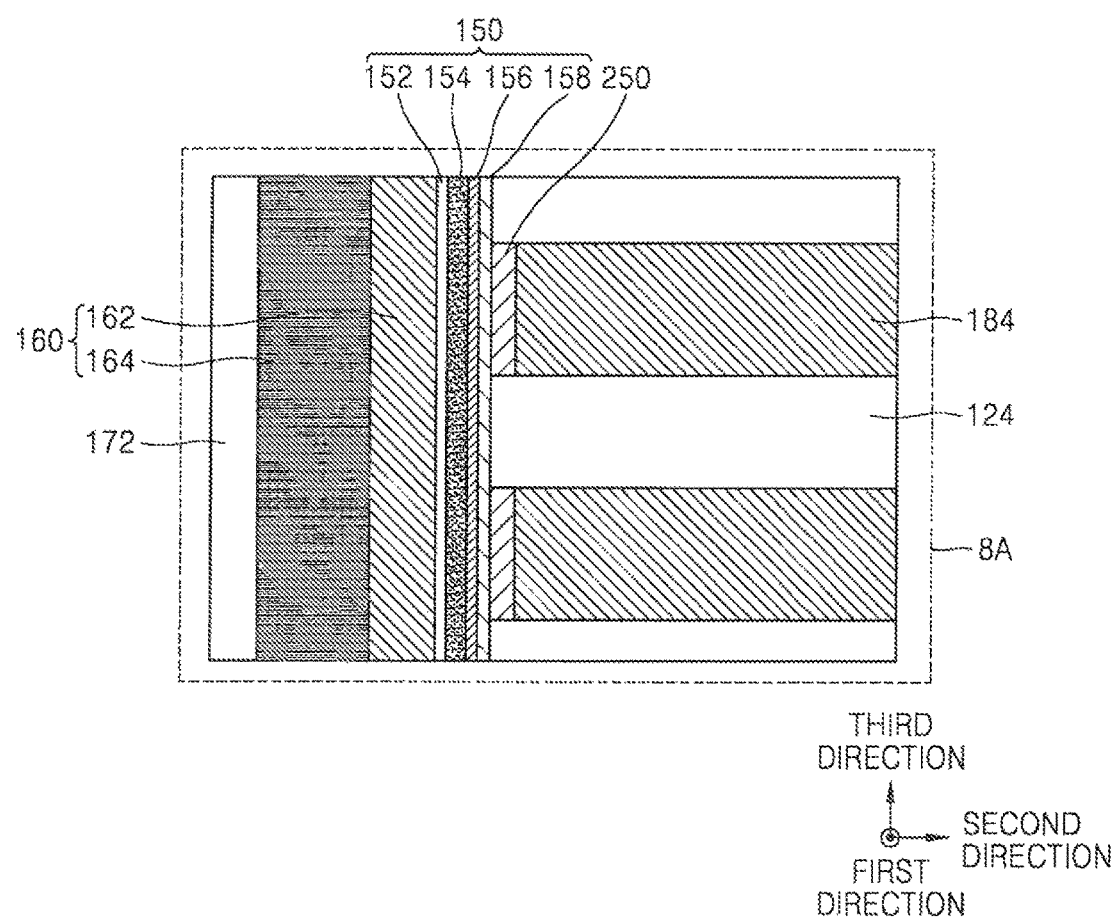

Referring to FIG. 8B, a barrier material layer 250 may further be interposed between a gate insulating layer 150 and the plurality of second gate electrodes 184.

Specifically, the barrier material layer 250 may be formed between the second blocking insulating layer 158 of the gate insulating layer 150 and the second gate electrodes 184. That is, the second blocking insulating layer 158 and the second gate electrodes 184 may be formed not to come into contact with each other. The barrier material layer 250 may include titanium nitride, tungsten nitride, tantalum nitride, or the like. The barrier material layer 250 may not be formed between the second blocking insulating layer 158 and the second insulating layers 124.

Figure 8C:
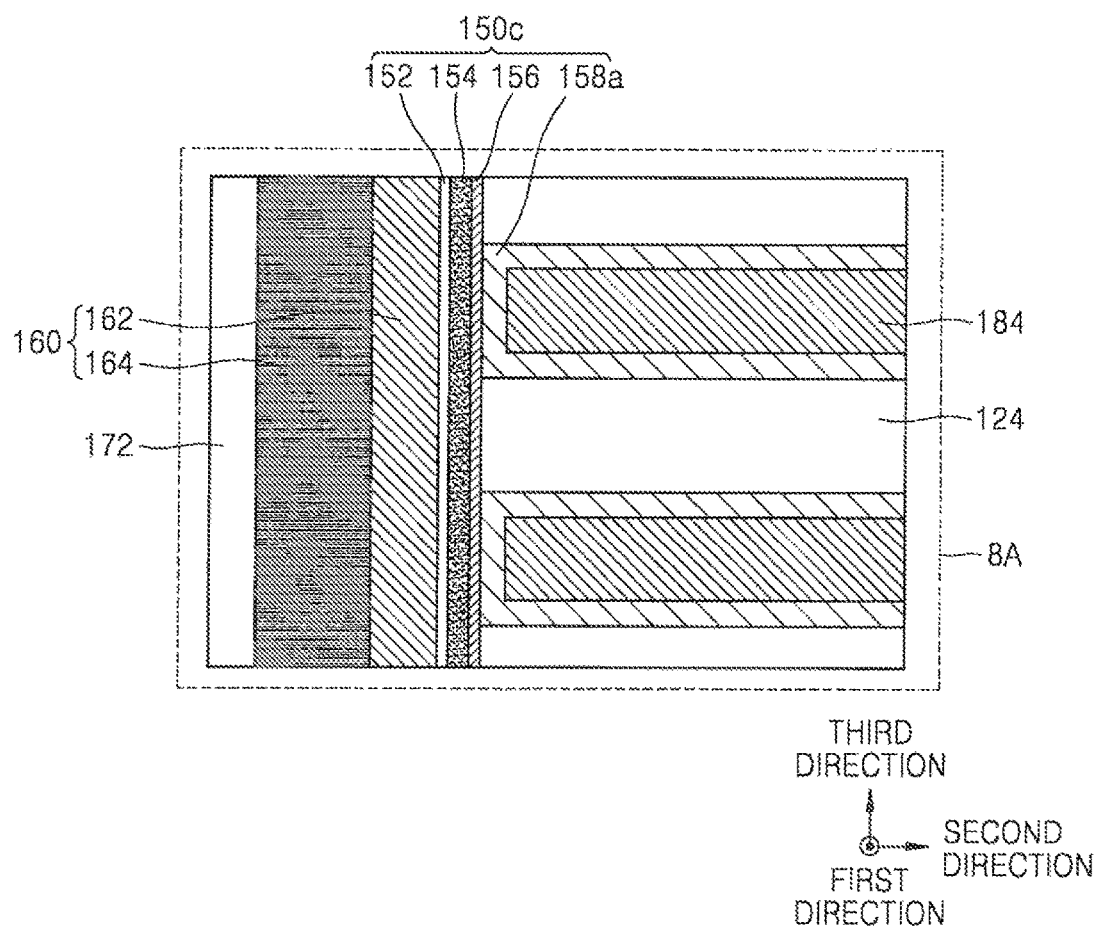

Referring to FIG. 8C, a second blocking insulating layer 158a of a gate insulating layer 150c may be formed to surround the second gate electrodes 184. That is, the second blocking insulating layer 158a may be formed to have a structure surrounding the second gate electrodes 184 so that a boundary between the second gate electrodes 184 and the first blocking insulating layer 156 and a boundary between the second gate electrodes 184 and the second insulating layers 124 are formed.

Figure 8D:
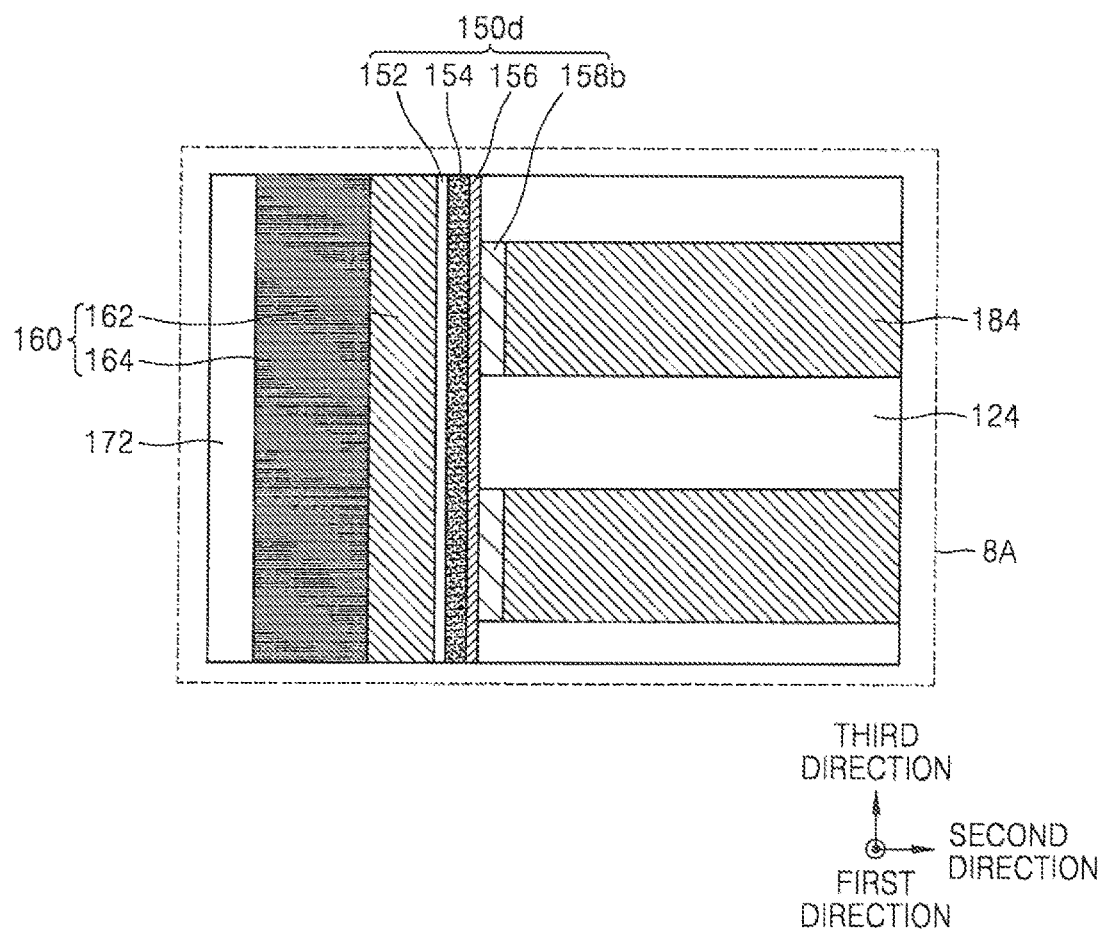

Referring to FIG. 8D, a second blocking insulating layer 158b of a gate insulating layer 150d may be formed between the first blocking insulating layer 156 and the second gate electrodes 184. The second blocking insulating layer 158b may not be formed between the first blocking insulating layer 156 and the second insulating layers 124. That is, the second blocking insulating layer 158b may have a structure that is cut off to have the same heights as the second gate electrodes 184.

Figure 8E:
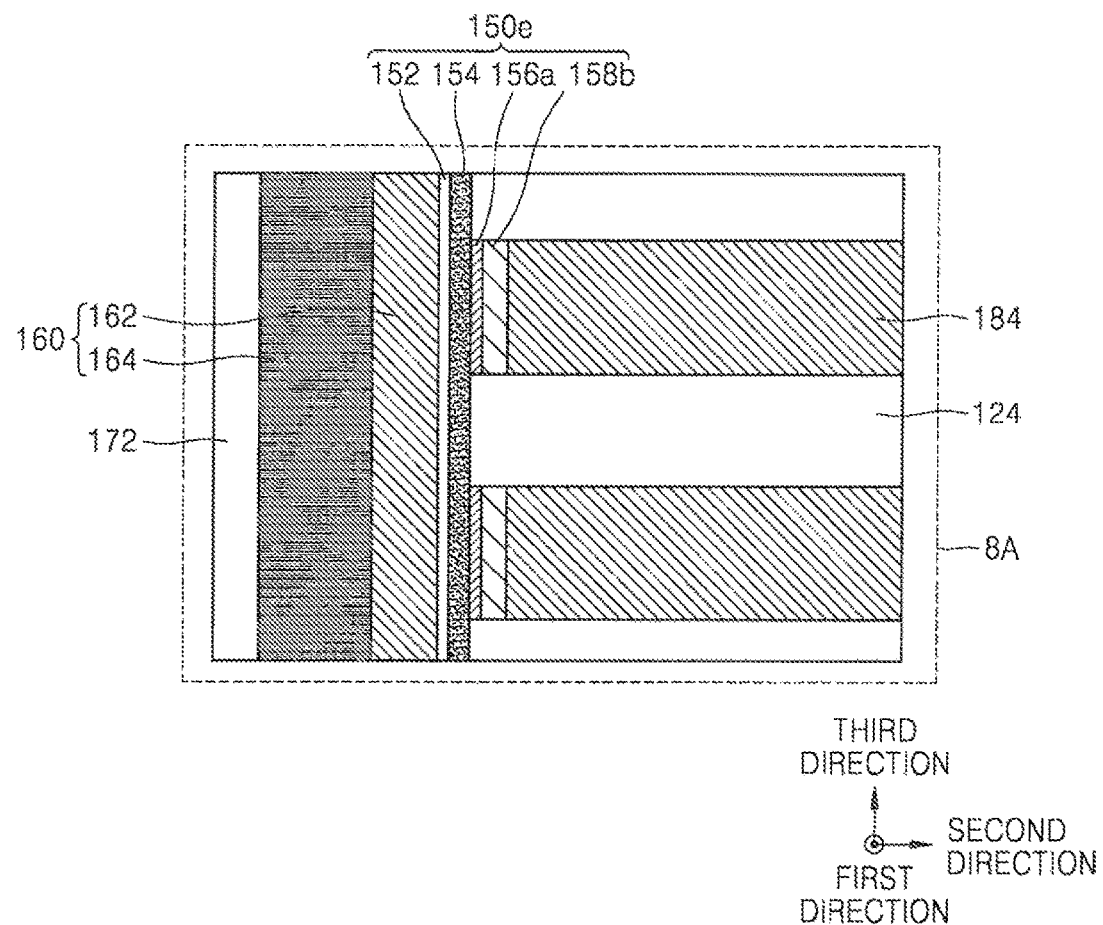

Referring to FIG. 8E, a second blocking insulating layer 158b of the gate insulating layer 150e may be formed between a first blocking insulating layer 156a and the second gate electrodes 184, and the first blocking insulating layer 156a may be formed between the second blocking insulating layer 158b and the charge storage layer 154. The first and second blocking insulating layers 156a and 158b may not be formed between the charge storage layer 154 and the second insulating layers 124. That is, the first and second blocking insulating layers 156a and 158b may have structures that are cut off to have the same heights as the second gate electrodes 184.

Figure 8F:
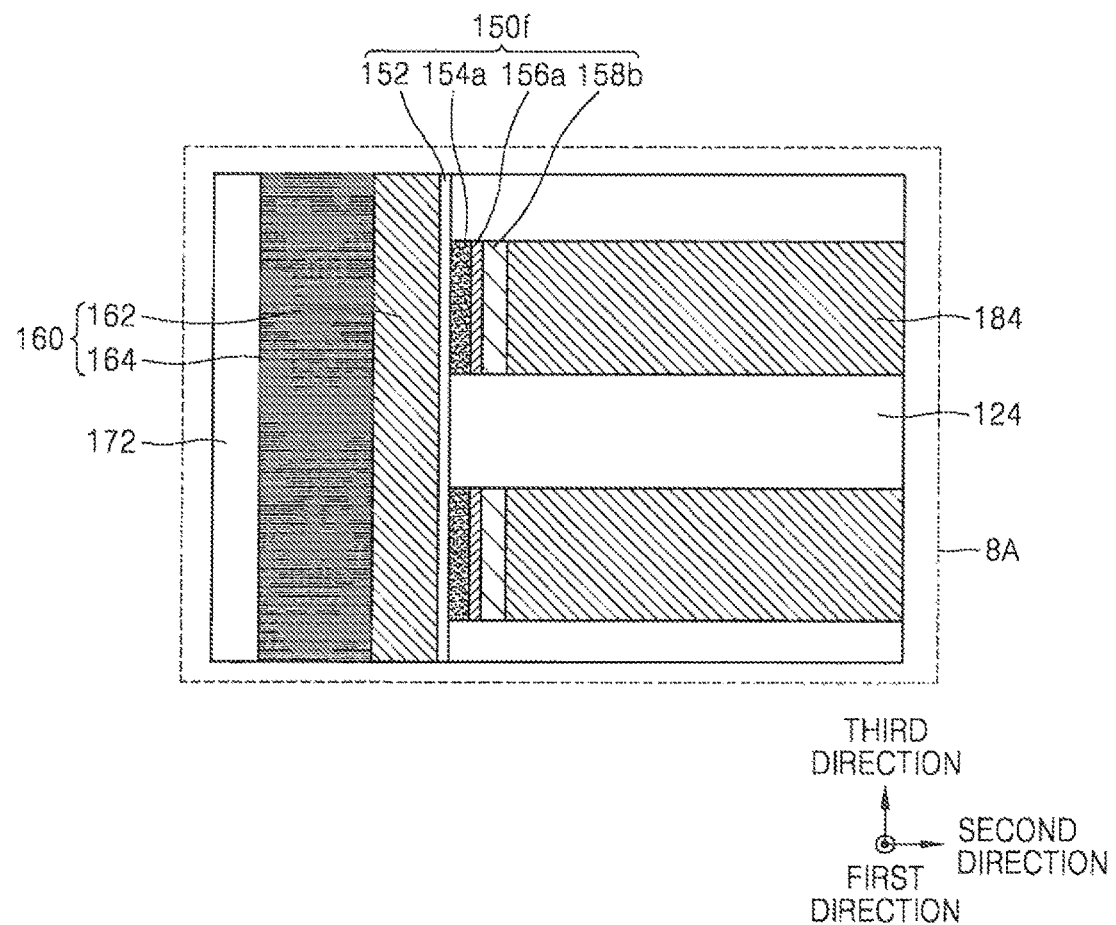

Referring to FIG. 8F, a charge storage layer 154a of a gate insulating layer 150f may be formed between the tunnel insulating layer 152 and the first blocking insulating layer 156a. The charge storage layer 154a may not be formed between the tunnel insulating layer 152 and the second insulating layers 124. That is, the charge storage layer 154a may have a structure that is cut off to have the same height as the second gate electrodes 184.

Methods of manufacturing the gate insulating layers 150, 150c, 150d, 150e, and 150f are described with reference to FIG. 8A to FIG. 8F.

Referring back to FIG. 8A, the first opening 141 (see FIG. 3B) passing through a laminated structure of the plurality of second sacrificial layers 134 (see FIG. 3B) and the second insulating layers 124 that are formed on the substrate 100 (see FIG. 3B) may be formed. The second blocking insulating layer 158, the first blocking insulating layer 156, the charge storage layer 154, and the tunnel insulating layer 152 may be sequentially formed on a side wall of the first opening 141. The second blocking insulating layer 158, the first blocking insulating layer 156, the charge storage layer 154, and the tunnel insulating layer 152 may be conformally formed on the side wall of the first opening 141 using an ALD process, a CVD process, or the like. Thereafter, the channel layer 162 and the channel contact layer 164 may be sequentially laminated on the tunnel insulating layer 152 within the first opening 141, and the buried insulating layer 172 filling the first opening 141 may be formed within the channel contact layer 164. Thereafter, a silicidation process may be performed on the plurality of second sacrificial layers 134 to change the plurality of second sacrificial layers 134 to the plurality of second gate electrodes 184, thereby completing the formation of a semiconductor device including the gate insulating layer 150 illustrated in FIG. 8A.

The gate insulating layer 150c illustrated in FIG. 8C may be formed using a method of replacing the plurality of second sacrificial layers 134 by the plurality of second gate electrodes 184 without performing a silicidation process on the plurality of second sacrificial layers 134. The first blocking insulating layer 156, the charge storage layer 154, and the tunnel insulating layer 152 may be sequentially formed on the side wall of the first opening 141 (see FIG. 3B), and then the channel structure 160 and the buried insulating layer 172 may be formed. Thereafter, the plurality of second sacrificial layers 134 may be removed to expose a side wall of the first blocking insulating layer 156 in a space between the plurality of second insulating layers 124. The second blocking insulating layer 158*a* may be conformally formed on the plurality of second insulating layers 124 and the first blocking insulating layer 156 that are exposed in the space, and a conductive material may be buried on the second blocking insulating layer 158*a* within the space, thereby forming the second gate electrode 184. Thus, the formation of a semiconductor device including the gate insulating layer 150*c* illustrated in FIG. 8C may be completed.

Referring again to FIG. 8B, a laminated structure of the plurality of second sacrificial layers 134 (see FIG. 3B) and a plurality of spacers may be formed, and then an opening passing through the laminated structure may be formed. Thereafter, a preliminary barrier material layer, the second blocking insulating layer 158, the first blocking insulating layer 156, the charge storage layer 154, and the tunnel insulating layer 152 may be sequentially formed on a side wall of the opening. Thereafter, the plurality of spacers may be removed to expose a side wall of the preliminary barrier material layer in a space of the plurality of second sacrificial layers 134. Thereafter, the preliminary barrier material layer exposed in the space between the plurality of second sacrificial layers 134 may be selectively removed until a side wall of the second blocking insulating layer 158 is exposed, and thus the plurality of barrier material layers 250 that are cut off to have the same heights as the plurality of second sacrificial layers 134 may be formed on side walls of the plurality of second sacrificial layers 134. Thereafter, the plurality of second insulating layers 124 may be formed in the space of the plurality of second sacrificial layers 134, and then the plurality of second sacrificial layers 134 may be changed to the plurality of second gate electrodes 184 by performing a silicidation process, and thus the formation of a semiconductor device including the gate insulating layer 150 illustrated in FIG. 8B may be completed.

The gate insulating layers 150*d*, 150*e*, and 150*f* illustrated in FIG. 8D to FIG. 8F may be formed using methods similar to the manufacturing method described with reference to FIG. 8B.

First, the second blocking insulating layer 158 (see FIG. 8B), the first blocking insulating layer 156, the charge storage layer 154, and the tunnel insulating layer 152 may be sequentially formed on a side wall of the opening passing through the laminated structure of the plurality of second sacrificial layers 134 and the plurality of spacers. Thereafter, when the plurality of spacers may be removed to expose the side wall of the second blocking insulating layer 158 in the space between the plurality of second sacrificial layers 134 and the portion of the second blocking insulating layer 158 that is exposed may be selectively removed, the plurality of second blocking insulating layers 158*b* that are cut off to have the same heights as the plurality of second sacrificial layers 134 may be formed on the side walls of the plurality of second sacrificial layers 134. Thereafter, the plurality of second insulating layers 124 and the plurality of second gate electrodes 184 may be formed, and thus the gate insulating layer 150*d* illustrated in FIG. 8D may be formed.

When portions of the second blocking insulating layer 158 (see FIG. 8B) and the first blocking insulating layer 156 (see FIG. 8B) that are exposed in the space between the plurality of second sacrificial layers 134 are selectively removed, the plurality of second blocking insulating layers 158*b* cut off to have the same heights as the plurality of second sacrificial layers 134 and the plurality of first blocking insulating layers 156*a* may be formed on the side walls of the plurality of second sacrificial layers 134. Thus, the gate insulating layer 150*e* illustrated in FIG. 8E may be formed.

When portions of the second blocking insulating layer 158 (see FIG. 8B), the first blocking insulating layer 156 (see FIG. 8B), and the charge storage layer 154 (see FIG. 8B) are selectively removed, the plurality of second blocking insulating layers 158*b* cut off to have the same heights as the plurality of second sacrificial layers 134, the plurality of first blocking insulating layers 156*a*, and the plurality of charge storage layers 154*a* may be formed on the side walls of the plurality of second sacrificial layers 134. Thus, the gate insulating layer 150*f* illustrated in FIG. 8F may be formed.

Figure 9:
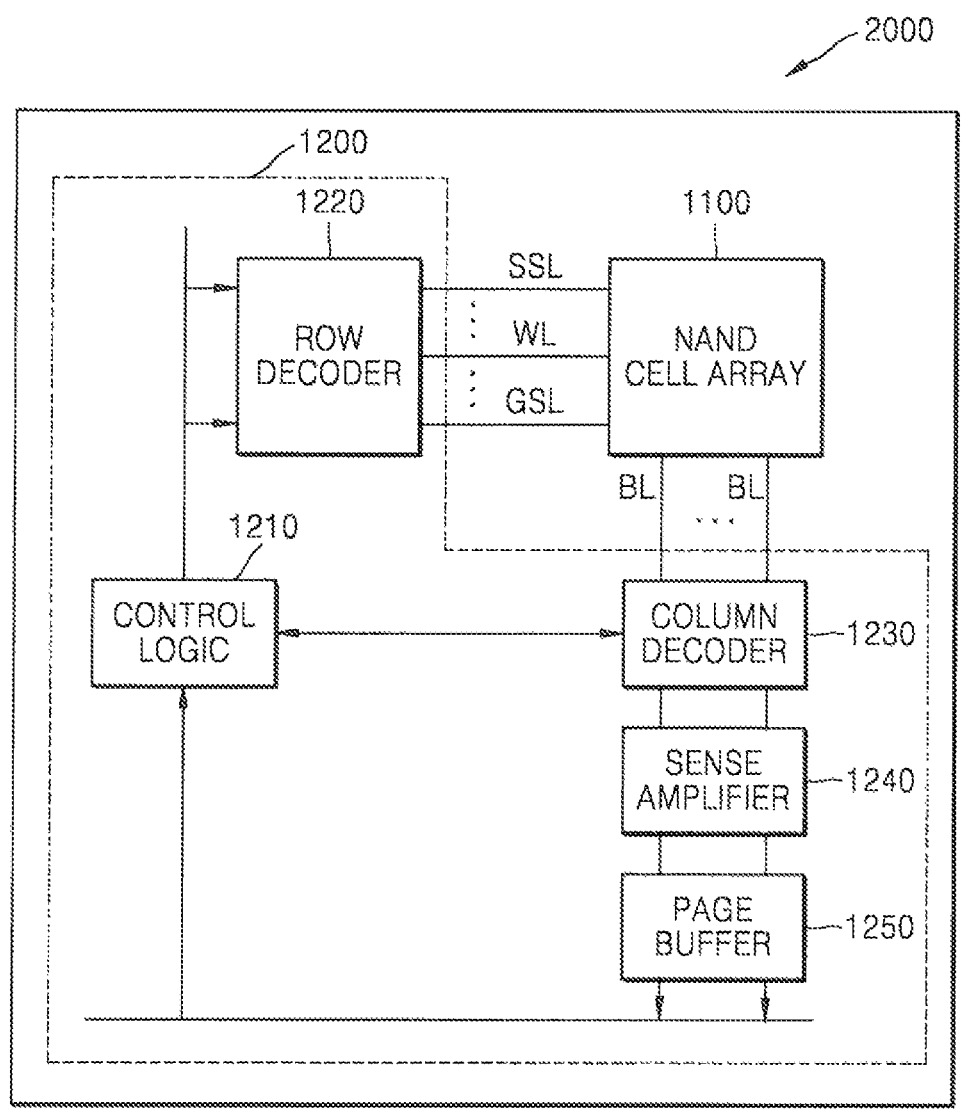
FIG. 9 is a schematic block diagram illustrating a non-volatile memory device according to some embodiments of the inventive concept.

FIG. 9 is a schematic block structural diagram illustrating a nonvolatile memory device 2000 according to some embodiments of the inventive concept. Referring to FIG. 9, in the nonvolatile memory device 2000, a NAND cell array 1100 may be coupled to a core circuit unit 1200. For example, the NAND cell array 1100 may include one or more of the semiconductor devices 1000, 1000*a*, 1000*b*, 1000*c*, and 1000*d*, having a vertical structure that is described with reference to FIGS. 2A-7C. The core circuit unit 1200 may include a control logic 1210, a row decoder 1220, a column decoder 1230, a sense amplifier 1240, and a page buffer 1250.

The control logic 1210 may communicate with the row decoder 1220, the column decoder 1230, and the page buffer 1250. The row decoder 1220 may communicate with the NAND cell array 1100 through a plurality of string selection lines SSL, a plurality of word lines WL, and a plurality of ground selection lines GSL. The column decoder 1230 may communicate with the NAND cell array 1100 through a plurality of bit lines BL. The sense amplifier 1240 may be connected to the column decoder 1230 when a signal is output from the NAND cell array 1100, and may not be connected to the column decoder 1230 when a signal is transmitted to the NAND cell array 1100.

For example, the control logic 1210 may transmit a row address signal to the row decoder 1220, and the row decoder 1220 may decode the row address signal and transmit the row address signal to the NAND cell array 1100 through the string selection lines SSL, the word lines WL, and the ground selection lines GSL. The control logic 1210 may transmit a column address signal to the column decoder 1230 or the page buffer 1250, and the column decoder 1230 may decode the column address signal and transmit the column address signal to the NAND cell array 1100 through the plurality of bit lines BL. The signal of the NAND cell array 1100 may be transmitted to the sense amplifier 1240 through the column decoder 1230, and may be amplified in the sense amplifier 1240 and may be transmitted to the control logic 1210 via the page buffer 1250.

While the inventive concept has been described with reference to some embodiments, it will be apparent to those skilled in the art that various changes and modifications may be made without departing from the spirit and scope of the inventive concept. Therefore, it should be understood that the above embodiments are not limiting, but illustrative.

Thus, the scope of the inventive concept is to be determined by the broadest permissible interpretation of the following claims and their equivalents, and shall not be restricted or limited by the foregoing description.

What is claimed is:

1. A method of manufacturing a semiconductor device, comprising: alternately forming a plurality of sacrificial layers and a plurality of insulating layers on a substrate, the plurality of sacrificial layers including a first sacrificial layer and a plurality of second sacrificial layers on the first sacrificial layer, the plurality of second sacrificial layers including a material different from that of the first sacrificial layer; forming a channel hole through the plurality of sacrificial layers and the plurality of insulating layers to expose a top surface of the substrate; forming a sidewall protection layer on an inner wall of the channel hole; forming a channel contact layer filling a bottom of the channel hole, wherein a top surface of the channel contact layer is positioned at a level lower than a bottom surface of a lowermost second sacrificial layer among the plurality of second sacrificial layers; completely removing the sidewall protection layer; forming a channel layer in contact with the channel contact layer on the inner wall of the channel hole; removing the first sacrificial layer; and forming a first gate electrode at a position where the first sacrificial layer is removed.

2. The method according to claim 1, further comprising, converting the plurality of second sacrificial layers into a plurality of second, gate electrodes by a silicidation process.

3. The method according to claim 2, wherein the plurality of second sacrificial layers includes polysilicon and the plurality of second gate electrodes includes a metal silicide.

4. The method according to claim 1, wherein forming the side wall protection layer comprises:
   forming a bottom protection layer filling the bottom of the channel hole;
   forming the sidewall protecting layer on the inner wall of the channel hole using a material different from the bottom protection layer so as to contact a top surface of the bottom protection layer; and
   removing the bottom protection layer such that the sidewall protection layer remains in the channel hole.

5. The method of claim 4, wherein the top surface of the bottom protection layer is positioned at a lower level than the bottom surface of the lowermost second sacrificial layer among the plurality of second sacrificial layers.

6. The method according to claim 1, wherein in forming the channel contact layer, the plurality of second sacrificial layers are covered by the sidewall protection layer and are not exposed in the inner wall of the channel hole.

7. The method according to claim 1, wherein the level at which the top surface of the channel contact layer is positioned is lower than a bottom surface of the first sacrificial layer.

8. The method of claim 7, further comprising:
   after removing the sidewall protection layer, and before forming the channel layer, forming a first gate insulating layer on the inner wall of the charnel hole, the first gate insulating layer covering both the first sacrificial layer and the plurality of second sacrificial layers exposed in the inner wall of the channel hole.

9. The method according to claim 1, wherein the level at which the top surface of the channel contact layer is positioned is higher than a top surface of the first sacrificial layer.

10. The method of claim 9, further comprising:
    after removing the sidewall protection layer, and before forming the channel layer, forming a first gate insulating layer on the inner wall of the channel hole, the first gate insulating layer covering the plurality of second sacrificial layers exposed in the inner wall of the channel hole.

11. The method of claim 9, wherein removing the first sacrificial layer and forming the first gate electrode comprises:
    removing the first sacrificial layer to form an opening in the space from which the first sacrificial layer is removed and to expose a sidewall of the channel contact layer by the opening;
    forming a second gate insulating layer on the sidewall of the channel contact layer exposed by the opening; and
    forming the first gate electrode on the second gate insulating layer to fill the opening.

12. A method of manufacturing a semiconductor device, comprising: alternately forming a plurality of sacrificial layers and a plurality of insulating layers on a substrate, the plurality of sacrificial layers including a first sacrificial layer and a plurality of second sacrificial layers on the first sacrificial layer, the plurality of second sacrificial layers including a material different from that of the first sacrificial layer; forming a channel hole through the plurality of sacrificial layers and the plurality of insulating layers to expose a top surface of the substrate; forming a channel contact layer filling a bottom of the channel hole, wherein a top surface of the channel contact layer is positioned at a level lower than a bottom surface of a lowermost second sacrificial layer among the plurality of second sacrificial layers; forming a channel layer in contact with the channel contact layer on an inner wall of the channel hole; removing the first sacrificial layer and forming a first gate electrode at a position where the first sacrificial layer is removed; and converting the plurality of second sacrificial layers into a plurality of second gate electrodes by a silicidation process.

13. The method of claim 12, wherein forming the channel contact layer comprises: forming a bottom protection layer filling the bottom of the channel hole; forming a sidewall protection layer on the inner wall of the channel hole using a material different from the bottom protection layer so as to contact a top surface of the bottom protection layer; and removing the bottom protection layer such that the sidewall protection layer remains in the channel hole; forming the channel contact layer filling the bottom of the channel hole; and removing the sidewall protection layer.

14. The method of claim 13, wherein the top surface of the bottom protection layer is positioned at a lower level than the bottom surface of the lowermost second sacrificial layer among the plurality of second sacrificial layers.

15. The method of claim 13, wherein in harming the channel contact layer, the plurality of second sacrificial layers are covered by the sidewall protection layer and are not exposed in the inner wall of the charnel hole.

16. The method according to claim 13, wherein the level at which the top surface of the channel contact layer is positioned is lower than a bottom surface of the first sacrificial layer.

17. The method of claim 13, further comprising:
    prior to forming the channel layer, forming a first gate insulating layer on the inner wall of the, channel hole, the first gate insulating layer covering both the first sacrificial layer and the plurality of second sacrificial layers exposed in the inner wall of file channel hole.

18. The method according to claim 13, wherein the level at which the top surface of the channel contact layer is positioned is higher than a top surface of the first sacrificial layer.

19. The method of claim 18, further comprising:
after removing the sidewall protection layer, and before forming the channel layer, forming a first gate insulating layer on the inner wall of the channel hole, the first gate insulating layer covering the plurality of second sacrificial layers exposed in the inner wall of the channel hole.

20. The method of claim 19, wherein removing the first sacrificial layer and forming the first gate electrode comprises:
removing the first sacrificial layer to form an opening in the space from which the first sacrificial layer is removed and to expose a sidewall of the channel contact layer by the opening;
forming a second gate insulating layer on the sidewall of the channel contact layer exposed by the opening; and
forming the first gate electrode on the second gate insulating layer to fill the opening.

* * * * *